United States Patent
Huang et al.

(10) Patent No.: US 12,003,838 B2
(45) Date of Patent: Jun. 4, 2024

(54) CAMERA MODULE AND MOLDED PHOTOSENSITIVE ASSEMBLY AND ELECTRONIC DEVICE

(71) Applicant: Ningbo Sunny Opotech Co., Ltd., Zhejiang (CN)

(72) Inventors: Zhen Huang, Zhejiang (CN); Qimin Mei, Zhejiang (CN); Bojie Zhao, Zhejiang (CN); Zhewen Mei, Zhejiang (CN); Li Liu, Zhejiang (CN); Jiawei Chen, Zhejiang (CN); Chenxiang Xu, Zhejiang (CN)

(73) Assignee: Ningbo Sunny Opotech Co., Ltd., Zhejiang (CN)

( * ) Notice: Subject to any disclaimer, the term of this patent is extended or adjusted under 35 U.S.C. 154(b) by 0 days.

(21) Appl. No.: 18/203,731

(22) Filed: May 31, 2023

(65) Prior Publication Data

US 2023/0328350 A1 Oct. 12, 2023

Related U.S. Application Data

(62) Division of application No. 17/983,592, filed on Nov. 9, 2022, now Pat. No. 11,706,514, which is a division
(Continued)

(30) Foreign Application Priority Data

Aug. 21, 2018 (CN) .......................... 201810952770.4
Aug. 21, 2018 (CN) .......................... 201821351551.2
(Continued)

(51) Int. Cl.
*H04N 5/335* (2011.01)
*B29C 43/18* (2006.01)
(Continued)

(52) U.S. Cl.
CPC ............. *H04N 23/55* (2023.01); *B29C 43/18* (2013.01); *H04N 23/54* (2023.01); *H04N 23/57* (2023.01);
(Continued)

(58) Field of Classification Search
CPC ...................................................... B29C 43/18
See application file for complete search history.

(56) References Cited

U.S. PATENT DOCUMENTS

| 6,483,101 | B1 | 11/2002 | Webster |
| 2005/0077451 | A1* | 4/2005 | Minamio .......... H01L 27/14618 |
| | | | 257/E25.032 |

(Continued)

FOREIGN PATENT DOCUMENTS

| CN | 102946512 | 2/2013 |
| CN | 105704354 | 6/2016 |
| CN | 107566691 | 1/2018 |

OTHER PUBLICATIONS

International Search Report dated Sep. 30, 2019 in International (PCT) Application No. PCT/CN2019/095337.
(Continued)

*Primary Examiner* — Gary C Vieaux
(74) *Attorney, Agent, or Firm* — WENDEROTH, LIND & PONACK, L.L.P.

(57) ABSTRACT

A camera module and a molded photosensitive assembly and manufacturing methods thereof, and an electronic device are disclosed. The molded photosensitive assembly includes an imaging assembly, a molded base and a filter assembly. The imaging assembly includes a circuit board and at least one photosensitive element, and each photosensitive element is conductively connected to the circuit board. The molded base has at least one stepped peripheral groove to define a light window through each stepped peripheral groove, the molded base embeds a part of the imaging assembly, and a
(Continued)

photosensitive region of each photosensitive element respectively corresponds to each light window of the molded base. The filter assembly includes at least one filter element, and each filter element is correspondingly arranged in each stepped peripheral groove of the molded base, so that each filter element respectively corresponds to each light window of the molded base.

20 Claims, 37 Drawing Sheets

Related U.S. Application Data of application No. 17/266,776, filed as application No. PCT/CN2019/095337 on Jul. 10, 2019, now abandoned.

(30) Foreign Application Priority Data

| | | | |
|---|---|---|---|
| May 24, 2019 | (CN) | ......................... | 201910438885.6 |
| May 24, 2019 | (CN) | ......................... | 201910438917.2 |
| May 24, 2019 | (CN) | ......................... | 201910439285.1 |
| May 24, 2019 | (CN) | ......................... | 201920764689.3 |
| May 24, 2019 | (CN) | ......................... | 201920765166.0 |
| May 24, 2019 | (CN) | ......................... | 201920766441.0 |

(51) Int. Cl.
  *H04N 23/54* (2023.01)
  *H04N 23/55* (2023.01)
  *H04N 23/57* (2023.01)
  *B29L 11/00* (2006.01)
  *B29L 31/34* (2006.01)

(52) U.S. Cl.
  CPC ........ *B29L 2011/00* (2013.01); *B29L 2031/34* (2013.01)

(56) References Cited

U.S. PATENT DOCUMENTS

| | | | |
|---|---|---|---|
| 2005/0185088 A1* | 8/2005 | Kale | ................ H01L 27/14625 257/E31.127 |
| 2007/0183773 A1 | 8/2007 | Aoki et al. | |
| 2009/0046183 A1 | 2/2009 | Nishida et al. | |
| 2009/0051052 A1 | 2/2009 | Yoshioka | |
| 2009/0085138 A1* | 4/2009 | Ryu | ................ H01L 27/14618 257/434 |
| 2017/0160402 A1 | 6/2017 | Yoshioka et al. | |
| 2017/0229506 A1 | 8/2017 | Iwafuchi et al. | |
| 2017/0264800 A1 | 9/2017 | Wang et al. | |
| 2017/0307842 A1 | 10/2017 | Nakamura et al. | |
| 2017/0374252 A1 | 12/2017 | Chen | |
| 2018/0035021 A1 | 2/2018 | Wang et al. | |
| 2018/0109705 A1 | 4/2018 | Wang | |
| 2018/0109709 A1 | 4/2018 | Wang et al. | |
| 2018/0164529 A1 | 6/2018 | Wang | |
| 2018/0167538 A1 | 6/2018 | Wang | |
| 2019/0089875 A1 | 3/2019 | Fan | |
| 2019/0165019 A1 | 5/2019 | Wang et al. | |
| 2019/0387157 A1 | 12/2019 | Chen et al. | |
| 2020/0285018 A1 | 9/2020 | Zhang | |
| 2021/0271048 A1 | 9/2021 | Maesaka | |

OTHER PUBLICATIONS

Extended European Search Report dated Aug. 12, 2021 in European Patent Application No. 19853014.9.
Office Action dated Jun. 18, 2020 in U.S. Appl. No. 16/547,537.
Office Action dated Oct. 27, 2021 in U.S. Appl. No. 17/195,785.
Communication dated Mar. 23, 2023 in European Application No. 19853014.9.

* cited by examiner

Mounting a photosensitive element 212' and at least one group of electronic components 214' to a circuit board 211', and conducting the photosensitive element 212' and the circuit board 211' to assemble an imaging assembly 21' — S1

Forming, by means of a molding process, a molded base 23' which is used for embedding a part of the circuit board 211' and a part of the photosensitive element 212' and has a stepped peripheral groove 230', and forming a light window 2301' through the stepped peripheral groove 230', wherein a photosensitive region 2121' of the photosensitive element 212' corresponds to the light window 2301' of the molded base 23', so as to form a semi-finished molded photosensitive assembly with an integrated structure — S2

Correspondingly arranging a filter element 221' of a filter assembly 22' in the stepped peripheral groove 230' of the molded base 23' of the semi-finished molded photosensitive assembly to assemble a molded photosensitive assembly 20', wherein the photosensitive region 2121' of the photosensitive element 212' corresponds to the filter element 221' — S3

Fig.7A

```
┌─────────────────────────────────────────────────────────┐
│ Mounting a photosensitive element 212' and at least one │  ┌─S1
│ group of electronic components 214' to a circuit board  │──┘
│ 211', and conducting the photosensitive element 212'    │
│ and the circuit board 211' to assemble an imaging       │
│ assembly 21'                                            │
└─────────────────────────────────────────────────────────┘
                              │
                              ▼
┌─────────────────────────────────────────────────────────┐
│ Mounting the photosensitive element 212' to a chip      │  ┌─S11
│ mounting region 2111' of the circuit board 211'         │──┘
└─────────────────────────────────────────────────────────┘
                              │
                              ▼
┌─────────────────────────────────────────────────────────┐
│ Mounting each electronic component 214' to a circuit    │  ┌─S12
│ board outer portion 21123' of an edge region 2112' of   │──┘
│ the circuit board 211'                                  │
└─────────────────────────────────────────────────────────┘
                              │
                              ▼
┌─────────────────────────────────────────────────────────┐
│ Extending, by means of a wire bonding process, a lead   │  ┌─S13
│ 213' from a chip connector 2123' of the photosensitive  │──┘
│ element 212' to a circuit board connector 2113' of the  │
│ circuit board 211' to conductively connect the          │
│ photosensitive element 212' and the circuit board 21'   │
└─────────────────────────────────────────────────────────┘

┌─────────────────────────────────────────────────────────┐
│ Extending, by means of a reverse bonding process, a     │  ┌─S13'
│ lead 213' from a circuit board connector 2113' of the   │──┘
│ circuit board 211' to a chip connector 2123' of the     │
│ photosensitive element 212' to conductively connect     │
│ the photosensitive element 212' and the circuit board   │
│ 21'                                                     │
└─────────────────────────────────────────────────────────┘
```

Fig. 7B

```
┌─────────────────────────────────────────────────────────────┐
│ Forming, by means of a molding process, a molded base 23'   │
│ which is used for embedding a part of the circuit board 211'│
│ and a part of the photosensitive element 212' and has a     │─── S2
│ stepped peripheral groove 230', and forming a light window  │
│ 2301' through the stepped peripheral groove 230', wherein a │
│ photosensitive region 2121' of the photosensitive element   │
│ 212' corresponds to the light window 2301' of the molded    │
│ base 23', so as to form a semi-finished molded photosensitive│
│ assembly with an integrated structure                       │
└─────────────────────────────────────────────────────────────┘
                              │
                              ▼
┌─────────────────────────────────────────────────────────────┐
│ Placing the imaging assembly 21' in a molding die 500'      │─── S21
└─────────────────────────────────────────────────────────────┘
                              │
                              ▼
┌─────────────────────────────────────────────────────────────┐
│ Performing a clamping operation on an upper die 510' and a  │
│ lower die 520' of the molding die 500' to form a molding    │─── S22
│ space 530' of the molding die 500' between the upper die    │
│ 510' and the lower die 520'                                 │
└─────────────────────────────────────────────────────────────┘
                              │
                              ▼
┌─────────────────────────────────────────────────────────────┐
│ Adding a molding material to the molding space 530' of the  │
│ molding die 500' to form the molded base 23' with the       │─── S23
│ stepped peripheral groove 230' after the molding material   │
│ is cured; and                                               │
└─────────────────────────────────────────────────────────────┘
                              │
                              ▼
┌─────────────────────────────────────────────────────────────┐
│ Performing a drafting operation on the molding die 500' to  │─── S24
│ obtain the semi-finished molded photosensitive assembly     │
└─────────────────────────────────────────────────────────────┘
```

Fig. 7C

Mounting a photosensitive element 212' and at least one group of electronic components 214' to a circuit board 211', and conducting the photosensitive element 212' and the circuit board 211' to assemble an imaging assembly 21' ⟵ a Forming, by means of a molding process, a molded base 23' which is used for embedding a part of the circuit board 211' and a part of the photosensitive element 212' and has a stepped peripheral groove 230', and defining a light window 2301' on the molded base 23' through the stepped peripheral groove 230', wherein a photosensitive region 2121' of the photosensitive element 212' corresponds to the light window 2301' of the molded base 23', so as to form a semi-finished molded photosensitive assembly with an integrated structure ⟵ b Correspondingly arranging a filter element 221' of a filter assembly 22' in the stepped peripheral groove 230' of the molded base 23' of the semi-finished molded photosensitive assembly to assemble a molded photosensitive assembly 20', wherein the photosensitive region 2121' of the photosensitive element 212' corresponds to the filter element 221' ⟵ c Correspondingly arranging an optical lens 10' on a photosensitive path of the imaging assembly 21' of the molded photosensitive assembly 20' to form a camera module 1' ⟵ d

Fig. 8

Forming, by means of a molding process, a molded base 23A' which is used for embedding a circuit board outer portion 21123' of an edge region 2112' of a circuit board 211' and has a stepped peripheral groove 230', and form a light window 2301' through the stepped peripheral groove 230', wherein a photosensitive region 2121' of the photosensitive element 212' corresponds to the light window 2301' of the molded base 23A', so as to form a semi-finished molded photosensitive assembly with an integrated structure ⎯ A

Mounting a photosensitive element 212' to a chip mounting region 2111' of the circuit board 211', and conducting the photosensitive element 212' and the circuit board 211' ⎯ B

Correspondingly arranging a filter element 221' of a filter assembly 22' in the stepped peripheral groove 230' of the molded base 23A' to assemble a molded photosensitive assembly 20A', wherein the photosensitive region 2121' of the photosensitive element 212' corresponds to the filter element 221' ⎯ C

Fig.11

CAMERA MODULE AND MOLDED PHOTOSENSITIVE ASSEMBLY AND ELECTRONIC DEVICE

FIELD OF THE INVENTION

The present invention relates to the field of optical imaging technology, and particularly to a camera module and a molded photosensitive assembly and manufacturing methods thereof, and an electronic device.

BACKGROUND OF THE INVENTION

In recent years, electronic products, intelligent devices, and the like have increasingly tended to be thinner, lighter and smaller. This development trend of electronic products and intelligent devices puts forward more stringent requirements for the size of a camera module (especially the height of a camera module) as one of the standard configurations of electronic products and intelligent devices.

During assembly process of the camera module in the prior art, a chip and electronic components are usually mounted to a circuit board first, and then a lens holder is formed on the circuit board through a lens holder attaching process or a molding process. In addition, a filter assembly is usually mounted to the lens holder, and then an optical lens is mounted to the filter assembly, so that the optical lens is held on a photosensitive path of the chip.

By this assembly mode in the prior art, the height of the camera module depends on the thickness of the circuit board, the height of the lens holder, the thickness of the filter assembly and the height of the optical lens, that is, according to the existing structural design mode, the sum of the thickness of the circuit board, the height of the lens holder, the thickness of the filter assembly, and the height of the optical lens is equal to the height of the camera module, which has many limitations for a thin and light camera module.

Avoidance spaces should be reserved for the traditionally attached lens holder and upper and lower parts between electronic components. Meanwhile, a color filter is mounted on a support arm of the lens holder, the support arm of the lens holder for mounting the color filter has a minimum molding thickness, which is usually 0.2 mm or more. In addition, a safety distance is also required between an upper surface of the color filter and a lower surface of the lens. Therefore, in the assembly of the traditional lens holder, the height stacking accumulation causes the height of the lens holder difficult to be reduced.

Moreover, similar situations also exist in the molding process.

First, in the molding process, the electronic components mounted on the circuit board are located in a molding die, safety distances need to be reserved between the electronic components and the molding die to prevent the molding die from squeezing the electronic components, that is, no matter in the horizontal direction or in the height direction, a safety distance needs to be reserved between the molding die and the respective electronic component in order to cover each electronic component after a molded base is formed, so that the height of the molded base has to be greater than the height of the respective electronic component, that is, the height of the molded base is limited by the height of electronic component, which results in that the height of the molded base cannot be reduced.

Second, the filter assembly is composed of a filter and a support element, the support element is usually made by an injection molding process, and the part of the support element that supports the filter needs to have certain thickness to ensure sufficient strength for firmly supporting the filter, so that the thickness of the filter assembly has to be greater than the thickness of the filter, that is, the thickness of the filter assembly is limited by the support element and the filter together, which results in that the thickness of the filter assembly cannot be reduced.

Therefore, due to the limitations of the above various factors, the assembly mode in the prior art cannot reduce the height of the camera module, and thus cannot meet the requirements of the market for lightness, thinness and miniaturization of the camera module.

Today's intelligent devices have to be equipped with high-quality camera modules. For example, a smart phone acquires images through a camera module to perceive the world. As the intelligent devices pursue to be thinner and lighter, small-sized camera modules are more competitive in the market.

An existing camera module mounted in a smart phone is disclosed in FIG. 13. A filter assembly 20P is supported above a photosensitive assembly 30P. An optical lens 10P is mounted above the filter assembly 20P, so that shaped and filtered light is transmitted to a chip 300P of the photosensitive assembly 30P. In order to achieve better quality, the filter assembly 20P needs to be arranged between the optical lens 10P and the photosensitive assembly 30P. Then, the thickness of the existing camera module is determined from the photosensitive assembly 30P to the optical lens 10P. Moreover, the thickness of the camera module is difficult to be reduced, because of the height of the optical lens 10P, the thickness of the filter assembly 20P, and the height of the photosensitive assembly 30P. The camera module with such size is neither suitable nor attractive in a thin and stylish smart phone. In this example of the existing camera module, the filter assembly 20P includes a filter 21P and a filter holder 22P. The filter holder 22P surrounds and supports the filter 21P between the optical lens 10P and the photosensitive assembly 30P. In addition, the height of the optical lens 10P and the thickness of the photosensitive assembly 30P are difficult to be reduced due to the complicated optical design and the sizes of electronic devices included in the photosensitive assembly 30P. Particularly, because the camera module with a short back focus length is usually required to be less than 0.6 mm, the current technological level cannot meet this requirement.

For some existing camera modules, attempts are made to directly mount the filter 21P at the bottom of the optical lens 10P without the filter holder 22P, so as to reduce the overall size of the camera module. However, the optical lens 10P has to be directly pressed on the filter 21P, and the filter 21P cannot bear the weight of the optical lens 10P or the movement of the optical lens 10P during usage. Moreover, glue for mounting the optical lens 10P easily flows into the center of the filter 21P to cover a light transmission region. The damaged filter 21P causes the entire camera module to fail to acquire images.

In some other existing technologies, attempts are made to attach the filter 21P to the surface of the chip 300P or the bottom surface of the optical lens 10P. But this requires more details to attach the filter 21P to the surface, just like attaching a film to glass. For example, it is difficult to guarantee the flatness between the filter 21P and the chip 300P, and the durability of the filter 21P and the chip 300P may be subjected to adverse effects. Once there are bubbles or wrinkles, the filter effect of the filter 21P will decrease, and the filter 21P cannot work effectively, so that the quality and reliability of the camera module are reduced.

In fact, the distance between the optical lens 10P and the filter 21P and the distance between the filter 21P and the chip 21P are critical to the image quality. After reflected on the filter 21P, stray light enters the chip 300P. If the distance between the filter 21P and the chip 300P is too short, the stray light may enter the center of the chip 300P, that is, an imaging sensing region. If the distance between the filter 21P and the chip 300P is slightly long, the stray light may enter the edge of the chip 300P, that is, the processing and aggregation of the stray light are easily neglected. Therefore, if the filter 21P is attached to the surface of the chip 300P or the bottom surface of the optical lens 10P to reduce the thickness of the camera module, the efficiency of capturing images will be reduced, that is, the operation of the filter 21P does not achieve a certain effect, which is not perfect for an intelligent device.

SUMMARY OF THE INVENTION

An object of the present invention is to provide a camera module and a molded photosensitive assembly and manufacturing methods thereof, and an electronic device, which can reduce the height of the camera module and are beneficial to meeting development requirements for lightness, thinness and miniaturization of the camera module.

Another object of the present invention is to provide a camera module and a molded photosensitive assembly and manufacturing methods thereof, and an electronic device, which can reduce the height of the camera module by reducing a distance between a filter element and a circuit board.

Another object of the present invention is to provide a camera module and a molded photosensitive assembly and manufacturing methods thereof, and an electronic device, which can reduce a back focus length of an optical lens of the camera module and help to achieve smaller camera modules to meet market requirements.

Another object of the present invention is to provide a camera module and a molded photosensitive assembly and manufacturing methods thereof, and an electronic device, and in some embodiments of the present invention, a molded base of the molded photosensitive assembly has a stepped peripheral groove, and a filter element of the molded photosensitive assembly is mounted in the stepped peripheral groove of the molded base, so that a distance between the filter element and the circuit board is reduced.

Another object of the present invention is to provide a camera module and a molded photosensitive assembly and manufacturing methods thereof, and an electronic device, and in some embodiments of the present invention, the molded base has a stepped peripheral groove, and the filter element is arranged in the stepped peripheral groove to reduce the distance between the filter element and the circuit board.

Another object of the present invention is to provide a camera module and a molded photosensitive assembly and manufacturing methods thereof, and an electronic device, and in some embodiments of the present invention, the molded base includes a first base portion and a second base portion, wherein the second base portion integrally extends inward from the first base portion along the circuit board, a first top surface of the first base portion defines a first mounting surface, a second top surface of the second base portion defines a second mounting surface, the first mounting surface is higher than the second mounting surface, and the filter element is mounted on the second mounting surface.

Another object of the present invention is to provide a camera module and a molded photosensitive assembly and manufacturing methods thereof, and an electronic device, and in some embodiments of the present invention, the second mounting surface of the molded base is lower than upper surfaces of electronic components on the circuit board to further reduce the distance between the filter element and the circuit board.

Another object of the present invention is to provide a camera module and a molded photosensitive assembly and manufacturing methods thereof, and an electronic device, and in some embodiments of the present invention, the filter element is mounted on the first mounting surface of the molded base through a support element, and the filter element is located between the first mounting surface and the second mounting surface to reduce the distance between the filter element and the circuit board.

Another object of the present invention is to provide a camera module and a molded photosensitive assembly and manufacturing methods thereof, and an electronic device, and in some embodiments of the present invention, the first mounting surface and the second mounting surface of the molded base are parallel to each other, which facilitate a subsequent active calibration process.

Another object of the present invention is to provide a camera module and a molded photosensitive assembly and manufacturing methods thereof, and an electronic device, and in some embodiments of the present invention, an arc height of gold wires is reduced by a reverse punching process to avoid a pressure head of a mold, which can thus reduce the distance between the second mounting surface of the molded base and the circuit board.

Another object of the present invention is to provide a camera module and a molded photosensitive assembly and manufacturing methods thereof, and an electronic device, and in some embodiments of the present invention, before the photosensitive element is mounted, the molded base is manufactured by a molding process to further reduce the distance between the second mounting surface of the molded base and the circuit board.

Another object of the present invention is to provide a camera module and a molded photosensitive assembly and manufacturing methods thereof, and an electronic device, and in some embodiments of the present invention, the photosensitive element is mounted in a chip mounting recess of the circuit board to further reduce the distance between the second mounting surface of the molded base and the circuit board.

Another object of the present invention is to provide a camera module and a molded photosensitive assembly and manufacturing methods thereof, and an electronic device, and in some embodiments of the present invention, the photosensitive element is mounted in a through hole type chip mounting recess of the circuit board to further reduce the distance between the second mounting surface of the molded base and the circuit board.

Another object of the present invention is to provide a camera module and a molded photosensitive assembly and manufacturing methods thereof, and an electronic device, and in some embodiments of the present invention, an upper surface of the filter element is not higher than the first mounting surface of the molded base, which effectively prevents impacting the filter element due to the downward movement of the optical lens in a dynamic focus camera module.

Another object of the present invention is to provide a camera module and a molded photosensitive assembly and manufacturing methods thereof, and an electronic device, and in some embodiments of the present invention, a gap is reserved between the filter element and a first inner circumferential surface of the first base portion of the molded base for mounting the filter element.

Another object of the present invention is to provide a camera module and a molded photosensitive assembly and manufacturing methods thereof, and an electronic device, wherein the thickness of the camera module mainly depends on the height of a lens and the thickness of a molded photosensitive assembly, thereby saving installation space in an intelligent device.

Another object of the present invention is to provide a camera module and a molded photosensitive assembly and manufacturing methods thereof, and electronic device, and in order to effectively produce a small-sized camera module, the difficulty and complexity in manufacturing the lens and the molded photosensitive assembly will not increase.

Another object of the present invention is to provide a camera module and a molded photosensitive assembly and manufacturing methods thereof, and an electronic device, wherein the filter is well supported and does not need to support the lens, so that the lens is stably supported without worrying about damaging the filter.

Another object of the present invention is to provide a camera module and a molded photosensitive assembly and manufacturing methods thereof, and an electronic device, wherein a lens glue applied between the lens and the molded photosensitive assembly is far away from the filter to keep a filter region of the filter uncovered.

Another object of the present invention is to provide a camera module and a molded photosensitive assembly and manufacturing methods thereof, and an electronic device, wherein the distance between the filter and the lens is kept to maintain a small amount of stray light entering the molded photosensitive film in the molded photosensitive assembly, so that the image quality is enhanced.

Another object of the present invention is to provide a camera module and a molded photosensitive assembly and manufacturing methods thereof, and an electronic device, wherein the distance between the filter and the molded photosensitive assembly is kept to maintain a small amount of stray light entering the center of the photosensitive film, so that the image quality is enhanced.

Another object of the present invention is to provide a camera module and a molded photosensitive assembly and manufacturing methods thereof, and an electronic device, wherein the photosensitive film is almost not pressed by the filter and can have better photosensitive property.

Another object of the present invention is to provide a camera module and a molded photosensitive assembly and manufacturing methods thereof, and an electronic device, wherein the lens is directly supported on the molded photosensitive assembly, so that the lens has a strong support and is convenient to be started or moved.

Another object of the present invention is to provide a camera module and a molded photosensitive assembly and manufacturing methods thereof, and an electronic device, wherein the molded photosensitive assembly provides a high support for the lens, and provides a short support for the filter, so as to effectively avoid interference between the lens and the filter under the premise of stably supporting the lens and the filter at the same time.

Another object of the present invention is to provide a camera module and a molded photosensitive assembly and manufacturing methods thereof, and an electronic device, wherein the lens can be mounted on the molded photosensitive assembly to adapt to an edge shape of an intelligent device, so that the imaging capability is guaranteed with a more attractive appearance.

In order to achieve at least one of the above-mentioned objects or other objects and advantages, the present invention provides a molded photosensitive assembly, including:

an imaging assembly, wherein the imaging assembly includes a circuit board and at least one photosensitive element, and each photosensitive element is conductively connected to the circuit board;

a molded base, wherein the molded base has at least one stepped peripheral groove to define a light window through each stepped peripheral groove, the molded base embeds a part of the imaging assembly, and a photosensitive region of each photosensitive element corresponds to each light window of the molded base; and a filter assembly, wherein the filter assembly includes at least one filter element, and each filter element is correspondingly arranged in each stepped peripheral groove of the molded base, so that each filter element respectively corresponds to each light window of the molded base.

In some embodiments of the present invention, the molded base includes at least one first base portion and at least one second base portion, wherein each second base portion integrally extends inward from an inner circumferential surface of each first base portion along the circuit board, a first top surface of each first base portion is higher than a second top surface of the second base portion, so that each first base portion and each second base portion form each stepped peripheral groove of the molded base.

In some embodiments of the present invention, the circuit board includes a chip mounting region and an edge region located around the chip mounting region, and the photosensitive element includes a photosensitive region and a non-photosensitive region located around the photosensitive region, wherein the first base portion of the molded base embeds at least a part of the edge region of the circuit board, and the second base portion of the molded base embeds at least a part of the non-photosensitive region of the photosensitive element.

In some embodiments of the present invention, the first base portion embeds a circuit board outer portion of the edge region of the circuit board, and the second base portion embeds a circuit board connecting portion and a circuit board inner portion of the edge region of the circuit board, as well as a chip outer portion and a chip connecting portion of the non-photosensitive region of the photosensitive element.

In some embodiments of the present invention, the first base portion of the molded base embeds a circuit board outer portion and a circuit board connecting portion of the edge region of the circuit board, and the second base portion embeds a circuit board inner portion of the edge region of the circuit board, as well as a chip outer portion and a chip connecting portion of the non-photosensitive region of the photosensitive element.

In some embodiments of the present invention, the first base portion of the molded base embeds a circuit board outer portion, a circuit board connecting portion and a circuit board inner portion of the edge region of the circuit board, and the second base portion embeds a chip outer portion, a chip connecting portion and a part of a chip inner portion of the non-photosensitive region of the photosensitive element.

In some embodiments of the present invention, the first base portion of the molded base embeds a circuit board outer portion, a circuit board connecting portion and a circuit board inner portion of the edge region of the circuit board, as well as a chip outer portion of the non-photosensitive region of the photosensitive element, and the second base portion embeds a chip connecting portion and a part of a chip inner portion of the non-photosensitive region of the photosensitive element.

In some embodiments of the present invention, the imaging assembly further includes at least one group of leads to conductively connect the photosensitive element and the circuit board through each lead, wherein a height of the second base portion is greater than an arc height of each lead, and the second base portion embeds each lead of the imaging assembly.

In some embodiments of the present invention, the imaging assembly further includes at least one group of electronic components, and each electronic component is mounted to the circuit board outer portion of the edge region of the circuit board, wherein a height of the first base portion of the molded base is greater than a height of each electronic component, and the first base portion embeds each electronic component of the imaging assembly.

In some embodiments of the present invention, the second top surface of the second base portion is lower than a top surface of the highest electronic component.

In some embodiments of the present invention, the circuit board includes a chip mounting region and an edge region located around the chip mounting region, wherein the first base portion and the second base portion of the molded base embed a circuit board outer portion of the edge region of the circuit board.

In some embodiments of the present invention, the imaging assembly further includes at least one group of electronic components, and each electronic component is mounted to the circuit board outer portion of the edge region of the circuit board, wherein the height of the first base portion of the molded base is greater than the height of each electronic component, and the first base portion embeds each electronic component of the imaging assembly.

In some embodiments of the present invention, the first top surface of the first base portion and the second top surface of the second base portion are parallel to each other.

In some embodiments of the present invention, the first top surface of each first base portion of the molded base and a photosensitive surface of the photosensitive element are parallel to each other.

In some embodiments of the present invention, an inclination angle of the first inner circumferential surface of each first base portion relative to a photosensitive surface of the photosensitive element is less than 30°.

In some embodiments of the present invention, an inclination angle of a second inner circumferential surface of each second base portion relative to the photosensitive surface of the photosensitive element is less than 30°.

In some embodiments of the present invention, the filter assembly further includes at least one glue layer, wherein each glue layer is arranged between each filter element and each second base portion, so that each filter element is fixedly arranged on each second base portion of the molded base through each glue layer.

In some embodiments of the present invention, each glue layer is formed by curing glue applied to the second top surface of each second base portion, and each glue layer is located between a lower surface of each filter element and the second top surface of each second base portion.

In some embodiments of the present invention, each second base portion is further provided with at least one glue recess, wherein each glue recess is sunken downward from the second top surface of each second base portion to form a recess for holding the glue.

In some embodiments of the present invention, each glue layer is formed by curing glue applied to a lower surface of each filter element, and each glue layer is located between the lower surface of each filter element and the second top surface of each second base portion.

In some embodiments of the present invention, the molded photosensitive assembly further includes a mounting gap, wherein the mounting gap is located between the filter element and the first inner circumferential surface of the first base portion.

In some embodiments of the present invention, each glue layer has at least one air escape hole, wherein each air escape hole extends from an inner side of the glue layer to an outer side of the glue layer to communicate a space between the filter element and the photosensitive element with an outer space of the molded photosensitive assembly.

In some embodiments of the present invention, the filter assembly further includes at least one glue layer and at least one annular support element, wherein each glue layer is located between an upper surface of each filter element and each support element, so that each filter element is fixedly mounted to each support element through each glue layer, wherein each support element is correspondingly arranged on the first base portion of the molded base, so that each filter element is located in each stepped peripheral groove of the molded base.

In some embodiments of the present invention, each support element of the filter assembly is mounted to the first top surface of each first base portion, so that the upper surface of each filter element is lower than the first top surface of each first base portion.

In some embodiments of the present invention, the circuit board is further provided with at least one chip mounting recess, wherein each chip mounting recess is located in a chip mounting region of the circuit board, and each chip mounting recess is sunken downward from an upper side surface of the circuit board to form a recess for mounting the photosensitive element.

In some embodiments of the present invention, each chip mounting recess extends downward from the upper side surface of the circuit board to a lower side surface of the circuit board to form a through hole in the chip mounting region of the circuit board, wherein each photosensitive element is fixedly arranged in each chip mounting recess.

According to another aspect of the present invention, the present invention further provides a camera module, including:

the above-mentioned molded photosensitive assembly; and at least one optical lens, wherein each optical lens is arranged on a photosensitive path of each photosensitive element of the imaging assembly of the molded photosensitive assembly, so that each light window provides a light path for each optical lens and each photosensitive element.

According to another aspect of the present invention, the present invention further provides an electronic device, including:

an electronic device body; and the above-mentioned camera modules, wherein each camera module is arranged in the electronic device body for capturing images.

According to another aspect of the present invention, the present invention further provides a method for manufacturing a molded photosensitive assembly, including the following steps:

mounting a photosensitive element and at least one group of electronic components to a circuit board, and conducting the photosensitive element and the circuit board to assemble an imaging assembly;

forming, by means of a molding process, a molded base which is used for embedding a part of the circuit board and a part of the photosensitive element and has a stepped peripheral groove, and forming a light window through the stepped peripheral groove, wherein a photosensitive region of the photosensitive element corresponds to the light window of the molded base, so as to form a semi-finished molded photosensitive assembly with an integrated structure; and correspondingly arranging a filter element of a filter assembly in the stepped peripheral groove of the molded base of the semi-finished molded photosensitive assembly to assemble a molded photosensitive assembly, wherein the photosensitive region of the photosensitive element corresponds to the filter element.

In some embodiments of the present invention, the step of mounting a photosensitive element and at least one group of electronic components to a circuit board, and conducting the photosensitive element and the circuit board to assemble an imaging assembly includes the following steps:

mounting the photosensitive element to a chip mounting region of the circuit board;

mounting each electronic component to a circuit board outer portion of an edge region of the circuit board; and extending, by means of a wire bonding process, a lead from a chip connector of the photosensitive element to a circuit board connector of the circuit board to conductively connect the photosensitive element and the circuit board.

In some embodiments of the present invention, the step of mounting a photosensitive element and at least one group of electronic components to a circuit board, and conducting the photosensitive element and the circuit board to assemble an imaging assembly includes the following steps:

mounting the photosensitive element to a chip mounting region of the circuit board;

mounting each electronic component to a circuit board outer portion of an edge region of the circuit board; and extending, by means of a wire bonding process, a lead from a circuit board connector of the circuit board to a chip connector of the photosensitive element to conductively connect the circuit board and the photosensitive element.

In some embodiments of the present invention, the step of forming, by means of a molding process, a molded base which is used for embedding a part of the circuit board and a part of the photosensitive element and has a stepped peripheral groove, and forming a light window through the stepped peripheral groove, wherein a photosensitive region of the photosensitive element corresponds to the light window of the molded base, so as to form a semi-finished molded photosensitive assembly with an integrated structure includes the following steps:

placing the imaging assembly in a molding die;

performing a clamping operation to an upper die and a lower die of the molding die to form a molding space of the molding die between the upper die and the lower die;

adding a molding material to the molding space of the molding die to form the molded base with the stepped peripheral groove after the molding material is cured; and performing a drafting operation on the upper die and the lower die to obtain the semi-finished molded photosensitive assembly.

In some embodiments of the present invention, the step of performing a clamping operation to an upper die and a lower die of the molding die to form a molding space of the molding die between the upper die and the lower die includes the following steps:

arranging a cover film on a pressing surface of the upper die;

pressing, by means of the cover film, the photosensitive element of the imaging assembly, so that the cover film is located between the pressing surface and the photosensitive element;

forming a first molding space of the molding space between a first inner surface of the upper die and at least a part of the edge region of the circuit board; and forming a second molding space of the molding space between a second inner surface of the upper die and at least a part of a non-photosensitive region of the photosensitive element, wherein the first inner surface of the upper die is above the second inner surface of the upper die.

In some embodiments of the present invention, the step of adding a molding material to the molding space of the molding die to form the molded base with the stepped peripheral groove after the molding material is cured includes the following steps:

adding the molding material to the first molding space to form a first base portion of the molded base after the molding material is cured, wherein the first base portion embeds the at least a part of the edge region of the circuit board; and adding the molding material to the second molding space to form a second base portion of the molded base after the molding material is cured, wherein the second base portion embeds the at least a part of the non-photosensitive region of the photosensitive element, and a height of the second base portion is lower than a height of the first base portion.

In some embodiments of the present invention, the step of correspondingly arranging a filter element of a filter assembly in the stepped peripheral groove of the molded base of the semi-finished molded photosensitive assembly to assemble a molded photosensitive assembly, wherein the photosensitive region of the photosensitive element corresponds to the filter element includes the following steps:

applying a glue to a second top surface of the second base portion of the molded base;

correspondingly arranging the filter element on the second top surface of the second base portion; and forming, after the glue is cured, a glue layer of the filter assembly between a lower surface of the filter element and the second top surface of the second base portion.

In some embodiments of the present invention, the step of correspondingly arranging a filter element of a filter assembly in the stepped peripheral groove of the molded base of the semi-finished molded photosensitive assembly to assemble a molded photosensitive assembly, wherein the photosensitive region of the photosensitive element corresponds to the filter element includes the following steps:

applying a glue to a lower surface of the filter element;

correspondingly arranging the filter element on a second top surface of the second base portion; and forming, after the glue is cured, a glue layer of the filter assembly between the lower surface of the filter element and the second top surface of the second base portion.

In some embodiments of the present invention, the step of correspondingly arranging a filter element of a filter assembly in the stepped peripheral groove of the molded base of the semi-finished molded photosensitive assembly to assemble a molded photosensitive assembly, wherein the photosensitive region of the photosensitive element corresponds to the filter element includes the following steps:

applying a glue to an annular support element of the filter assembly;

correspondingly arranging the filter assembly on the support element to form a glue layer of the filter assembly between an upper surface of the filter element and the support element after the glue is cured; and correspondingly arranging the support element on a first top surface of the first base portion, so that the filter element is located in the stepped peripheral groove of the molded base.

According to another aspect of the present invention, the present invention further provides a method for manufacturing a molded photosensitive assembly, including the following steps:

forming, by means of a molding process, a molded base which is used for embedding a circuit board outer portion of an edge region of a circuit board and has a stepped peripheral groove, and forming a light window through the stepped peripheral groove, wherein a photosensitive region of the photosensitive element corresponds to the light window of the molded base, so as to form a semi-finished molded photosensitive assembly with an integrated structure;

mounting a photosensitive element to a chip mounting region of the circuit board, and conducting the photosensitive element and the circuit board; and correspondingly arranging a filter element of a filter assembly in the stepped peripheral groove of the molded base to assemble a molded photosensitive assembly, wherein the photosensitive region of the photosensitive element corresponds to the filter element.

According to another aspect of the present invention, the present invention further provides a method for manufacturing a camera module, including the following steps:

manufacturing a molded photosensitive assembly according to the above-mentioned method for manufacturing a molded photosensitive assembly; and correspondingly arranging an optical lens on a photosensitive path of an imaging assembly of the molded photosensitive assembly to form a camera module.

According to one aspect of the present invention, a camera module of the present invention that can achieve the foregoing objectives and other objectives and advantages includes:

a camera module, characterized by including:

an optical assembly;

a filter; and a molded photosensitive assembly mounted below the optical assembly and the filter, wherein the molded photosensitive assembly includes a main body, some electronic devices, a photosensitive film and a circuit board, the circuit board is electrically connected to the electronic devices and the photosensitive film, the main body embeds the electronic devices and a part of the circuit board, the photosensitive film is surrounded by a bottom portion of the main body and keeps a distance from the filter, the main body includes a bounding body supporting the optical assembly thereon and a short body supporting the filter thereon, the short body extends from an inner side of the bounding body, and a distance between a short upper surface of the short body and the photosensitive film is more than or equal to 0.15 mm.

In some embodiments of the present invention, the filter includes a filter portion for filtering imaging light and an edge portion extending outward from the filter portion, wherein the edge portion is supported on the short upper surface of the short body of the molded photosensitive assembly, so that the filter portion corresponds to the photosensitive film.

In some embodiments of the present invention, the filter portion has an incident surface and an exit surface, wherein the incident surface faces the optical assembly, and the exit surface faces the photosensitive film.

In some embodiments of the present invention, the edge portion has an edge top surface, an edge side surface and an edge bottom surface, wherein the edge top surface is coplanar with the incident surface, and the edge bottom surface is coplanar with the exit surface.

In some embodiments of the present invention, a distance between the edge side surface of the edge portion of the filter and a high inner side surface of the bounding body is more than or equal to 0.15 mm.

In some embodiments of the present invention, a width between the edge bottom surface of the edge portion of the filter and the short upper surface of the short body has a maximum value, which is equal to a width of the edge portion.

In some embodiments of the present invention, the width of the edge portion of the filter is more than or equal to 0.25 mm.

In some embodiments of the present invention, a distance between each electronic device and the edge side surface of the edge portion of the filter is more than or equal to 0.25 mm.

In some embodiments of the present invention, the short upper surface of the short body is lower than a high upper surface of the bounding body, and a relative height of the short upper surface of the short body is lower than a height of the highest electronic device among the electronic devices.

In some embodiments of the present invention, a relative height of the high upper surface of the bounding body is higher than the height of the highest electronic device among the electronic devices, so that the bounding body at least embeds the highest electronic device among the electronic devices, wherein the optical assembly is mounted on the high upper surface of the bounding body.

In some embodiments of the present invention, a distance between the high upper surface of the bounding body and the short upper surface of the short body is more than 0.1 mm.

In some embodiments of the present invention, a width of the short upper surface of the short body is a distance from the high inner side surface of the bounding body to a short inner side surface of the short body, which is more than or equal to 0.4 mm.

In some embodiments of the present invention, the bounding body and the short body are shaped into like squares with chamfers, wherein inscribed circle radii of the chamfers of the bounding body and the short body are more than or equal to 0.3 mm.

In some embodiments of the present invention, a height of the bounding body is more than or equal to 0.5 mm.

According to another aspect of the present invention, the present invention further provides a method for manufacturing a camera module, including the following steps:

I connecting a photosensitive film with some wires and some electronic devices to a circuit board;

II placing the connected circuit board between an upper die and a lower die; and III embedding the electronic devices in a main body and on the circuit board to form a molded photosensitive assembly, wherein the main body includes a bounding body and a short body whose height is lower than that of the bounding body.

In some embodiments of the present invention, the method for manufacturing the camera module further includes the following steps:

IV mounting a filter on a short upper surface of the short body; and

V mounting an optical assembly on a high upper surface of the bounding body.

In some embodiments of the present invention, in step III, the short upper surface of the short body is lower than the high upper surface of the bounding body, and a relative height of the short upper surface of the short body is lower than a height of the highest electronic device among the electronic devices.

In some embodiments of the present invention, the electronic devices, the wires, and an edge of the photosensitive film are all embedded by the main body.

In some embodiments of the present invention, step III further includes the following steps:

III.1 injecting a molding material between an upper die and a lower die;

III.2 curing the molding material between the upper die and the lower die to form the main body; and III.3 drafting the upper die and the lower die from the molded photosensitive assembly.

In some embodiments of the present invention, an angle between a high inner side surface of the bounding body and the short upper surface of the short body is more than or equal to 95°.

In some embodiments of the present invention, step IV further includes the following steps:

IV.1 applying a filter glue in a C shape to the short upper surface of the short body, so that a gap is reserved between two ends of the filter glue;

IV.2 mounting the filter on the filter glue;

IV.3 curing the filter glue; and

IV.4 filling the gap between the two ends of the filter glue with supplementary filter glue to form the square-like filter glue.

In some embodiments of the present invention, a length of the gap is more than or equal to 0.7 mm and less than or equal to 1.0 mm.

According to one aspect of the present invention, a camera module of the present invention, which can achieve the foregoing objectives and other objectives and advantages, is suitable for being fixed in a mounting shell, and includes:

an optical assembly;

a filter; and a molded photosensitive assembly mounted below the optical assembly and the filter, wherein the molded photosensitive assembly includes a main body, some electronic devices, a photosensitive film and a circuit board, the circuit board is electrically connected to the electronic devices and the photosensitive film, the photosensitive film is fixed and surrounded by a bottom portion of the main body so as to keep a distance from the filter, the main body includes a bounding body and a short body, the optical assembly is eccentrically arranged on the bounding body so as to be close to at least one side of the mounting shell, and the filter is supported on a short upper surface of the short body.

In some embodiments of the present invention, the bounding body has a high upper surface and a low upper surface, wherein a height of the bounding body at the high upper surface is greater than a height of the bounding body at the low upper surface, a part of the optical assembly is supported on the high upper surface of the bounding body, and the other part of the optical assembly is supported on the low upper surface of the bounding body.

In some embodiments of the present invention, the camera module further includes a lens glue, wherein the lens glue includes a fixed glue layer, and the fixed glue layer is arranged between the optical assembly and the high upper surface of the bounding body.

In some embodiments of the present invention, the lens glue further includes a glue filling layer, wherein the glue filling layer is arranged between the optical assembly and the low upper surface of the bounding body, and a thickness of the glue filling layer is greater than a thickness of the fixed glue layer.

In some embodiments of the present invention, the high upper surface of the bounding body is U-shaped to support the optical assembly on three sides; wherein the low upper surface of the bounding body is linear shaped, and the low upper surface extends from a high outer side surface of the bounding body to the other high outer side surface of the bounding body to support the optical assembly on one side.

In some embodiments of the present invention, the high upper surface of the bounding body is U-shaped to support the optical assembly on three sides; wherein the low upper surface of the bounding body is linear shaped, and the low upper surface extends from a high inner side surface of the bounding body to the other high inner side surface of the bounding body to support the optical assembly on one side.

In some embodiments of the present invention, the high upper surface of the bounding body is L-shaped to support the optical assembly on two adjacent sides; wherein the low upper surface of the bounding body is also L-shaped to support the optical assembly on two adjacent sides.

In some embodiments of the present invention, the fixed glue layer is U-shaped, and the glue filling layer is linear shaped, so that the fixed glue layer and the glue filling layer form the lens glue with a hollow square-shaped structure.

In some embodiments of the present invention, the fixed glue layer is L-shaped, and the glue filling layer is L-shaped, so that the fixed glue layer and the glue filling layer form the lens glue with a hollow square-shaped structure.

In some embodiments of the present invention, the optical assembly protrudes outward from the low upper surface of the bounding body relative to the molded photosensitive assembly.

In some embodiments of the present invention, the electronic devices are embedded by the bounding body, and the electronic devices are located below the high upper surface of the bounding body.

In some embodiments of the present invention, the electronic devices are arranged on two or three sides of the photosensitive film.

In some embodiments of the present invention, the low upper surface of the bounding body is in a same height with the short upper surface of the short body.

In some embodiments of the present invention, the optical assembly protrudes outward from at least one side of the bounding body relative to the molded photosensitive assembly, so that the optical assembly is close to at least one side of the mounting shell.

In some embodiments of the present invention, the short upper surface of the short body is lower than the high upper surface of the bounding body, and a relative height of the short upper surface of the short body is lower than a height of the highest electronic device among the electronic devices.

In some embodiments of the present invention, a distance between the high upper surface of the bounding body and the short upper surface of the short body is more than 0.1 mm.

In some embodiments of the present invention, a draft angle of the high inner side surface of the bounding body is between 5° and 10°.

In some embodiments of the present invention, a fillet radius between the high inner side surface of the bounding body and the short upper surface of the short body is substantially equal to 0.1 mm.

In some embodiments of the present invention, a draft angle of the high outer side surface of the bounding body is between 5° and 10°.

According to another aspect of the present invention, the present invention further provides a method for manufacturing a camera module, including the steps:

I connecting a photosensitive film with some wires and some electronic devices to a circuit board;

II placing the connected circuit board between an upper die and a lower die;

III embedding the electronic devices in a main body and on the circuit board to form a molded photosensitive assembly, wherein the main body includes a bounding body and a short body whose height is lower than that of the bounding body;

IV mounting a filter on a short upper surface of the short body; and

V eccentrically arranging the optical assembly on the bounding body, so that the optical assembly is close to at least one side of a mounting shell.

In some embodiments of the present invention, step V includes the following steps:

V.1 fixing the optical assembly to a high upper surface of the bounding body; and V.2 reinforcing the optical assembly to a low upper surface of the bounding body, wherein the low upper surface is lower than the high upper surface.

In some embodiments of the present invention, in step V.1, a lens glue is applied to the high upper surface of the bounding body to form a fixed glue layer between the optical assembly and the high upper surface of the bounding body.

In some embodiments of the present invention, step V.2 includes the following steps:

V.2.1 inverting the optical assembly and the molded photosensitive assembly, so that the optical assembly is located below the molded photosensitive assembly; and V.2.2 applying the lens glue between a leg of the optical assembly and the low upper surface of the bounding body to form a glue filling layer.

In some embodiments of the present invention, the high upper surface of the bounding body is U-shaped to support the optical assembly on three sides; wherein the low upper surface of the bounding body is linear shaped, and the low upper surface extends from a high outer side surface of the bounding body to the other high outer side surface of the bounding body to support the optical assembly on one side.

In some embodiments of the present invention, the high upper surface of the bounding body is U-shaped to support the optical assembly on three sides; wherein the low upper surface of the bounding body is linear shaped, and the low upper surface extends from a high inner side surface of the bounding body to the other high inner side surface of the bounding body to support the optical assembly on one side.

In some embodiments of the present invention, the high upper surface of the bounding body is L-shaped to support the optical assembly on two adjacent sides; wherein the low upper surface of the bounding body is also L-shaped to support the optical assembly on two adjacent sides.

In some embodiments of the present invention, the fixed glue layer is U-shaped, and the glue filling layer is linear shaped.

In some embodiments of the present invention, the fixed glue layer is L-shaped, and the glue filling layer is L-shaped.

In some embodiments of the present invention, the optical assembly protrudes outward from the low upper surface of the bounding body relative to the molded photosensitive assembly.

In some embodiments of the present invention, an angle between the high inner side surface of the bounding body and the short upper surface of the short body is between 95° and 100°.

According to one aspect of the present invention, a camera module of the present invention that can achieve the foregoing objectives and other objectives and advantages includes:

an optical assembly;

a filter; and a molded photosensitive assembly, wherein the molded photosensitive assembly is mounted below the optical assembly and the filter; the molded photosensitive assembly includes a main body, some electronic devices, a photosensitive film and a circuit board; the circuit board is electrically connected to the electronic devices and the photosensitive film, the main body embeds the electronic devices and a part of the circuit board, the photosensitive film is fixed and surrounded by a bottom portion of the main body to keep a distance from the filter, and the main body includes a bounding body supporting the optical assembly thereon, and a short body; the short body extends from an inner side of the bounding body, at least some of the electronic devices are embedded by the short body, and the short body supports the filter thereon.

In an embodiment of the present invention, the electronic devices include at least one short device, wherein at least a part of the short device is embedded by the short body, and a height of each short device is less than 0.3 mm.

In an embodiment of the present invention, the photosensitive film is electrically connected to the circuit board through some wires, and the wires are embedded by the short body, wherein the wires and the short devices are arranged around the photosensitive film, and the wires and the short devices are respectively located on different sides of the photosensitive film.

In an embodiment of the present invention, a thickness of at least one side of the bounding body is smaller than a thickness of the short body, so that the optical assembly protrudes outward from the at least one side of the bounding body relative to the molded photosensitive assembly.

In an embodiment of the present invention, the electronic devices further include at least one high device, wherein the high devices are embedded by the bounding body, and a height of each high device is more than or equal to 0.3 mm.

In an embodiment of the present invention, the high devices and the wires are located on the same side of the photosensitive film.

In an embodiment of the present invention, the bounding body has a high upper surface and a low upper surface, wherein a height of the bounding body at the high upper surface is greater than a height of the bounding body at the low upper surface, a part of the optical assembly is supported on the high upper surface of the bounding body, and the other part of the optical assembly is supported on the low upper surface of the bounding body.

In an embodiment of the present invention, each high device among the electronic devices is embedded under the high upper surface of the bounding body, each short device among the electronic devices is embedded under a short upper surface of the short body, and the short devices are located on at least one side of the photosensitive film corresponding to the low upper surface of the bounding body.

In an embodiment of the present invention, the optical assembly protrudes outward from the low upper surface of the bounding body relative to the molded photosensitive assembly.

In an embodiment of the present invention, an angle between a high inner side surface of the bounding body and the short upper surface of the short body is more than or equal to 100°.

In an embodiment of the present invention, a height difference between the bounding body and the short body is more than or equal to 0.1 mm.

In an embodiment of the present invention, the filter includes a filter portion to transmit imaging light to the photosensitive film, and an edge portion supported on the short body of the molded photosensitive assembly.

In an embodiment of the present invention, the molded photosensitive assembly further includes an upper cover, wherein the upper cover is mounted on the high upper surface of the bounding body, and the upper cover extends inward to cover the edge portion of the filter.

In an embodiment of the present invention, a height of the upper cover is smaller than a thickness of the filter.

According to another aspect of the present invention, the present invention further provides a method for manufacturing a camera module, including the following steps:

I connecting a photosensitive film with some wires and some electronic devices to a circuit board;

II placing the connected circuit board between an upper die and a lower die; and III embedding the electronic devices in a main body and on the circuit board to form a molded photosensitive assembly, wherein the main body includes a bounding body and a short body whose height is lower than that of the bounding body, and at least some of the electronic devices are embedded by the short body.

In an embodiment of the present invention, the method for manufacturing the camera module further includes the following steps:

IV mounting a filter on a short upper surface of the short body; and

V mounting an optical assembly on the bounding body.

In an embodiment of the present invention, the electronic devices include at least one short device, wherein at least a part of the short device is embedded under the short upper surface of the short body, and a height of each short device is less than 0.3 mm.

In an embodiment of the present invention, the wires are embedded by the short body, wherein the wires and the short devices are arranged around the photosensitive film, and the wires and the short devices are respectively located on different sides of the photosensitive film.

In an embodiment of the present invention, a thickness of at least one side of the bounding body is smaller than a thickness of the short body, so that the optical assembly protrudes outward from the at least one side of the bounding body relative to the molded photosensitive assembly.

In an embodiment of the present invention, the electronic devices further include at least one high device, wherein the high devices are embedded by the bounding body, and a height of each high device is more than or equal to 0.3 mm.

In an embodiment of the present invention, the high devices and the wires are located on the same side of the photosensitive film.

In an embodiment of the present invention, an angle between a high inner side surface of the bounding body and the short upper surface of the short body is more than or equal to 100°.

Through the understanding of the following description and accompanying drawings, the further objectives and advantages of the present invention are fully embodied.

These and other objectives, features and advantages of the present invention are fully embodied by the following detailed description, drawings and claims.

BRIEF DESCRIPTION OF THE DRAWINGS

FIGS. 7A to 7D are respectively schematic flowcharts of a method for manufacturing the molded photosensitive assembly according to the first preferred embodiment of the present invention.

FIG. 8 is a schematic flowchart of a method for manufacturing the camera module according to the first preferred embodiment of the present invention.

FIG. 11 is a schematic flowchart of a method for manufacturing the molded photosensitive assembly according to the second preferred embodiment of the present invention.

DETAILED DESCRIPTION OF THE INVENTION

Figure 1:
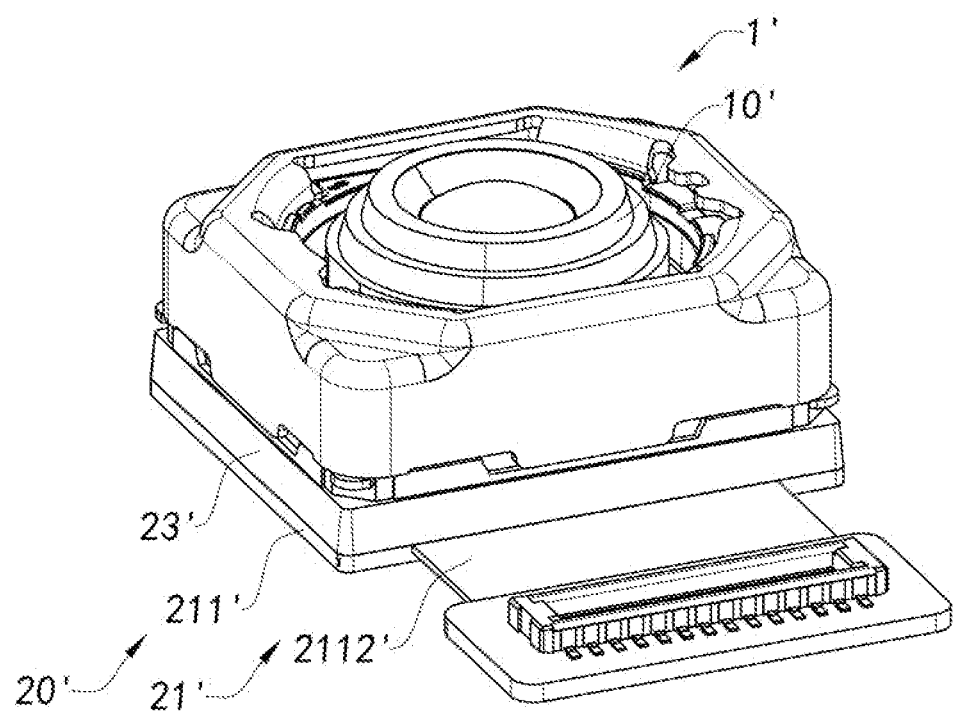
FIG. 1 is a three-dimensional schematic diagram of a camera module according to a first preferred embodiment of the present invention.

The following description is used to disclose the present invention, so that a person skilled in the art can implement the present invention. The preferred embodiments in the following description are only examples, and a person skilled in the art could conceive of other obvious variations. The basic principles of the present invention defined in the following description may be applied to other implementations, modifications, improvements, equivalents, and other technical solutions that do not depart from the spirit and scope of the present invention.

A person skilled in the art should understand that, in the disclosure of the present invention, the terms "longitudinal", "lateral", "upper", "lower", "front", "rear", "left", "right", "vertical", "horizontal", "top", "bottom", "inner", "outer", and the like indicate orientations or positional relationships based on the orientations or positional relationships shown in the drawings. The terms are only for description convenience of the present invention and simplification of the description, but do not show or imply that the indicated devices or elements must have specific orientations or be constructed and operated in specific orientations. Therefore, the terms should not be understood to limit the present invention.

In the present invention, the term "a" in the claims and specification should be understood as "one or more", that is, in one embodiment, the number of an element may be one, and in another embodiment, the number of the element may be multiple. Unless it is clearly stated in the disclosure of the present invention that the number of the element is only one, the term "a" cannot be understood as unique or singular, and the term "a" cannot be understood as a limitation on the number.

In the description of the present invention, it should be understood that "first", "second", and the like are only used for descriptive purposes, and cannot be understood as indicating or implying relative importance. In the description of the present invention, it should be noted that, unless otherwise specified and defined, "connected" should be understood in a broad sense, for example, it may be fixedly connected, detachably connected or integrally connected; it may be mechanically connected or electrically connected; or it may be directly connected or connected by a medium. A person of ordinary skill in the art could understand the specific meanings of the above terms in the present invention according to specific circumstances.

In the description of this specification, the terms "one embodiment", "some embodiments", "an example", "a specific embodiment", or "some examples" and the like mean that specific features, structures, materials or characteristics described in conjunction with the embodiments or examples are included in at least one embodiment or example of the present invention. In the description, the schematic descriptions of the above terms do not necessarily refer to the same embodiment or example. Moreover, the specific features, structures, materials or characteristics described can be combined appropriately in one or more embodiments or examples. In addition, different embodiments or examples described in this specification and features of different embodiments or examples can be combined by a person skilled in the art without conflicting with each other.

As electronic products, intelligent devices, and the like have increasingly developed toward the direction of lightness, thinness and miniaturization, more stringent requirements have been put forward for the size (especially the height) of a camera module as one of the standard configurations of electronic products and intelligent devices.

However, in the assembly mode of the prior art, a chip and electronic components are usually mounted to a circuit board first, then a molded base is formed on the circuit board through a molding process, a filter is mounted to a lens holder, and a lens is mounted to a filter assembly, so that the lens is held on a photosensitive path of the chip. However, this assembly mode of the prior art greatly limits the height of the camera module.

On one hand, although the traditional lens holder is replaced with the molded base to reduce the lateral size and height of the camera module, a molding die used in the molding process needs to avoid electronic components such as capacitors and resistors on the circuit board (especially the sizes of the capacitors are large, and the smallest capacitor is 0.38 mm high), and certain safety distances have to be reserved between the molding die and various electronic components, so the height of the molded base is at least more than 0.4 mm; and on the other hand, the filter is usually combined with a support element to form a filter assembly, then the filter assembly is mounted to the molded base, the support element is usually manufactured by an injection molding process, which requires that the thickness of the part of the support element for supporting the filter is basically more than 0.15 mm, and the thickness of the filter itself is usually 0.21 mm or more, so the thickness of the filter assembly is at least more than 0.36 mm.

Based on the above, the distance between the lens and the circuit board is equal to the sum of the height of the molded base and the thickness of the filter assembly (at least more than 0.76 mm), which is limited by all the above factors. The distance between the lens of the camera module in the prior art and the circuit board cannot be further reduced, that is, the height of the camera module in the prior art cannot be further reduced, which cannot meet the requirements of the market for lightness, thinness and miniaturization of the camera module. Therefore, in order to solve the above problems, the present invention provides a camera module and a molded photosensitive assembly and manufacturing methods thereof, and an electronic device.

Referring to FIGS. 1 to 8 of the accompanying drawings of the specification of the present invention, a camera module and a molded photosensitive assembly and manufacturing methods thereof according to a first preferred embodiment of the present invention are illustrated. The camera module 1' includes at least one optical lens 10' and a molded photosensitive assembly 20', wherein the molded photosensitive assembly 20' includes an imaging assembly 21', a filter assembly 22' and a molded base 23'. The molded base 23' embeds a part of the imaging assembly 21' after being molded, and has at least one stepped peripheral groove 230'. The filter assembly 22' includes at least one filter element 221', and each filter element 221' is correspondingly arranged in each stepped peripheral groove 230' of the molded base 23', so that each filter element 221' of the filter assembly 22' respectively corresponds to a photosensitive path of the imaging assembly 21'. Each optical lens 10' is respectively arranged on the photosensitive path of the imaging assembly 21' to form the camera module 1'.

It is worth mentioning that, although the camera module includes only one optical lens 10' as an example in FIGS. 1 to 8 and the following description to illustrate the features and advantages of the camera module of the present invention, a person skilled in the art could understand that the camera module disclosed in FIGS. 1 to 8 and the following description is only an example, which does not constitute a limitation to the content and scope of the present invention. For example, in other examples of the camera module, the number of the optical lens 10' may also exceed one to form an array camera module.

Figure 2:
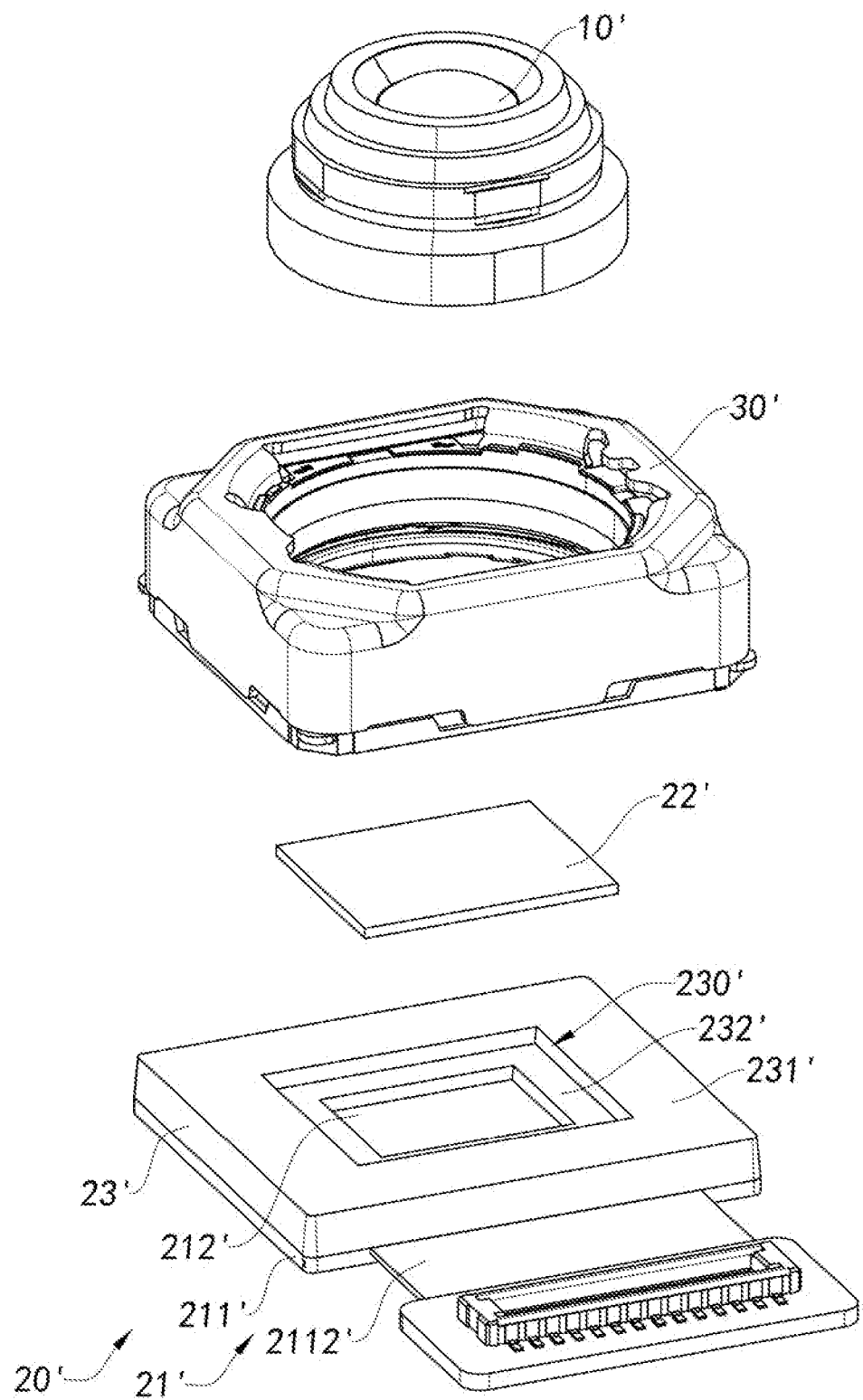
FIG. 2 is an exploded schematic diagram of the camera module according to the first preferred embodiment of the present invention.

As shown in FIG. 2, the imaging assembly 21' of the molded photosensitive assembly 20' includes a circuit board 211' and at least one photosensitive element 212', and each photosensitive element 212' is respectively mounted to a different position of the circuit board 211'.

Figure 3:
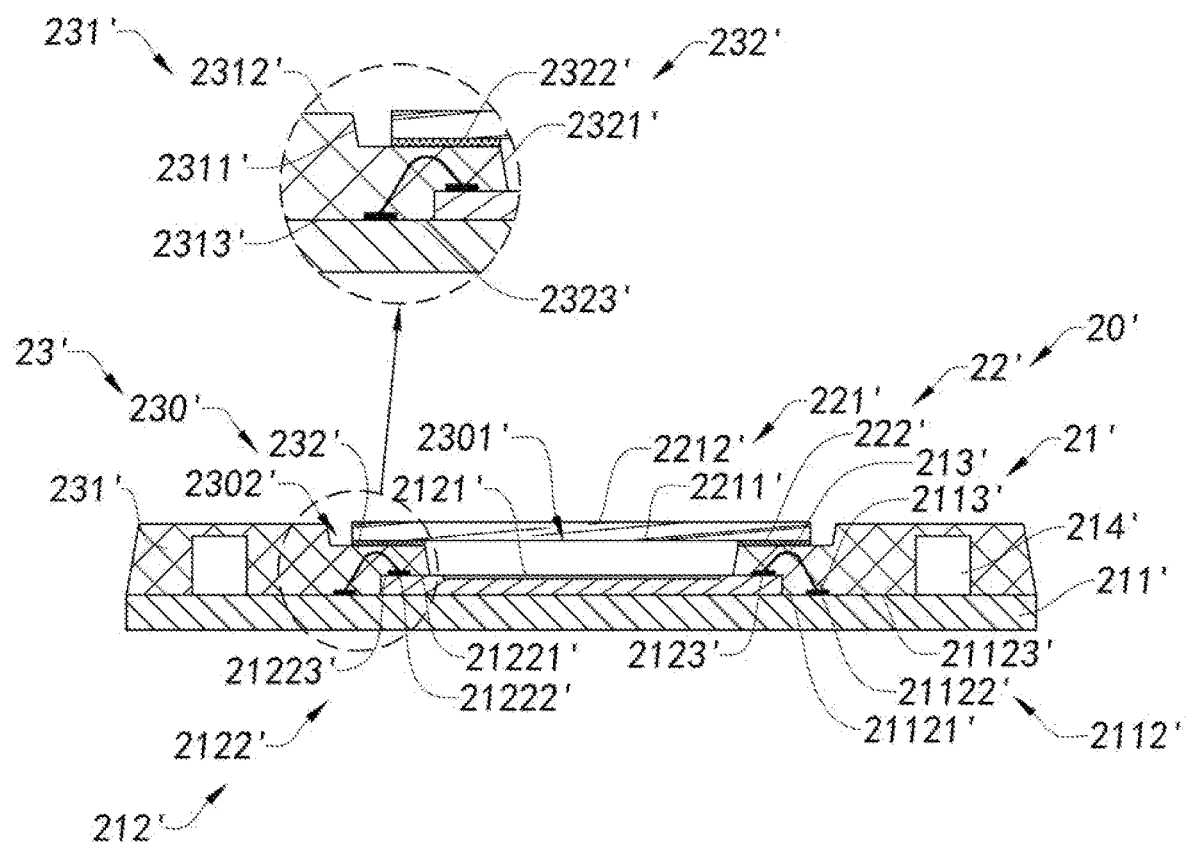
FIG. 3 is a schematic cross-sectional view of a molded photosensitive assembly of the camera module according to the first preferred embodiment of the present invention.

Further, as shown in FIG. 3, the circuit board 211' includes at least one flat chip mounting region 2111' and an edge region 2112', wherein each chip mounting region 2111' and the edge region 2112' are integrally formed, and the edge region 2112' is located around the chip mounting region 2111'. Each photosensitive element 212' is respectively mounted to each chip mounting region 2111' of the circuit board 211' to ensure the flatness of each photosensitive element 212' mounted to each chip mounting region 2111'. For example, in the specific example shown in FIG. 3, the circuit board 211' may include one chip mounting region 2111' and one edge region 2112', wherein the chip mounting region 2111' is located at a middle part of the circuit board 211', and the edge region 2112' is located at an outer part of the circuit board 211'.

Generally, as shown in FIG. 3, the circuit board 211' further includes at least one group of circuit board connectors 2113', wherein each circuit board connector 2113' is respectively arranged in the edge region 2112' of the circuit board 211'.

As shown in FIG. 3, the photosensitive element 212' includes a photosensitive region 2121', a non-photosensitive region 2122', and at least one group of chip connectors 2123'. The photosensitive region 2121' and the non-photosensitive region 2122' are integrally formed, and the non-photosensitive region 2122' is located around the photosensitive region 2121', that is, the photosensitive region 2121' is located at a middle part of the photosensitive element 212', the non-photosensitive region 2122' is located at an outer part of the photosensitive element 212', and the non-photosensitive element 2122' is arranged around the photosensitive region 2121'. Each chip connector 2123' is respectively arranged in the non-photosensitive region 2122' of the photosensitive element 212'.

As shown in FIG. 3, the imaging assembly 21' further includes at least one group of leads 213', wherein each lead has a circuit board connecting end and a chip connecting end, each lead 213' respectively extends between the chip connecting end and the circuit board connecting end in a curved manner, the chip connecting end of each lead 213' is respectively connected to each chip connector of the photosensitive element 212', the circuit board connecting end of each lead 213' is respectively connected to each circuit board connector of the circuit board 211', and correspondingly, the photosensitive element 212' and the circuit board 211' are conducted.

It is worth mentioning that the type of the leads 213' may not be limited. For example, the leads 213' may be gold wires, that is, after the photosensitive element 212' is mounted to the chip mounting region 2111' of the circuit board 211', the gold wires 213' can conduct the photosensitive element 212' and the circuit board 211' by means of a wire bonding process. Nevertheless, in other examples, the leads 213' may also be other types of leads, such as silver wires and copper wires, to ensure that the leads 213' can conduct the photosensitive element 212' and the circuit board 211'.

It is worth noting that, in an example of the camera module of the present invention, each circuit board connector 2113' of the circuit board 211' and each chip connector 2123' of the photosensitive element 212' may be respectively connecting plates, that is, each circuit board connector 2113' of the circuit board 211' and each chip connector 2123' of the photosensitive element 212' may be respectively in a shape of a plate, so that the circuit board connecting end and the chip connecting end of the lead 213' are respectively connected to the circuit board connector 2113' of the circuit board 211' and the chip connector 2123' of the photosensitive element 212'. In another example of the camera module of the present invention, the circuit board connector 2113' of the circuit board 211' and the chip connector 2123' of the photosensitive element 212' may be respectively spherical. For example, solder paste or other soldering material is spotted on the edge region 2112' of the circuit board 211' and the non-photosensitive region 2122' of the photosensitive element 212' to respectively form the circuit board connector 2113' of the circuit board 211' and the chip connector 2123' of the photosensitive element 212'. Nevertheless, a person skilled in the art could understand that the types of the circuit board connector 2113' of the circuit board 211' and the chip connector 2123' of the photosensitive element 212' do not limit the type and scope of the camera module of the present invention, that is, in other examples of the camera module, the circuit board connector 2113' of the circuit board 211' and the chip connector 2123' of the photosensitive element 212' may also be in other shapes which are not mentioned above.

In addition, as shown in FIG. 3, the imaging assembly 21' further includes a group of electronic components 214', and the electronic components 214' can be mounted at intervals to the edge region 2112' of the circuit board 211' by a process such as SMT (Surface Mount Technology). It is worth mentioning that the photosensitive element 212' and each electronic component 214' may be respectively located on the same side or opposite sides of the circuit board 211'. For example, in a specific example shown in FIG. 3, the photosensitive element 212' and each electronic component 214' may be located on the same side of the circuit board 211', the photosensitive element 212' is mounted to the chip mounting region 2111' of the circuit board 211', and the electronic components 214' are respectively mounted at intervals to the edge region 2112' of the circuit board 211'. It should be understood that, in the camera module of the present invention, the type of the electronic components 214' may not be limited. For example, the electronic components 214' may be implemented as resistors, capacitors, driving devices, and the like.

According to the first preferred embodiment of the present invention, as shown in FIG. 3, each stepped peripheral groove 230' of the molded base 23' of the molded photosensitive assembly 20' respectively defines a light window 2301', and each filter element 221' arranged in each stepped peripheral groove 230' respectively corresponds to each light window, wherein the photosensitive region 2121' of each photosensitive element 212' respectively corresponds to each light window 2301', so that each light window 2301' provides a light path for each optical lens 10' and each photosensitive element 212', and each filter element 221' is correspondingly located in the light path. For example, in the specific example shown in FIG. 3, the filter assembly 22' includes one filter element 221', and the molded base 23' has one stepped peripheral groove 230' to define the light window 2301', wherein the filter element 221' is located between the optical lens 10' and the photosensitive element 212', and the filter element 221', the optical lens 10' and the photosensitive element 212' all correspond to the light window 2301', which provides the light path for the filter element 221', the optical lens 10' and the photosensitive element 212', so that a light entering the camera module 1' from the optical lens 10' can be received by the photosensitive region 2121' of the photosensitive element 212' and subjected to photoelectric conversion after being filtered by the filter element 221'.

A person skilled in the art could understand that, in different examples of the camera module, the filter element 221' can be implemented in different types. For example, the filter element 221' can be implemented as an infrared cut-off filter, a full transmission spectrum filter and other filters or a combination of a plurality of filters. For example, the filter element 221' can be implemented as a combination of an infrared cut-off filter and a full transmission spectrum filter, that is, the infrared cut-off filter and the full transmission spectrum filter can be switched to be selectively located on the photosensitive path of the photosensitive assembly 21'. For example, when the camera module is used in an environment with sufficient light such as daytime, the infrared cut-off filter can be switched to the photosensitive path of the photosensitive element 212', so that the infrared cut-off filter filters infrared in a light reflected by an object to enter the camera module. When the camera module is used in a dark environment such as night, the full transmission spectrum filter can be switched to the photosensitive path of the photosensitive element 212' to transmit the infrared in the light reflected by an object to enter the camera module.

It is worth noting that, the filter element 221' of the filter assembly 22' is arranged in the stepped peripheral groove 230' of the molded base 23', so in the camera module 1' provided by the present invention, a distance between the optical lens 10' and the circuit board 211' is no longer limited by a thickness of the filter assembly 22' itself, that is, the distance between the optical lens 10' and the circuit board 211' can be reduced to be smaller than a sum of the thickness of the filter assembly 22' and a height of the molded base 23', thereby reducing a height of the camera module 1'.

Specifically, as shown in FIGS. 2 and 3, the molded base 23' includes a first base portion 231' and a second base portion 232', wherein the second base portion 232' integrally extends inward from a first inner circumferential surface 2311' of the first base portion 231' along the circuit board 211', and a height of the first base portion 231' is greater than a height of the second base portion 232', so that the first base portion 231' and the second base portion 232' form the stepped peripheral groove 230', and the first inner circumferential surface 2311' of the first base portion 231' and a second inner circumferential surface 2321' of the second base portion 232' form the light window 2301'. In other words, the first base portion 231' is located around the second base portion 232', wherein a first bottom surface 2313' of the first base portion 231' and a second bottom surface 2323' of the second base portion 232' are attached to the circuit board 211', and a first top surface 2312' of the first base portion 231' is higher than a second top surface 2322 of the second base portion 232' to form the stepped peripheral groove 230' on an inner circumferential edge of the molded base 23'.

Therefore, in the first preferred embodiment according to the present invention, as shown in FIG. 3, the first top surface 2312' of the first base portion 231' of the molded base 23' is defined as a first mounting surface of the molded base 23' for mounting the optical lens 10'; and the second top surface 2322' of the second base portion 232' of the molded base 23' is defined as a second mounting surface of the molded base 23' for mounting the filter element 221'. Since the second mounting surface is lower than the first mounting surface, a mounting height of the filter element 221' is reduced, a back focus length of the optical lens 10' of the camera module 1' is also reduced, and an overall height of the camera module 1' is reduced to meet the requirements of the market for lightness, thinness and miniaturization development of the camera module. It should be understood that, compared with the camera module in the prior art, not only a support element in the filter assembly is omitted, but also the filter is directly mounted on the second mounting surface of the molded base 23', and the lens is directly mounted on the first mounting surface of the molded base 23', which not only reduces the mounting height of the filter, but also reduces the distance between the lens and the circuit board to reduce the overall height of the camera module.

Preferably, the first top surface 2312' of the first base portion 231' and a photosensitive surface of the photosensitive element 212' are parallel to each other, which facilitates subsequent active calibration of the optical lens 10' mounted on the first top surface 2312' and the photosensitive element 212'.

In addition, as shown in FIG. 3, the second top surface 2322' of the second base portion 232' and the first top surface 2312' of the first base portion 231' are parallel to each other, that is, the second top surface 2322' of the second base portion 232' is also parallel to the photosensitive surface of the photosensitive element 212', so that the filter element 221' mounted on the second top surface 2322' is kept parallel to the photosensitive element 212'.

According to the first preferred embodiment of the present invention, as shown in FIGS. 2 and 3, after the molded base 23' is formed by a molding process, the molded base 23' embeds at least a part of the edge region 2112 of the circuit board 211', each electronic component 214', each lead 213', and at least a part of the non-photosensitive region 2122' of the photosensitive element 212', to combine the circuit board 211', the photosensitive element 212', the leads 213', and the electronic components 214' of the imaging assembly 21' into a whole, so that the imaging assembly 21' and the molded base 23' form an integrated structure.

Exemplarily, as shown in FIG. 3, the first base portion 231' of the molded base 23' embeds at least a part of the edge region 2112' of the circuit board 211' and each electronic component 214', so that the first base portion 231' of the molded base 23' isolates the adjacent electronic components 214'. Correspondingly, the second base portion 232' of the molded base 23' embeds at least a part of the edge region 2112' of the circuit board 211', each lead 213' and at least a part of the non-photosensitive region 2122' of the photosensitive element 212', so that the second base portion 232' of the molded base 23' isolates the adjacent leads 213'.

Specifically, as shown in FIG. 3, the non-photosensitive region 2122' of the photosensitive element 212' has a chip inner portion 21221', a chip connecting portion 21222' and a chip outer portion 21223', wherein the chip inner portion 21221' is located around the photosensitive region 2121', the chip connecting portion 21222' extends inward and outward respectively to be connected to the chip inner portion 21221' and the chip outer portion 21223', and each chip connector 2123' is arranged at the chip connecting portion 21222'. In other words, in the present invention, a region of the photosensitive element 212' that is used to arrange the chip connectors 2123' is defined as the chip connecting portion 21222', a region of the photosensitive element 212' from the chip connecting portion 21222' to the photosensitive region 2121' is defined as the chip inner portion 21221', and a region of the photosensitive element 212' from the chip connecting portion 21222' to an outer edge of the photosensitive element 212' is defined as the chip outer portion 21223'. In other words, when the photosensitive element 212' is looked from a top view, the photosensitive region 2121', the chip inner portion 21221', the chip connecting portion 21222', and the chip outer portion 21223' are sequentially from inside to outside.

Similarly, as shown in FIG. 3, the edge region 2112' of the circuit board 211' has a circuit board inner portion 21121', a circuit board connecting portion 21122' and a circuit board outer portion 21123', wherein the circuit board inner portion 21121' is located around the chip mounting region 2111', the circuit board connecting portion 21122' extends inward and outward respectively to be connected to the circuit board inner portion 21121' and the circuit board outer portion 21123', and the circuit board connector 2113' is arranged at the circuit board connecting portion 21122'. In other words, in the present invention, a region of the circuit board 211' that is used to arrange the circuit board connector 2113' is defined as the circuit board connecting portion 21122', a region of the circuit board 211' from the circuit board connecting portion 21122' to the chip mounting region 2111' is defined as the circuit board inner portion 21121', and a region of the circuit board 211' from the circuit board connecting portion 21122' to an outer edge of the circuit board 211' is defined as the circuit board outer portion 21123'. In other words, when the circuit board 211' is looked from a top view, the chip mounting region 2111', the circuit board inner portion 21121', the circuit board connecting portion 21122', and the circuit board outer portion 21123' are sequentially from inside to outside.

In this way, as shown in FIG. 3, the first base portion 231' of the molded base 23' is configured to embed the circuit board outer portion 21123' of the edge region 2112' of the circuit board 211', and the second base portion 232' of the molded base 23' is configured to embed the circuit board connecting portion 21122' and the circuit board inner portion 21121' of the edge region 2112' of the circuit board 211', as well as the chip outer portion 21223' and the chip connecting portion 21222' of the non-photosensitive region 2122' of the photosensitive element 212', so that each electronic component 214' is embedded by the first base portion 231' of the molded base 23', and each lead 213' is embedded by the second base portion 232' of the molded base 23'. It is worth mentioning that, in the present invention, a height of the first base portion 231' of the molded base 23' is limited by a height of each electronic component 214', and a height of the second base portion 232' of the molded base 23' is limited by an arc height of each lead 213'.

During the process of forming the molded base 23' through the molding process, in order to avoid any contact between the molding die used and each electronic component 214' and each lead 213', a certain safety gap should be reserved between the molding die used and each electronic component 214' and each lead 213'. Therefore, the height of the first base portion 231' has to be greater than a height of the highest electronic component among the electronic components 214', and the height of the second base portion 232' has to be greater than the arc height of the highest lead among the leads 213'. In addition, capacitors in the electronic components 214' are relatively high (the smallest capacitor currently is 0.38 mm), and heights of the capacitors are also greater than the arc heights of the leads 213', so the height of the second base portion 232' may be smaller than the height of the first base portion 231', which can reduce the height of the filter element 221' mounted on the second top surface 2322' of the second base portion 232'.

Preferably, as shown in FIG. 3, the height of the second base portion 232' is smaller than the height of the electronic component 214', that is, the second top surface 2322' of the second base portion 232' is lower than a top surface of the electronic component 214', so that a lower surface 2211' of the filter element 221' is lower than the top surface of the electronic component 214'. Of course, since different electronic components 214' have different heights, in some other embodiments of the present invention, the height of the second base portion 232' only needs to be smaller than the height of the highest electronic component among the electronic components 214', that is, the second top surface 2322' of the second base portion 232' only needs to be lower than the top surface of the highest electronic component 214'.

It should be understood that a height difference between the first base portion 231' and the second base portion 232' may be designed according to a height difference between the electronic component 214' and the lead 213', while the thickness of the filter element 221' is designed according to the filter performance and the manufacturing process, so that an upper surface 2212' of the filter element 221' may be higher than the first top surface 2312' of the first base portion 231', or may be lower than the first top surface 2312' of the first base portion 231', or may be in a same height with the first top surface 2312' of the first base portion 231'. Of course, in the first preferred embodiment of the present invention, since the thickness of the filter element 221' is greater than the height difference between the first base portion 231' and the second base portion 232', when the lower surface 2211' of the filter element 221' is mounted to the second top surface 2322' of the second base portion 232', the upper surface 2212' of the filter element 221' is higher than the first top surface 2321' of the first base portion 231'.

Figure 4A:
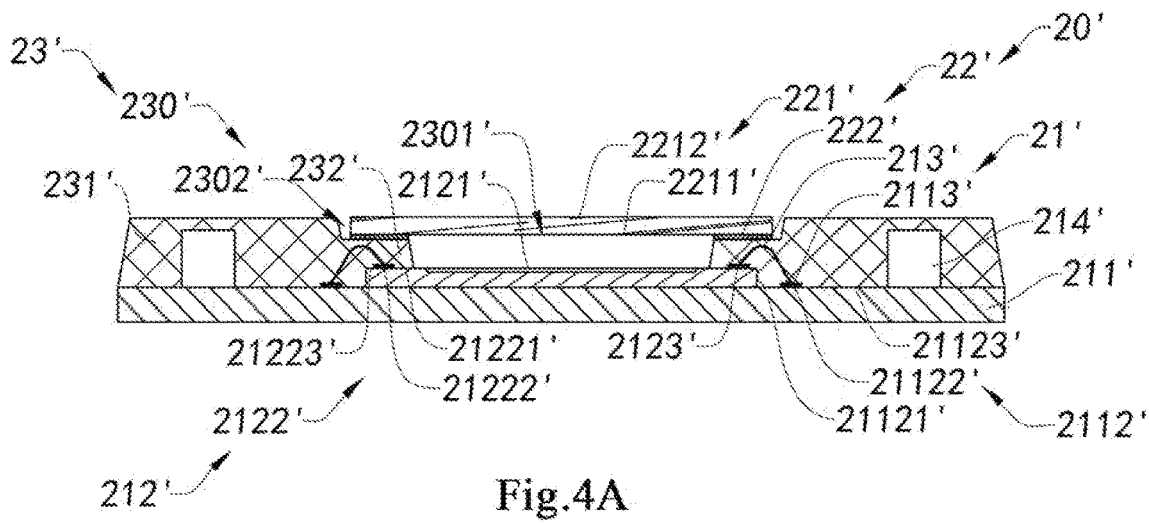
FIG. 4A shows a first modified implementation mode of the molded photosensitive assembly according to the first preferred embodiment of the present invention.

FIG. 4A shows a first modified implementation mode of the molded photosensitive assembly 20' according to the first preferred embodiment of the present invention, wherein the first base portion 231' of the molded base 23' is configured to embed the circuit board outer portion 21123' and the circuit board connecting portion 21122' of the edge region 2112' of the circuit board 211', and the second base portion 232' of the molded base 23' is configured to embed the circuit board inner portion 21121' of the edge region 2112' of the circuit board 211', as well as the chip outer portion 21223', the chip connecting portion 21222' and a part of the chip inner portion 21221' of the non-photosensitive region 2122' of the photosensitive element 212', so that each electronic component 214' is embedded by the first base portion 231' of the molded base 23', each lead 213' is jointly embedded by the first base portion 231' and the second base portion 232' of the molded base 23', and the first and second base portions 231' and 232' of the molded base 23' jointly isolate the adjacent leads 213'.

In this way, since a distance between the second base portion 232' of the molded base 23' and the electronic component 214' is increased, when the electronic component 232' is close to the lead 213', the electronic component 232' does not affect an assembly process of the second base portion 232' of the molded base 23', in other words, when the molded base 23' is molded, the electronic component 214' does not interfere with a part for molding the second base portion 232' in the molding die to ensure a normal progress of the molding process.

Figure 4B:
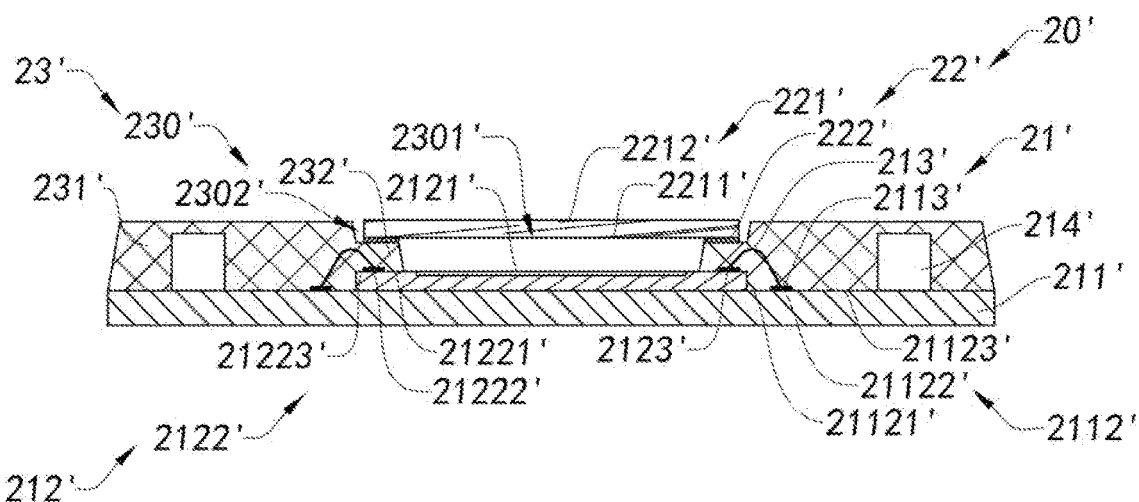
FIG. 4B shows a second modified implementation mode of the molded photosensitive assembly according to the first preferred embodiment of the present invention.

FIG. 4B shows a second modified implementation mode of the molded photosensitive assembly 20' according to the first preferred embodiment of the present invention, wherein the first base portion 231' of the molded base 23' is configured to embed the circuit board outer portion 21123', the circuit board connecting portion 21122' and the circuit board inner portion 21121' of the edge region 2112' of the circuit board 211', and the second base portion 232' of the molded base 23' is configured to embed the chip outer portion 21223', the chip connecting portion 21222' and a part of the chip inner portion 21221' of the non-photosensitive region 2122' of the photosensitive element 212', so that each electronic component 214' is embedded by the first base portion 231' of the molded base 23', each lead 213' is jointly embedded by the first base portion 231' and the second base portion 232' of the molded base 23', and the first and second base portions 231' and 232' of the molded base 23' jointly isolate the adjacent leads 213'. In other words, the first base portion 231' of the molded base 23' embeds the edge region 2112' of the circuit board 211', and the second base portion 232' of the molded base 23' embeds a part of the non-photosensitive region 2122' of the photosensitive element 212', which facilitates an installation position of the electronic component 214' to be closer to the circuit board connector 2113' of the circuit board 211', so as to reduce an overall size of the circuit board 211'.

Figure 4C:
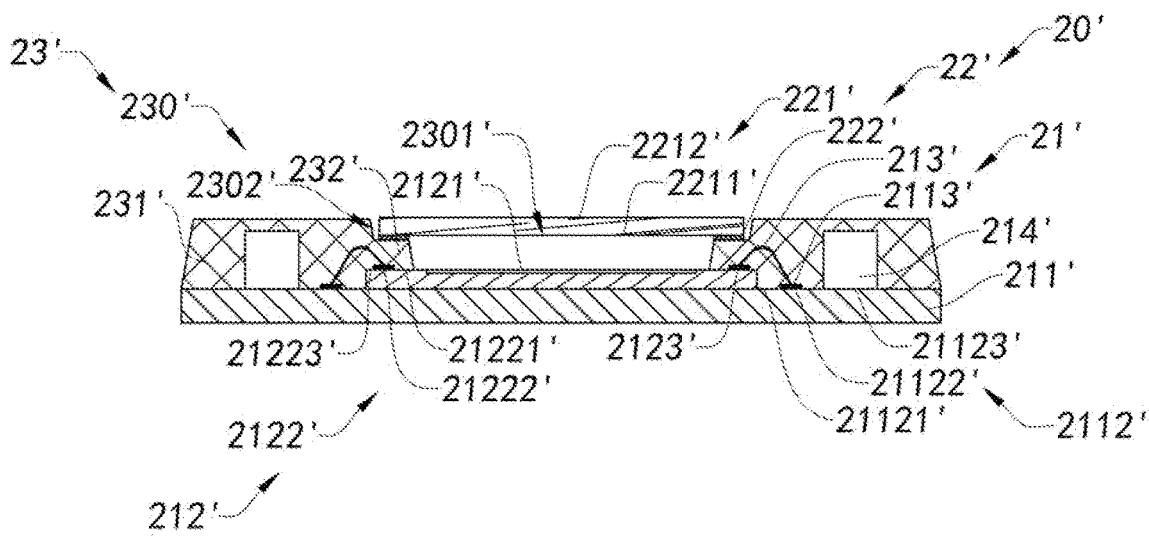
FIG. 4C shows a third modified implementation mode of the molded photosensitive assembly according to the first preferred embodiment of the present invention.

FIG. 4C shows a third modified implementation mode of the molded photosensitive assembly 20' according to the first preferred embodiment of the present invention, wherein the first base portion 231' of the molded base 23' is configured to embed the edge region 2112' of the circuit board 211' and the chip outer portion 21223' of the non-photosensitive region 2122' of the photosensitive element 212', and the second base portion 232' of the molded base 23' is configured to embed the chip connecting portion 21222' and a part of the chip inner portion 21221' of the non-photosensitive region 2122' of the photosensitive element 212', so that each electronic component 214' is embedded by the first base portion 231' of the molded base 23', each lead 213' is jointly embedded by the first base portion 231' and the second base portion 232' of the molded base 23', and the adjacent leads 213' are jointly isolated by the first base portion 231' and second base portion 232' of the molded base 23'.

In other words, the first base portion 231' of the molded base 23' not only embeds the edge region 2112' of the circuit board 211', but also embeds a part of the non-photosensitive region 2122' of the photosensitive element 212', so that the first base portion 231' enhances the connection strength between the photosensitive element 212' and the circuit board 211'. At the same time, since the second base portion 232' of the molded base 23' only embeds a part of the non-photosensitive region 2122' of the photosensitive element 212', a lateral size of the stepped peripheral groove 230' of the molded base 23' is smaller than a lateral size of the photosensitive element 212'. Therefore, a lateral size of the filter element 221' arranged in the stepped peripheral groove 230' is also smaller than the lateral size of the photosensitive element 212', but greater than a lateral size of the photosensitive region 2121' of the photosensitive element 212'. In this way, it can not only ensure that the filter element 221' completes the corresponding filtering effect, but also can reduce a size of the filter element 221' as much as possible, because the larger filter element 221' is more easily broken and is higher in cost.

Referring to FIGS. 1 to 5B, the camera module 1' further includes at least one driver 30', wherein each optical lens 10' is respectively assembled to each driver 30', and each driver 30' is respectively assembled to the first top surface 2312' of the first base portion 231' of the molded base 23', so that each optical lens 10' is respectively held on the photosensitive path of each photosensitive element 212' of the molded photosensitive assembly 20'. In addition, when the camera module is used, the driver 30' can drive the optical lens 10' to move back and forth along the photosensitive path of the photosensitive element 212' to adjust a focal length of the camera module by means of adjusting the distance between the optical lens 10' and the photosensitive element 212'. The type of the driver 30' of the camera module 1' of the present invention is not limited. The driver 30' may be implemented as a voice coil motor, which can be electrically connected to the circuit board 211' to be in a working state after receiving electric energy and a control signal, so as to drive the optical lens 10' to move back and forth along the photosensitive path of the photosensitive element 212'. Nevertheless, a person skilled in the art could understand that the type of the driver 30' is not limited, as long as it can drive the optical lens 10' to move back and forth along the photosensitive path of the photosensitive element 212'.

Figure 5A:
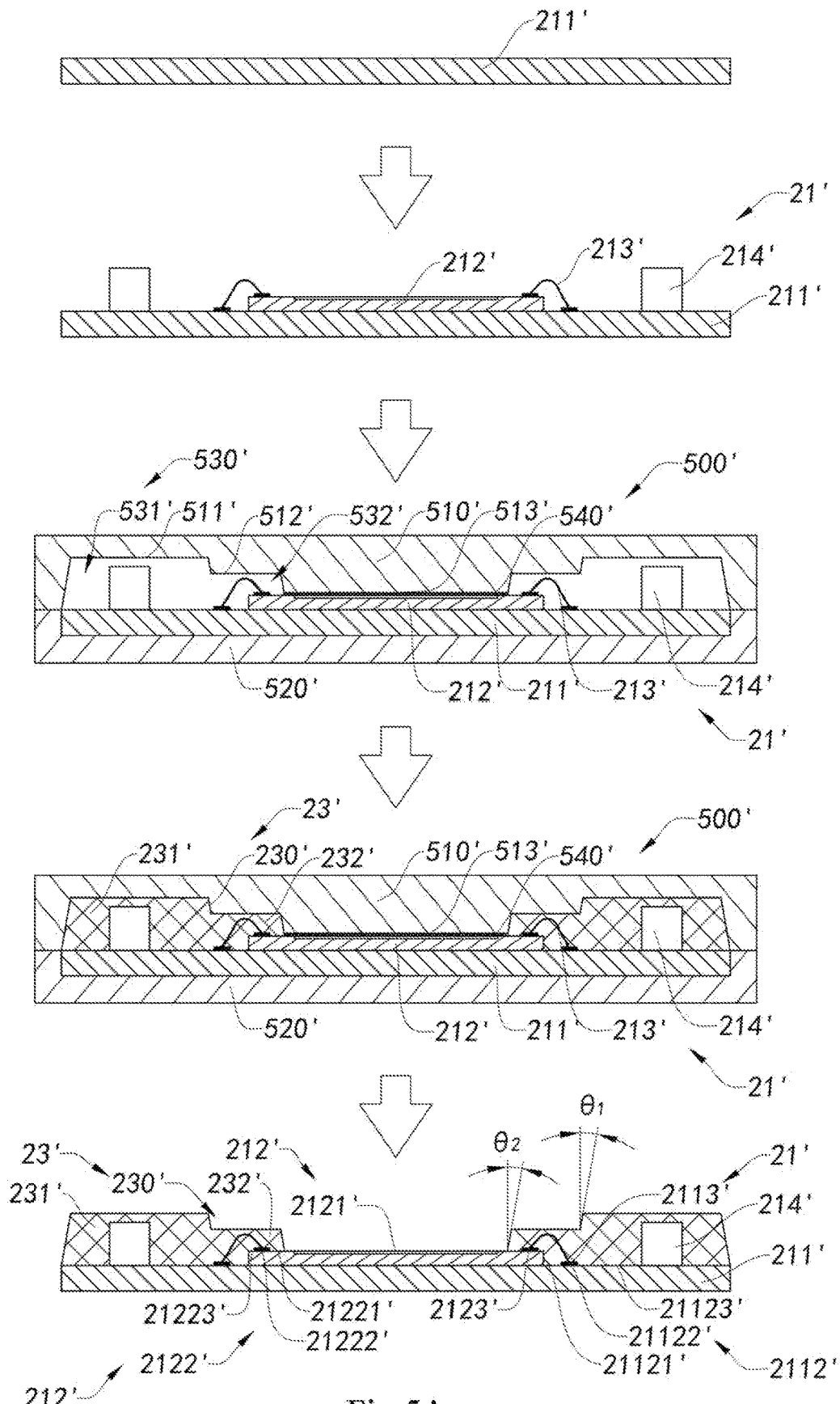
FIGS. 5A and 5B are schematic cross-sectional views of a manufacturing process of the camera module according to the first preferred embodiment of the present invention.
Figure 5B:
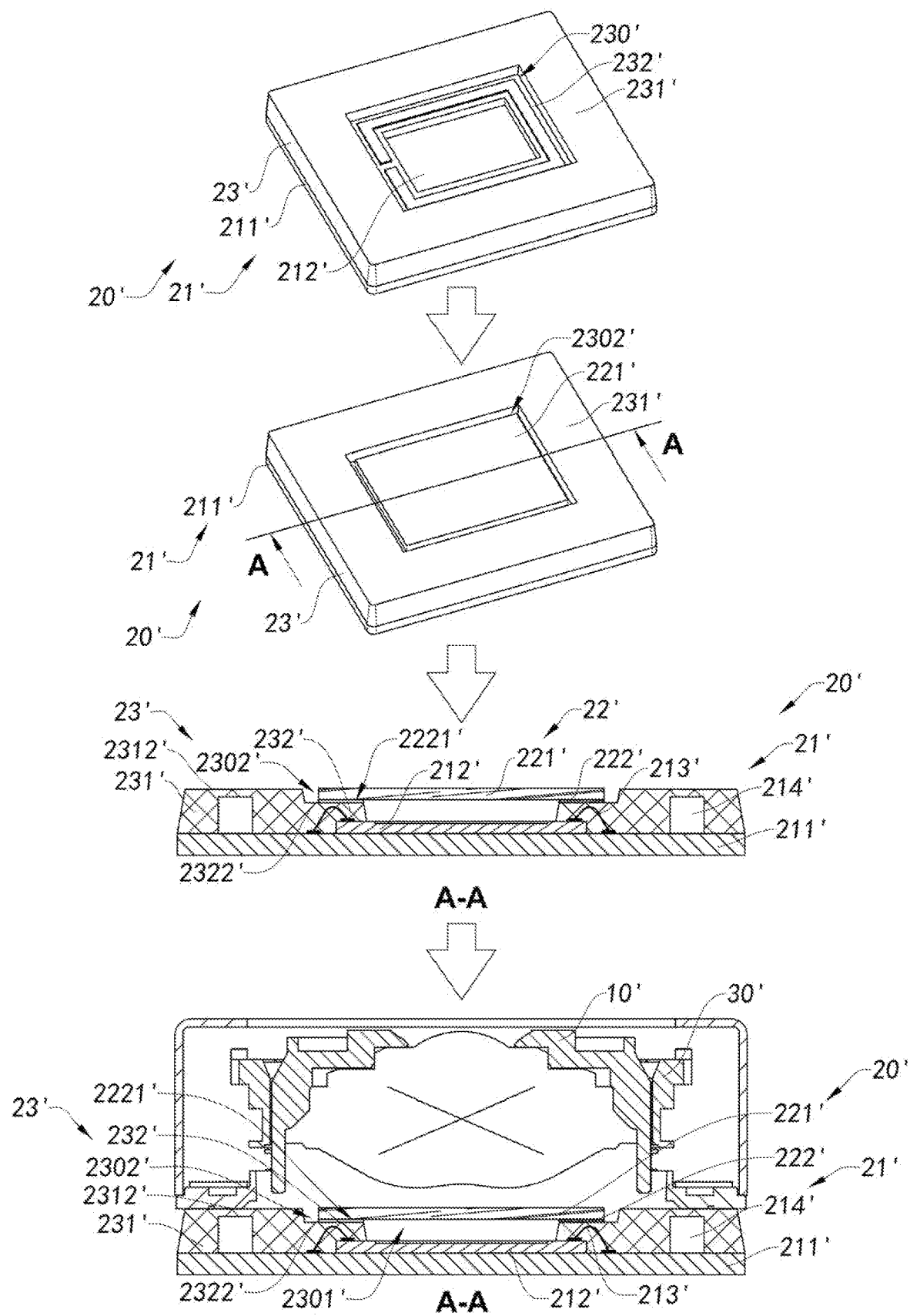

Referring to FIGS. 5A and 5B, a manufacturing process of the camera module 1' according to the first preferred embodiment of the present invention is shown. A person skilled in the art should understand that the manufacturing process of the molded photosensitive assembly 20' and the manufacturing process of the camera module 1' shown in FIGS. 5A and 5B are only examples to illustrate the features and advantages of the present invention, and do not constitute limitations to the content and scope of the present invention.

Specifically, in FIG. 5A, the photosensitive element 212' is mounted to the chip mounting region 2111' of the circuit board 211', so that the chip connecting end of each lead 213' is connected to each chip connector 2123' of the photosensitive element 212', and the circuit board connecting end of each lead 213' is connected to each circuit board connector 2113' of the circuit board 211'. The electronic components 214' are respectively mounted at intervals to the circuit board outer portion 21123' of the edge region 2112' of the circuit board 211' to assemble the imaging assembly 21'.

In FIG. 5A, the imaging assembly 21' is put into a molding die 500', the molding process is performed by means of the molding die 500' to form the molded base 23' with the stepped peripheral groove 230', and the molded base 23' embeds the edge region 2112' of the circuit board 211' and a part of the non-photosensitive region 2122' of the photosensitive element 212'. A person skilled in the art should understand that, in other embodiments of the present invention, a plurality of imaging assemblies 21' can be simultaneously put into a molding die, and the molding process is performed on the plurality of imaging assemblies 21' by means of the molding die to form a plurality of molded bases 23' with the stepped peripheral grooves 230'.

Specifically, the molding die 500' includes an upper die 510' and a lower die 520', wherein at least one of the upper and lower dies 510' and 520' can be moved, so that the upper die 510' and the lower die 520' can be clamped and drafted; and when the molding die 500' is in a clamped state, a molding space 530' is formed between the upper die 510' and the lower die 520', wherein the molded base 23' is formed by adding a molding material into the molding space 530' and curing the same.

More specifically, the upper die 510' has a first inner surface 511', a second inner surface 512', and a pressing surface 513', wherein the second inner surface 512' is located around the first inner surface 511', and the second inner surface 512' is located between the first inner surface 511' and the pressing surface 513', wherein the second inner surface 512' is lower than the first inner surface 511', and the pressing surface 513' is lower than the second inner surface 512'.

In FIG. 5A, after the imaging assembly 21' is placed in the upper die 510' and/or the lower die 520', the upper die 510' and the lower die 520' are operated to clamp the molding die, so that the imaging assembly 21' is located in the molding space 530' formed between the upper die 510' and the lower die 520'. At this time, the first inner surface 511' of the upper die 510' corresponds to the circuit board outer portion 21123' of the edge region 2112' of the circuit board 211' so as to define a first molding space 531' between the first inner surface 511' and the circuit board 211', and the molding material is added to the first molding space 531' and cured to form the first base portion 231'; the second inner surface 512 of the upper die 510' corresponds to the circuit board connecting portion 21122' and the circuit board inner portion 21121' of the edge region 2112' of the circuit board 211', as well as the chip outer portion 21223' and the chip inner portion 21221' of the non-photosensitive element 2122' of the photosensitive element 212' so as to define a second molding space 532' between the second inner surface 512' and the circuit board 211', and the molding material is added to the second molding space 532' and cured to form the second base portion 232'; the pressing surface 513' of the upper die 510' presses the photosensitive element 212'; the photosensitive element 212' is located in the chip mounting region 2111' of the circuit board 211', and the chip mounting region 2111' is located at the middle part of the circuit board 211', so the circuit board 211' can be flattened by means of the pressing surface 513', which ensures the overall flatness of the circuit board 211', and also provides a flat molding base surface for the molding process.

It is worth noting that the first molding space 531' is communicated with the second molding space 532' to form the molding space 530' with an integrated structure, so that the molding material can flow into the second molding space 532' from the first molding space 531' to form the molded base 23' with an integrated structure after the molding material is cured. It should be understood that, when the molding material is cured in the molding space 530' to form the molded base 23', the first inner surface 511' of the upper die 510' corresponds to the first top surface 2312' of the first base portion 231' of the molded base 23', and the second inner surface 512' of the upper die 510' corresponds to the second top surface 2322' of the second base portion 232' of the molded base 23'. The first inner surface 511' of the upper die 510' is higher than the second inner surface 512' of the upper die 520', so that the height of the first base portion 231' is greater than the height of the second base portion 232', and the stepped peripheral groove 230' is formed on the inner circumferential edge of the molded base 23'.

It is worth mentioning that the first inner surface 511' and the second inner surface 512' of the upper die 510' are both parallel to the pressing surface 513' of the upper die 510'. When the pressing surface 513' presses the photosensitive element 212' in an overlapping manner, the first inner surface 511' and the second inner surface 512' are both parallel to the photosensitive element 212', and after the molded base 23' is formed, the first top surface 2312' and the second top surface 2322' are both parallel to the photosensitive element 212', which facilitates active calibration in the subsequent assembly process.

Further, as shown in FIG. 5A, the molding die 500' further includes a cover film 540', wherein the cover film 540' is overlapped on the pressing surface 513' of the upper die 510'. When the pressing surface 513' of the upper die 510' presses the photosensitive element 212', the cover film 540' is located between the pressing surface 513' of the upper die 510' and the photosensitive element 212' to prevent the pressing surface 513' of the upper die 510' from scratching the photosensitive element 212' or contaminating the photosensitive element 212'. In addition, the cover film 540' can also prevent the generation of a gap between the pressing surface 513' of the upper die 510' and the photosensitive element 212', so as to prevent, during the molding process, the molding material from entering between the pressing surface 513' of the upper die 510' and the photosensitive element 212' to contaminate the photosensitive region 2121' of the photosensitive element 212'. Of course, the cover film 540' can also absorb the impact force generated at the moment of contact between the pressing surface 513' of the upper die 510' and the photosensitive element 212' when the upper die 510' and the lower die 520' are clamped, thereby avoiding the damage of the photosensitive element 212' by the clamping of the upper die 510' and the lower die 520'.

In other embodiments of the present invention, the cover film 540' of the molding die 500' has an annular structure, wherein the cover film 540' is arranged on a peripheral edge of the pressing surface 513 of the upper die 510', and after the upper and lower dies 510' and 520' are clamped, the cover film 540' correspondingly presses the chip inner portion 21221' of the non-photosensitive region 2122' of the photosensitive element 212', to prevent the cover film 540' and the pressing surface 513' from directly contacting the photosensitive region 2121' of the photosensitive element 212', so that the photosensitive region 2121' of the photosensitive element 212' is not damaged by external pressure.

As shown in FIG. 5B, after the molding material is cured in the molding space 530' to form the molded base 23', a semi-finished molded photosensitive assembly is formed, wherein the semi-finished molded photosensitive assembly includes the imaging assembly 21' and the molded base 23'. Next, the upper die 510' and the lower die 520' are operated for being drafted to open the molding space 530' of the molding die 500' for taking out the semi-finished molded photosensitive assembly from the molding space 530'. Then, the filter element 221' is mounted to the second top surface 2322' of the second base portion 232' of the molded base 23' to form the molded photosensitive assembly 20'.

Generally, for better drafting operation, the inner circumferential surface of the molded base 23' has a certain inclination angle relative to the photosensitive surface of the photosensitive element 212'. In other words, as shown in FIGS. 3 and 5A, the first inner circumferential surface 2311' of the first base portion 231' has a first predetermined inclination angle θ1 relative to the photosensitive surface of the photosensitive element 212', the second inner circumferential surface 2321' of the second base portion 232' also has a second predetermined inclination angle θ2 relative to the photosensitive surface of the photosensitive element 212', a width of the first top surface 2312' of the first base portion 231' is smaller than a width of the first bottom surface 2313' of the first base portion 231', and a width of the second top surface 2322' of the second base portion 232' is smaller than a width of the second bottom surface 2323' of the second base portion 232'.

However, in order that the filter element 221' has a wider attachment surface, that is, the second base portion 232' has the wider second top surface 2322', the first and second predetermined inclination angles $\theta_1$ and $\theta_2$ are as small as possible, and even the first and second predetermined inclination angles $\theta_1$ and $\theta_2$ may be zero (that is, the first inner circumferential surface 2311' and the second inner circumferential surface 2321' may be perpendicular to the photosensitive surface of the photosensitive element 212').

Preferably, the first and second predetermined inclination angles $\theta_1$ and $\theta_2$ are less than 30° to increase an attachment area between the filter element 221' and the second top surface 2322' of the second base portion 232', to improve the reliability of adhesion between the filter element 221' and the second base portion 232', and to prevent the filter element 221' from shifting or falling off.

According to the first preferred embodiment of the present invention, as shown in FIG. 5B, the filter assembly 22' further includes a glue layer 222', wherein the glue layer 222' is arranged between the second top surface 2322' of the second base portion 232' and the filter element 221' to bond the filter element 221' with the second base portion 232' together, so that the filter element 221' is fixedly mounted to the stepped peripheral groove 230' of the molded base 23', and the filter element 221' corresponds to the light window 2301' of the molded base 23'.

Specifically, in the implementation mode of mounting the filter element 221' as shown in FIG. 5B, a glue is first applied to the second top surface 2322' of the second base portion 232', then the filter element 221' is correspondingly arranged on the second top surface 2322' of the second base portion 232' to form the glue layer 222' between the second top surface 2322' of the second base portion 232' and the lower surface 2211' of the filter element 221' after the glue is cured, and the glue layer 222' fixedly connects the filter element 221' and the second base portion 232' of the molded base 23'.

In another implementation mode of mounting the filter element 221' in the present invention, the glue may also be first applied to the lower surface 2211' of the filter element 221', then the filter element 221' is correspondingly arranged on the second top surface 2322' of the second base portion 232' to form the glue layer 222' between the second top surface 2322' of the second base portion 232' and the lower surface 2211' of the filter element 221' after the glue is cured, and the glue layer 222' fixedly connects the filter element 221' and the second base portion 232' of the molded base 23'.

It is worth mentioning that the glue used to form the glue layer 222' may be thermosetting glue or other types of glue. Preferably, the glue layer 222' may have good elasticity to prevent the filter element 221' from being damaged when the camera module 1' undergoes collision. More preferably, the glue forming the glue layer 222' has low fluidity to prevent the glue from flowing down from the second inner circumferential surface 2321' of the second base portion 232', so as to ensure the yield of the camera module. The reason for selecting the glue with low fluidity is that, on one hand, the reflectivity of the cured glue is greater than that of the molded base 23', and once the glue flows to the second inner circumferential surface 2321', stray light may be brought to the camera module; and on the other hand, if the glue flows to the photosensitive region 2121' of the photosensitive element 212', the photosensitive region 2121' of the photosensitive element 212' will be contaminated.

In addition, as shown in FIG. 5B, a mounting gap 2302' is reserved between the filter element 221' and the first inner circumferential surface 2311' of the first base portion 231', that is, a lateral size of the stepped peripheral groove 230' of the molded base 23' is greater than a lateral size of the filter element 221', which facilitates the attachment of the filter element 221' to the second top surface 2322' of the second base portion 232'. In this way, because the peripheral edge of the filter element 221' does not directly contact the first base portion 231', and the mounting gap 2302' is reserved for safety, the transmission of received stress to the filter element 221' by the first base portion 231' of the molded base 23' can be effectively avoided to prevent damaging the filter element 221'. Of course, the lateral size of the filter element 221' is smaller than the lateral size of the stepped peripheral groove 230' of the molded base 23', which is also advantageous for mounting the filter element 221' to the stepped peripheral groove 230'.

Preferably, as shown in FIG. 5B, the glue layer 222' has at least one air escape hole 2221', wherein the air escape hole 2221' extends from an inner side of the glue layer 222' to an outer side of the glue layer 222', an inner space of the glue layer 222' is communicated with the mounting gap 2302' by the air escape hole 2221', and an inner space of the molded photosensitive assembly 20' is then communicated with an outer space of the molded photosensitive assembly 20', so that when the filter element 221' is mounted to the stepped peripheral groove 230' of the molded base 23', air between the filter element 221' and the photosensitive element 212' is allowed to escape to the outside through the air escape hole 2221' to prevent the mounting of the filter element 221' from being affected.

In other words, the glue is applied to the second top surface 2322' of the second base portion 232' in a discontinuous manner to form the glue layer 222' with the air escape hole 2221' after the glue is cured. That is to say, a circle of the glue cannot be applied to the second top surface 2322' of the second base portion 232', but the glue is applied discontinuously to reserve at least one gap, so that the air escape hole 2221' is formed on the glue layer 222' after the glue is cured.

In FIGS. 3 and 5B, the optical lens 10' is assembled to the driver 30', and the driver 30' is assembled to the first top surface 2312' of the first base portion 231 of the molded base 23', so that the optical lens 10' is held on the photosensitive path of the photosensitive element 212' to form the camera module 1'.

Figure 6A:
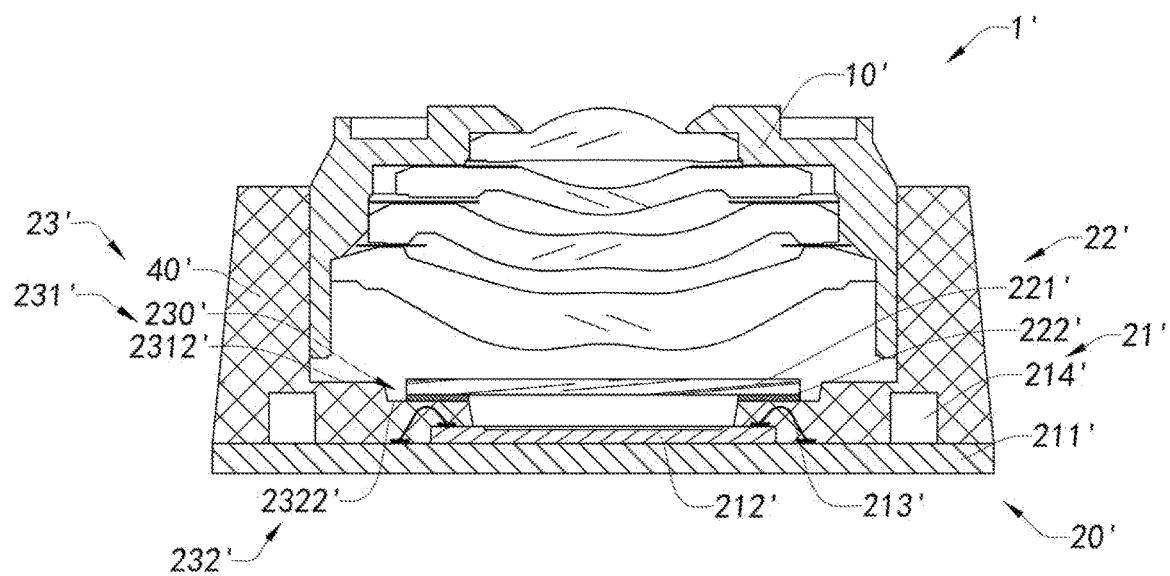
FIG. 6A shows a first modified implementation mode of the camera module according to the first preferred embodiment of the present invention.

FIG. 6A shows a first modified implementation mode of the camera module 1'. The camera module 1' is implemented as a fixed-focus camera module, that is, the driver 30' may be omitted in this implementation mode of the camera module of the present invention. Specifically, the camera module 1' includes at least one lens barrel 40', wherein the lens barrel 40' integrally extends to the first top surface 2312' of the first base portion 231' of the molded base 23', and each optical lens 10' is respectively assembled to each lens barrel 40', so that each optical lens 10' is held on the photosensitive path of each photosensitive element 212' of the molded photosensitive assembly 20' by means of each lens barrel 40'. That is to say, in this implementation mode of the camera module of the present invention, the lens barrel 40' and the molded base 23' may be integrally molded by curing the molding material through the molding process, thereby enhancing the stability and reliability of the camera module.

Figure 6B:
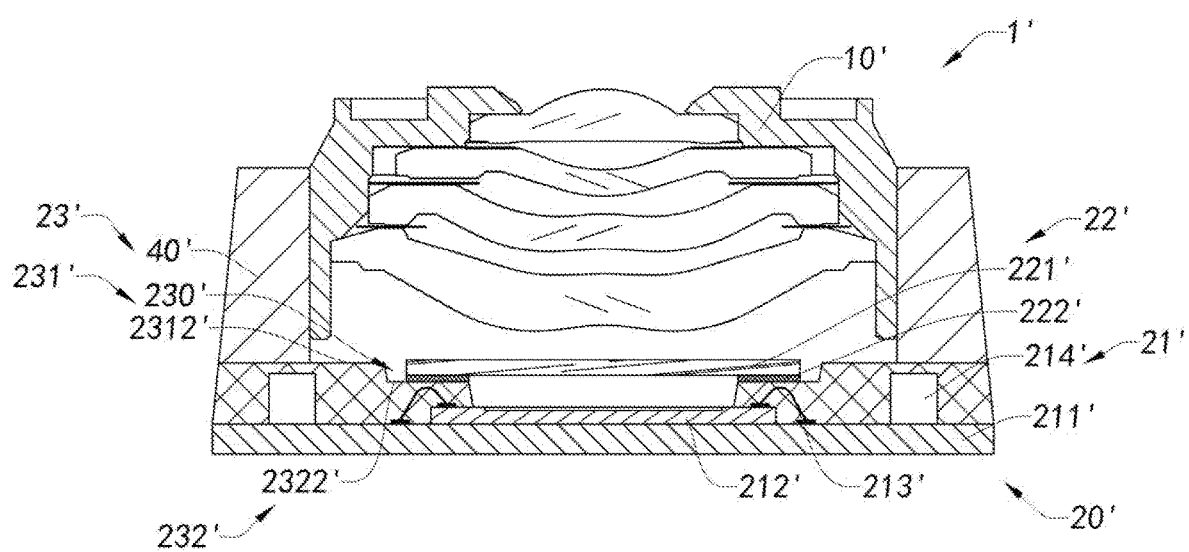
FIG. 6B shows a second modified implementation mode of the camera module according to the first preferred embodiment of the present invention.

FIG. 6B shows a second modified implementation mode of the camera module 1'. After the molded base 23' is formed by curing the molding material through the molding process, the lens barrel 40' manufactured separately is assembled to the first top surface 2312' of the first base portion 231' of the molded base 23', and the optical lens 10' is assembled to the lens barrel 40', so that the optical lens 10' is held on the photosensitive path of the photosensitive element 212' of the molded photosensitive assembly 20' by means of the lens barrel 40'. In addition, when the lens barrel 40' is assembled to the first top surface 2312' of the first base portion 231' of the molded base 23', an angle of the lens barrel 40' assembled to the first top surface 2312' of the first base portion 231' of the molded base 23' may be adjusted by means of a calibrator, so that an optical axis of the optical lens 10' can be perpendicular to the photosensitive surface of the photosensitive element 212' to ensure the imaging quality of the camera module 1'. It can be understood that the lens barrel 40' may be manufactured separately, so that the lens barrel 40' may be provided with screw threads or not. The present invention is not limited in this respect.

Figure 6C:
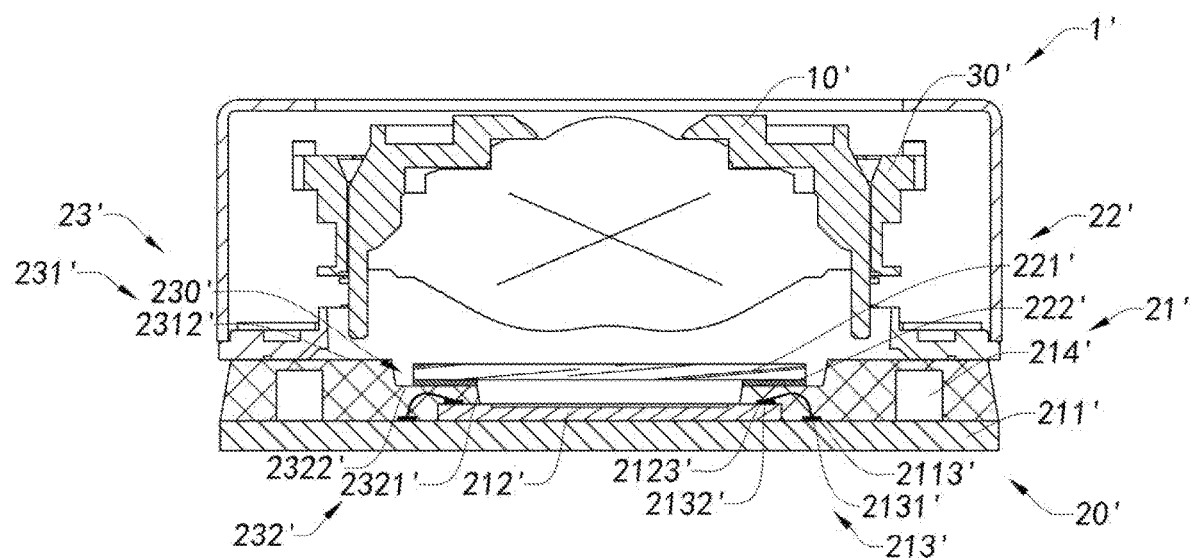
FIG. 6C shows a third modified implementation mode of the camera module according to the first preferred embodiment of the present invention.

FIG. 6C shows a third modified implementation mode of the camera module 1'. During the process of mounting the photosensitive element 212', the lead 213' is connected to the circuit board 211' and the photosensitive element 212' by a "reverse bonding" process. In this way, a height of upward protrusion of the lead 213' may not exceed a height of upward protrusion of the chip connector 2123' of the photosensitive element 212', that is, the arc height of the lead 213' is reduced in order to reduce the height of the second base portion 232' of the molded base 23', which can increase the height difference between the first top surface 2311' of the first base portion 231' and the second top surface 2321' of the second base portion 232', so that the upper surface 2212' of the filter element 221' is in a same height with the first top surface 2312' of the first base portion 231', and even the upper surface 2212' of the filter element 221' is lower than the first top surface 2312' of the first base portion 231' to prevent the optical lens 10' from colliding with the filter element 221' during movement.

It is worth mentioning that the "reverse bonding" process involved in the present invention refers to wire bonding of the lead 213' from the circuit board 211' to the photosensitive element 212' during the process of conducting the photosensitive element 212' and the circuit board 211' by the lead 213'. Specifically, the circuit board connector 2113' is arranged on the circuit board 211', a top end of the circuit board connector 2113' is first bonded by a wire bonding tools to form the circuit board connecting end of the lead 213' connected to the circuit board connector 2113', then a preset position is raised and translated toward the circuit board connector 2113', and the chip connecting end of the lead 213' connected to the chip connector 2123' is formed at a top end of the chip connector 2123', so that the lead 213' extends in a curved shape. In this way, the height of upward protrusion of the lead 213' can be substantially flush with the height of the chip connector 2123', and even the height of upward protrusion of the lead 213' can be lower than the height of the chip connector 2123'.

Figure 6D:
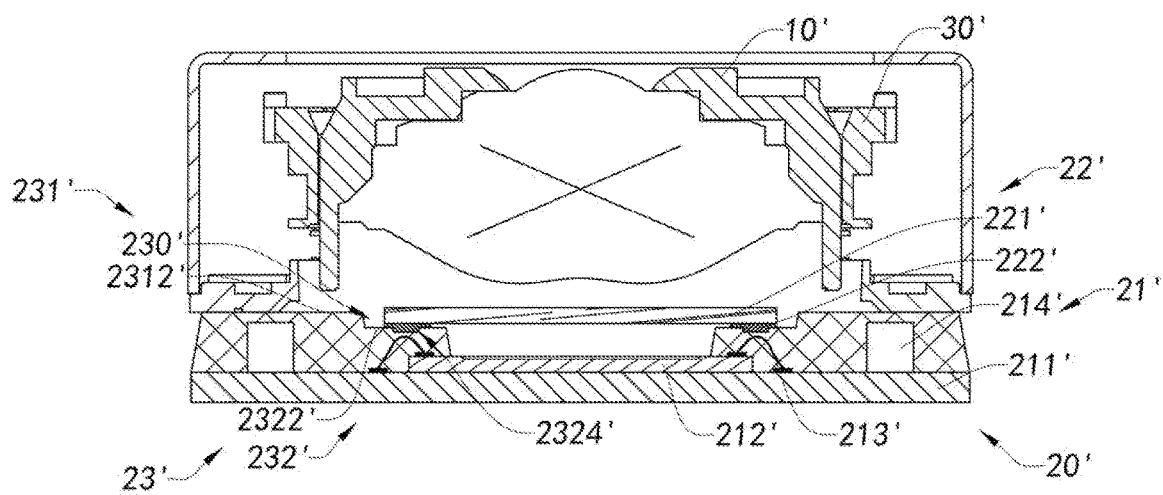
FIG. 6D shows a fourth modified implementation mode of the camera module according to the first preferred embodiment of the present invention.

FIG. 6D shows a fourth modified implementation mode of the camera module 1'. The second base portion 232' of the molded base 23' is further provided with a glue recess 2324', and the glue recess 2324' is formed by recessing downward from the second top surface 2322' of the second base portion 232'. The glue can be applied to the glue recess 2324' of the second base portion 232', the glue protrudes from the second top surface 2322' of the second base portion 232', and after the filter element 221' is correspondingly arranged on the imaging assembly 21', the glue layer 222' formed by curing the glue can be overlapped on the lower surface 2211' of the filter element 221', thereby ensuring that the filter element 221' is stably arranged in the stepped peripheral groove 230' of the molded base 23', and preventing the glue from flowing to the second inner circumferential surface 2321' of the second base portion 232' of the molded base 23'.

Figure 6E:
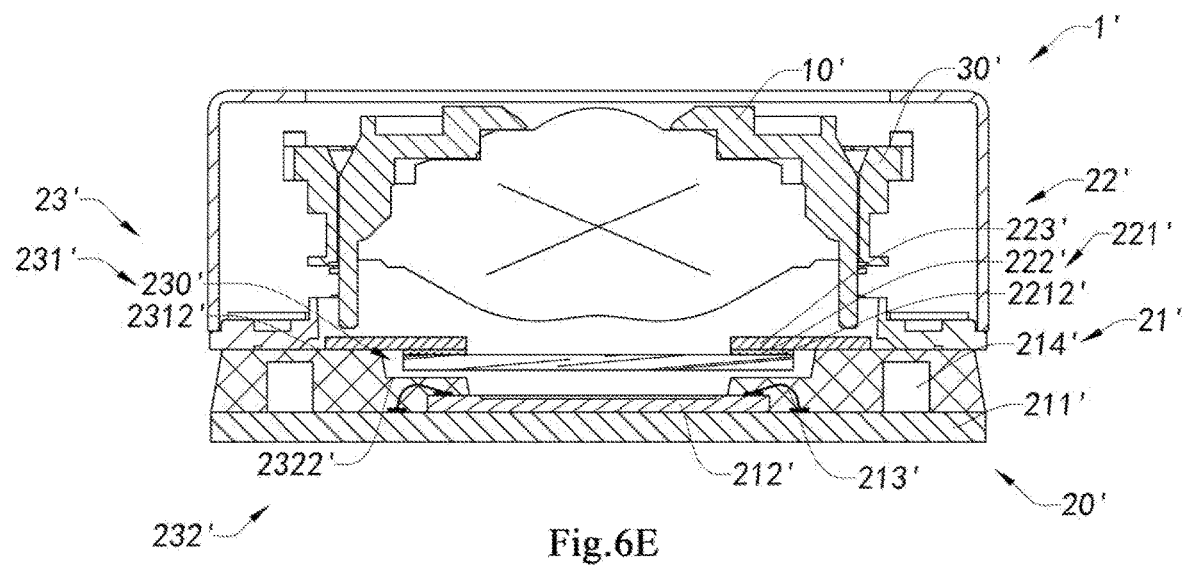
FIG. 6E shows a fifth modified implementation mode of the camera module according to the first preferred embodiment of the present invention.

FIG. 6E shows a fifth modified implementation mode of the camera module 1'. The filter assembly 22' further includes at least one annular support element 223', the filter element 221' is assembled to the support element 223', and the support element 223' is arranged on the first base portion 231' of the molded base 23', so that the filter element 221' is correspondingly arranged in the stepped peripheral groove 230' of the molded base 23' by means of the support element 223'.

Specifically, the upper surface 2212 of the filter element 221' is fixedly attached to a lower side of the support element 223' through the glue layer 222', so that when the support element 223' is mounted to the first top surface 2312' of the first base portion 231' of the molded base 23', the upper surface 2212' of the filter element 221' is located below the first top surface 2312'. By this attachment mode, an attachment width or an attachment area between the filter element 221' and the support element 223' can be increased, to strengthen the bonding strength between the filter element 221' and the support element 223', so as to prevent the filter element 221' from being damaged due to impact. In addition, the driver 30' of the camera module 1' is also attached to the first top surface 2312' of the first base portion 231' of the molded base 23', and the support element 223' is located inside the driver 30', which will not increase the overall height of the camera mold 1'.

It is worth mentioning that the support element 223' may be made of materials with certain toughness, such as plastics and metals. Since the support element 223' is made of a material with higher toughness than the material of the molded base 23', the filter element 221' is unlikely to separate from the molded base 23' to reduce the risk of rupture of the filter element 221'.

Figure 6F:
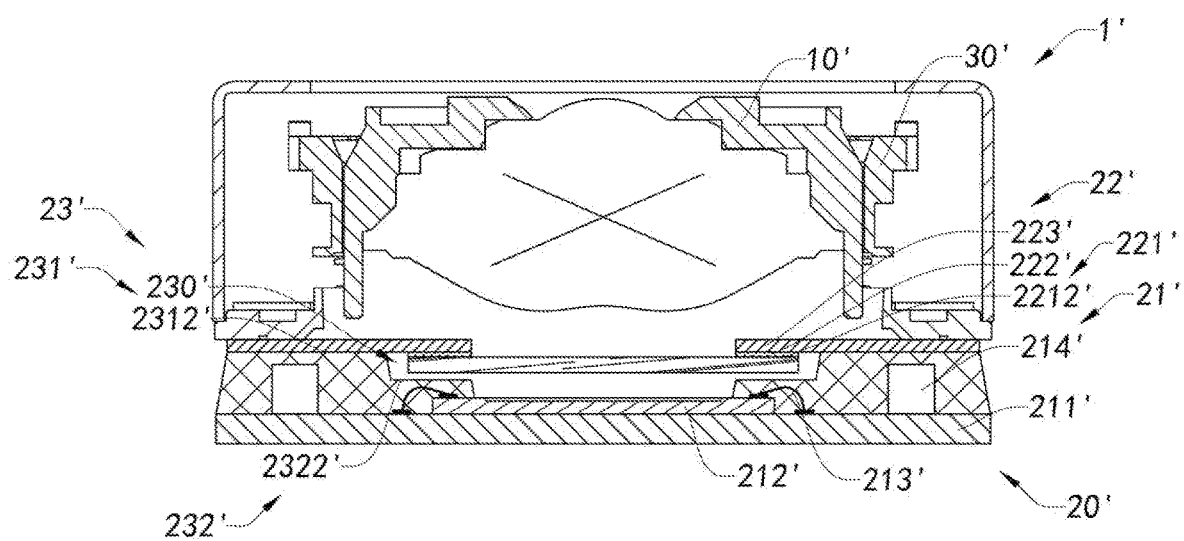
FIG. 6F shows a sixth modified implementation mode of the camera module according to the first preferred embodiment of the present invention.

FIG. 6F shows a sixth modified implementation mode of the camera module 1'. The support element 223' of the filter assembly 22' is arranged between the driver 30' and the first top surface 2312' of the first base portion 231', that is, the support element 223' is mounted to the first top surface 2312' of the first base portion 231', and the driver 30' is mounted to the support element 223', so that the filter element 221' is correspondingly arranged in the stepped peripheral groove 230' of the molded base 23' by means of the support element 223'.

It should be understood that, in this modified implementation mode, the height of the camera module 1' is increased by a thickness of the support element 223', but the thickness of the support element 223' is smaller than the thickness of the filter element 221', so compared with the camera module in the prior art, the height of the camera module 1' in this modified implementation mode of the present invention is still reduced. In addition, since a contact area between the support element 223' and the molded base 23' is greatly increased, the filter element 221' can be more firmly mounted on the molded base 23' through the support element 223' to prevent the filter element 221' from being damaged due to collision.

Figure 6G:
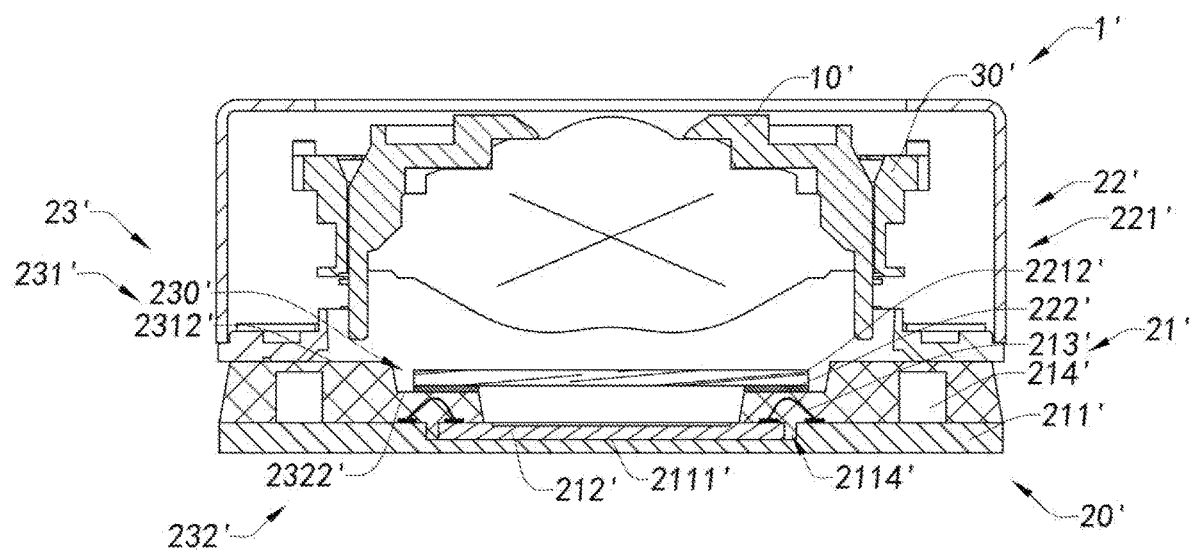
FIG. 6G shows a seventh modified implementation mode of the camera module according to the first preferred embodiment of the present invention.

FIG. 6G shows a seventh modified implementation mode of the camera module 1'. The chip mounting region 2111' of the circuit board 211' of the imaging assembly 21' of the molded photosensitive assembly 20' sinks to form a chip mounting recess 2114' in the chip mounting region 2111' of the circuit board 211'. The photosensitive element 212' is correspondingly arranged in the chip mounting recess 2114' of the circuit board 211' to reduce the height of the photosensitive surface of the photosensitive element 212', so that the height of the second base portion 232' of the molded base 23' is further reduced, the upper surface 2212' of the filter element 221' can be in a same height with the first top surface 2312' of the first base portion 231', and even the upper surface 2212' of the filter element 221' is lower than the first top surface 2312' of the first base portion 231' to prevent the optical lens 10' from colliding with the filter element 221' during movement.

In other words, the chip mounting recess 2114' of the circuit board 211' is sunken downward from an upper side of the circuit board 211' to form a recess in the chip mounting region 2111' of the circuit board 211'. The photosensitive element 212' is mounted to the recess to reduce the height of the photosensitive surface of the photosensitive element 212', thereby further reducing the arc height of the lead 213', which helps to reduce the height of the second base portion 232' of the molded base 23'.

Figure 6H:
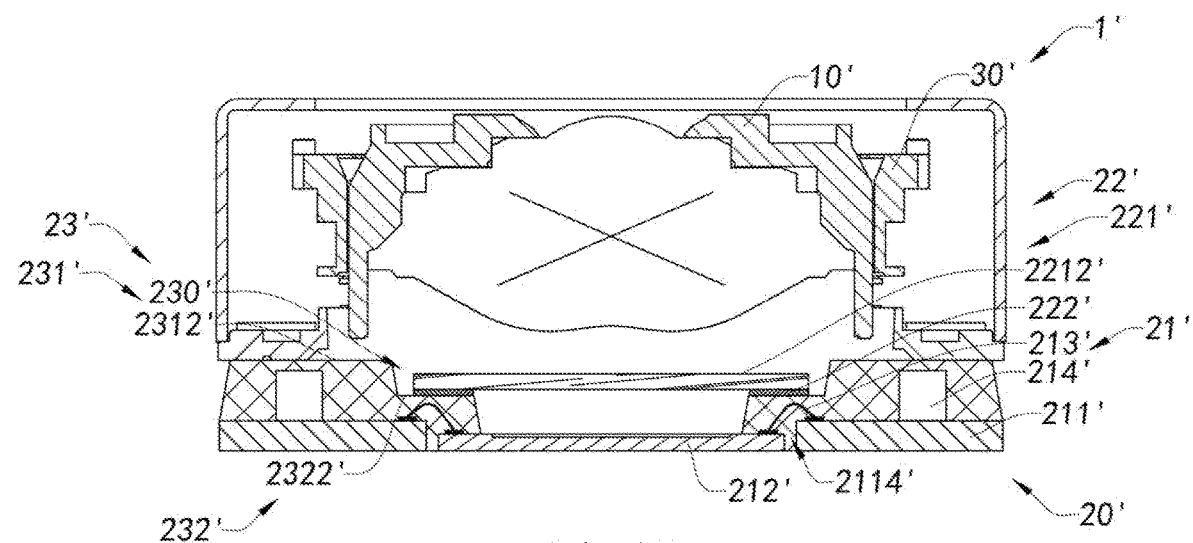
FIG. 6H shows an eighth modified implementation mode of the camera module according to the first preferred embodiment of the present invention.

FIG. 6H shows an eighth modified implementation mode of the camera module 1'. The circuit board 211' of the imaging assembly 21' of the molded photosensitive assembly 20' is further provided with a through hole type chip mounting recess 2114'. The chip mounting recess 2114' extends downward from the upper side of the circuit board 211' to a lower side of the circuit board 211' to form a through hole in the chip mounting region 2111' of the circuit board 211'. The photosensitive element 212' is correspondingly arranged in the through hole, so that the photosensitive surface of the photosensitive element 212' is lower than the upper side of the circuit board 211', which minimizes the arc height of the lead 213' to minimize the height of the second base portion 232' of the molded base 23'.

Figure 7D:
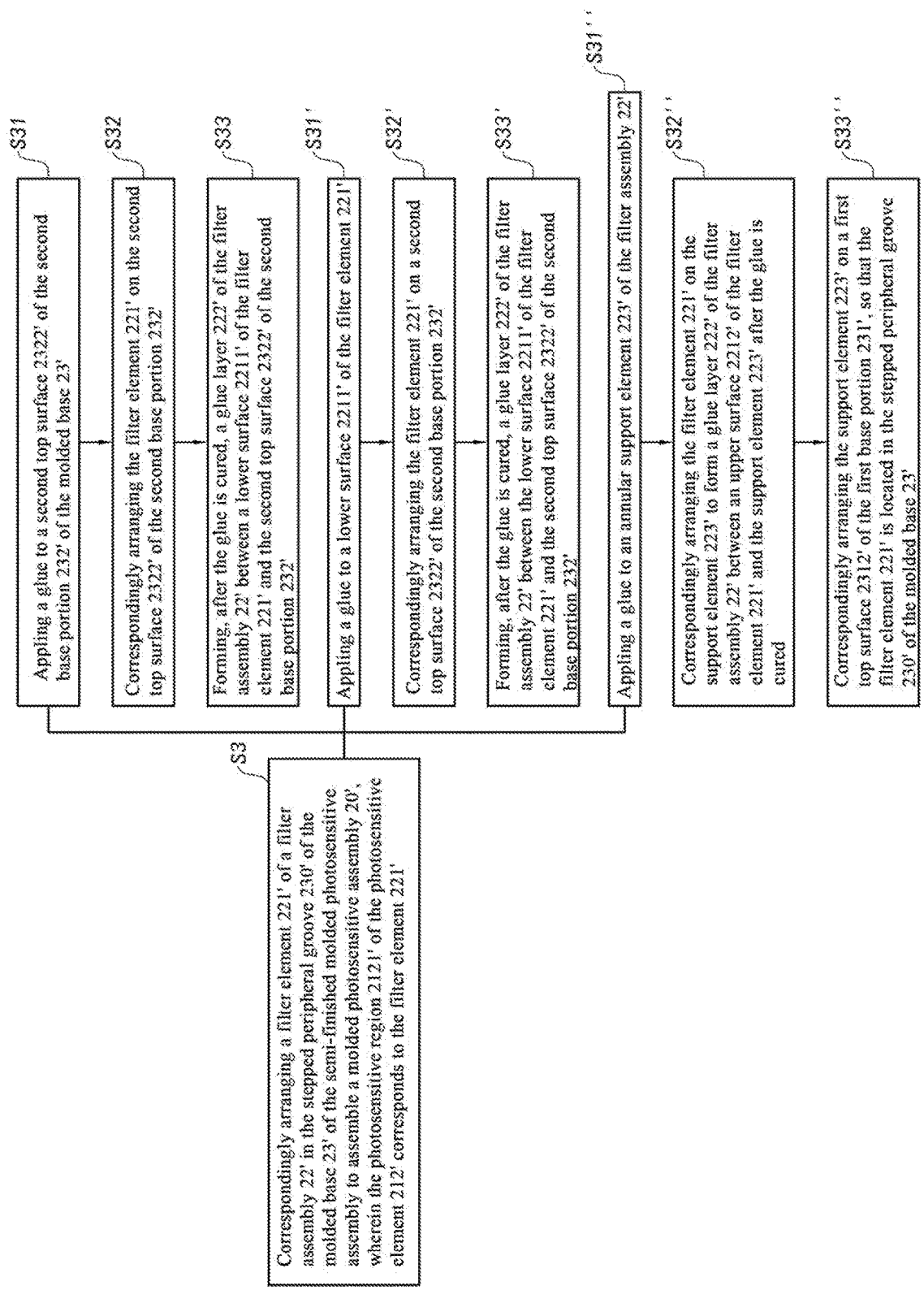

Referring to FIGS. 7A to 7D, according to another aspect of the present invention, the first preferred embodiment of the present invention further provides a method for manufacturing a molded photosensitive assembly and a method for manufacturing a camera module. As shown in FIG. 7A, the method for manufacturing the molded photosensitive assembly includes the following steps:

S1: a photosensitive element 212' and at least one group of electronic components 214' are mounted to a circuit board 211', and the photosensitive element 212' and the circuit board 211' are conducted to assemble an imaging assembly 21';

S2: a molded base 23' which is used for embedding a part of the circuit board 211' and a part of the photosensitive element 212' and has a stepped peripheral groove 230' is formed by means of a molding process, and a light window 2301' is formed through the stepped peripheral groove 230', wherein a photosensitive region 2121' of the photosensitive element 212' corresponds to the light window 2301' of the molded base 23', so as to form a semi-finished molded photosensitive assembly with an integrated structure; and S3: a filter element 221' of a filter assembly 22' is correspondingly arranged in the stepped peripheral groove 230' of the molded base 23' of the semi-finished molded photosensitive assembly to assemble a molded photosensitive assembly 20', wherein the photosensitive region 2121' of the photosensitive element 212' corresponds to the filter element 221'.

It is worth noting that, in an implementation mode of the present invention, as shown in FIG. 7B, step S1 includes the following steps:

S11: the photosensitive element 212' is mounted to a chip mounting region 2111' of the circuit board 211';

S12: each electronic component 214' is mounted to a circuit board outer portion 21123' of an edge region 2112' of the circuit board 211'; and S13: a lead 213' is extended by means of a wire bonding process from a chip connector 2123' of the photosensitive element 212' to a circuit board connector 2113' of the circuit board 211' to conductively connect the photosensitive element 212' and the circuit board 21'.

In another modified implementation mode of the present invention, step S1 further includes step S13': a lead 213' is extended by means of a reverse bonding process from a circuit board connector 2113' of the circuit board 211' to a chip connector 2123' of the photosensitive element 212' to conductively connect the photosensitive element 212' and the circuit board 21'.

Further, as shown in FIG. 7C, step S2 includes the following steps:

S21: the imaging assembly 21' is placed in a molding die 500';

S22: a clamping operation is performed on an upper die 510' and a lower die 520' of the molding die 500' to form a molding space 530' of the molding die 500' between the upper die 510' and the lower die 520';

S23: a molding material is added to the molding space 530' of the molding die 500' to form the molded base 23' with the stepped peripheral groove 230' after the molding material is cured; and S24: a drafting operation is performed on the molding die 500' to obtain the semi-finished molded photosensitive assembly.

More specifically, step S22 includes the following steps:

a cover film 540' is arranged on a pressing surface 513' of the upper die 510';

the photosensitive element 212' of the imaging assembly 21' is pressed by means of the cover film 540', so that the cover film 540' is located between the pressing surface 513' and the photosensitive element 212';

a first molding space 531' of the molding space 530' is formed between a first inner surface 511' of the upper die 510' and a circuit board outer portion 21123' of the edge region 2112' of the circuit board 211'; and a second molding space 532' of the molding space 530' is formed among a second inner surface 512' of the upper die 510', a circuit board connecting portion 21122' and a circuit board inner portion 21121' of the edge region 2112' of the circuit board 211', and a chip outer portion 21223' and a chip connecting portion 21222' of a non-photosensitive region 2122' of the photosensitive element 212', wherein the first inner surface 511' of the upper die 510' is above the second inner surface 512' of the upper die 510'.

In addition, step S23 includes the following steps:

the molding material is added to the first molding space 531' to form a first base portion 231' of the molded base 23' that is used to embed the circuit board outer portion 21123' of the edge region 2112' of the circuit board 211' after the molding material is cured; and the molding material is added to the second molding space 532' to form a second base portion 232' of the molded base 23' that is used to embed the circuit board connecting portion 21122' and the circuit board inner portion 21121' of the edge region 2112 of the circuit board 211' as well as the chip outer portion 21223' and the chip connecting portion 21222' of the non-photosensitive region 2122' of the photosensitive element 212' after the molding material is cured, wherein a height of the second base portion 232' is lower than a height of the first base portion 231'.

In the first preferred embodiment of the present invention, as shown in FIG. 7D, step S3 includes the following steps:

S31: a glue is applied to a second top surface 2322' of the second base portion 232' of the molded base 23';

S32: the filter element 221' is correspondingly arranged on the second top surface 2322' of the second base portion 232'; and S33: after the glue is cured, a glue layer 222' of the filter assembly 22' is formed between a lower surface 2211' of the filter element 221' and the second top surface 2322' of the second base portion 232'.

In a modified implementation mode of the present invention, as shown in FIG. 7D, step S3 includes the following steps:

S31': a glue is applied to a lower surface 2211' of the filter element 221';

S32': the filter element 221' is correspondingly arranged on a second top surface 2322' of the second base portion 232'; and S33': after the glue is cured, a glue layer 222' of the filter assembly 22' is formed between the lower surface 2211' of the filter element 221' and the second top surface 2322' of the second base portion 232'.

In another modified implementation mode of the present invention, as shown in FIG. 7D, step S3 includes the following steps:

S31": a glue is applied to an annular support element 223' of the filter assembly 22';

S32": the filter element 221' is correspondingly arranged on the support element 223' to form a glue layer 222' of the filter assembly 22' between an upper surface 2212' of the filter element 221' and the support element 223' after the glue is cured; and S33": the support element 223' is correspondingly arranged on a first top surface 2312' of the first base portion 231', so that the filter element 221' is located in the stepped peripheral groove 230' of the molded base 23'.

As shown in FIG. 8, the method for manufacturing the camera module includes the following steps:

(a) a photosensitive element 212' and at least one group of electronic components 214' are mounted to a circuit board 211', and the photosensitive element 212' and the circuit board 211' are conducted to assemble an imaging assembly 21';

(b) a molded base 23' which is used for embedding a part of the circuit board 211' and a part of the photosensitive element 212' and has a stepped peripheral groove 230' is formed by means of a molding process, and a light window 2301' is defined on the molded base 23' through the stepped peripheral groove 230', wherein a photosensitive region 2121' of the photosensitive element 212' corresponds to the light window 2301' of the molded base 23', so as to form a semi-finished molded photosensitive assembly with an integrated structure;

(c) a filter element 221' of a filter assembly 22' is correspondingly arranged in the stepped peripheral groove 230' of the molded base 23' of the semi-finished molded photosensitive assembly to assemble a molded photosensitive assembly 20', wherein the photosensitive region 2121' of the photosensitive element 212' corresponds to the filter element 221'; and (d) an optical lens 10' is correspondingly arranged on a photosensitive path of the imaging assembly 21' of the molded photosensitive assembly 20' to form a camera module 1'.

Figure 9:
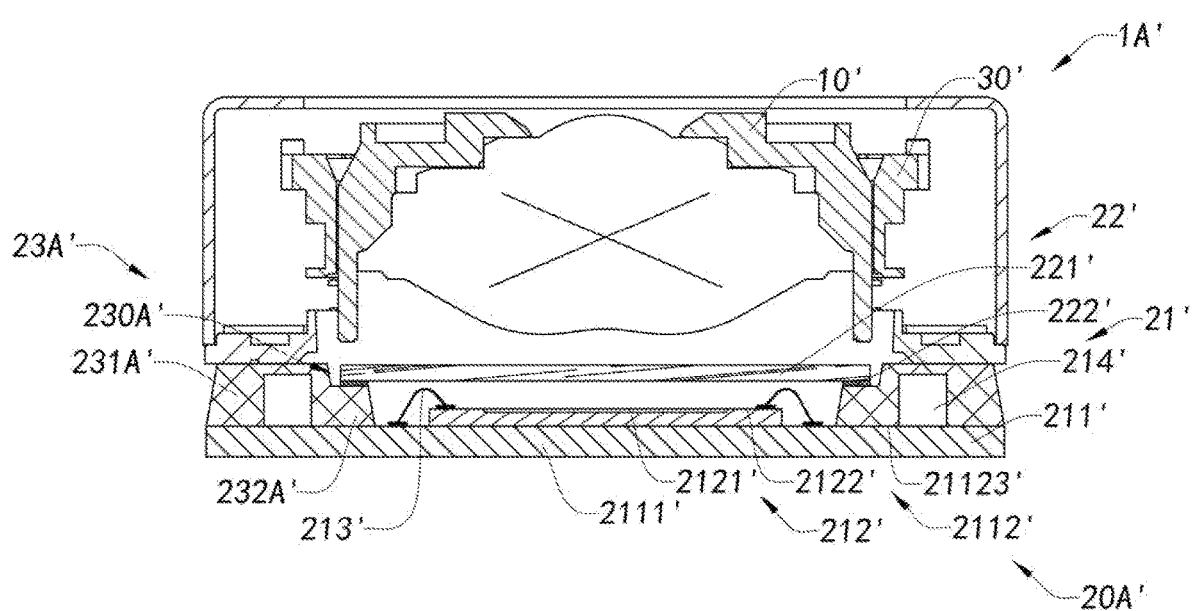
FIG. 9 is a schematic cross-sectional view of a camera module according to a second preferred embodiment of the present invention.

Referring to FIGS. 9 to 11 of the present invention, a camera module and a molded photosensitive assembly and manufacturing methods thereof according to a second preferred embodiment of the present invention are illustrated. Compared with the above-mentioned first preferred embodiment according to the present invention, the difference of the camera module 1A' according to the second preferred embodiment of the present invention is: as shown in FIG. 9, a molded base 23A' of a molded photosensitive assembly 20A' of the camera module 1A' only embeds the circuit board outer portion 21123' of the edge region 2112' of the circuit board 211', and does not embed other parts of the edge region 2112' of the circuit board 211' and the non-photosensitive region 2122' of the photosensitive element 212'. In other words, the first base portion 231A' and the second base portion 232A' of the molded base 23A' both embed the circuit board outer portion 21123' of the edge region 2112' of the circuit board 211', the first base portion 231A' embeds each electronic component 214', but the second base portion 232A' embeds neither the electronic components 214' nor each lead 213', so that safety gaps reserved between the second base portion 232A' and the leads 213' can be further reduced for further reducing the height of the second base portion 232A'.

It is worth noting that, since the circuit board connector 2113' and the chip mounting region 2111' of the circuit board 211' are exposed outside the molded base 23A', the molded base 23A' can be first formed on the circuit board 211' by the molding process, then the photosensitive element 212' is mounted to the circuit board 211', and finally, the circuit board 211' and the photosensitive element 212' are conducted.

Figure 10A:
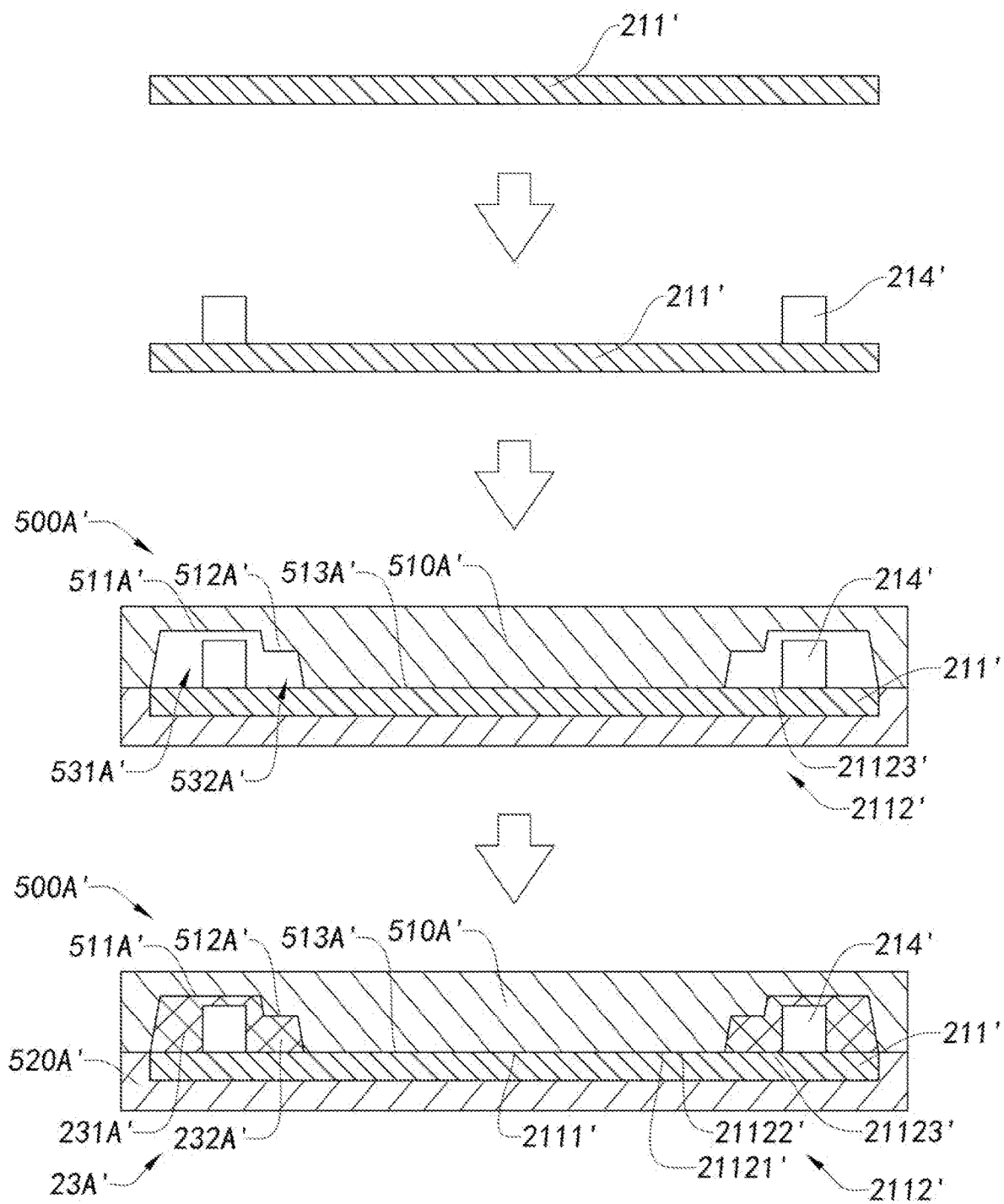
FIGS. 10A and 10B are cross-sectional views of manufacturing steps of the camera module according to the second preferred embodiment of the present invention.
Figure 10B:
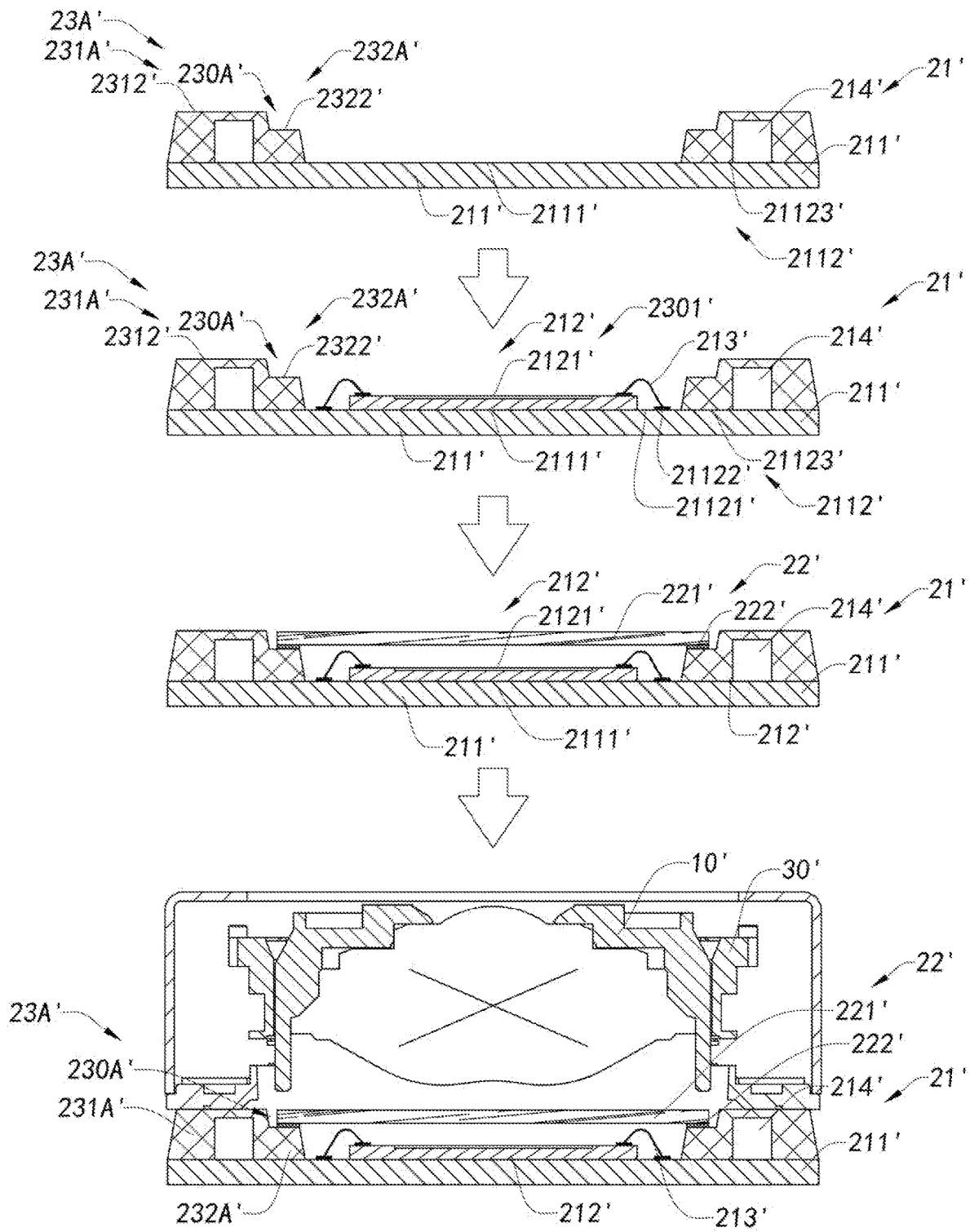

Exemplarily, as shown in FIGS. 10A and 10B, the circuit board 211' is put into a molding die 500A', the molding process is performed by means of the molding die 500A' to form the molded base 23A' with the stepped peripheral groove 230', and the molded base 23A' embeds the circuit board outer portion 21123' of the edge region 2112' of the circuit board 211'.

Specifically, the molding die 500A' includes an upper die 510A' and a lower die 520A', wherein at least one of the upper and lower dies 510A' and 520A' can be moved, so that the upper die 510A' and the lower die 520A' can be clamped and drafted; and when the molding die 500A' is in a clamped state, a molding space 530A' is formed between the upper die 510A' and the lower die 520A', wherein the molded base 23A' is formed by adding a molding material into the molding space 530A' and curing the same.

More specifically, the upper die 510A' has a first inner surface 511A', a second inner surface 512A', and a pressing surface 513A', wherein the second inner surface 512A' is located around the first inner surface 511A', and the second inner surface 512A' is located between the first inner surface 511A' and the pressing surface 513A', wherein the second inner surface 512A' is lower than the first inner surface 511A', and the pressing surface 513A' is lower than the second inner surface 512A'.

In FIG. 10A, after the circuit board 211' is placed in the upper die 510A' and/or the lower die 520A', the upper die 510A' and the lower die 520A' are operated to clamp the molding die, so that the circuit board 211' is located in the molding space 530A' formed between the upper die 510A' and the lower die 520A'. At this time, the first inner surface 511A' of the upper die 510A' corresponds to the circuit board outer portion 21123' of the edge region 2112' of the circuit board 211' so as to form a first molding space 531A' between the first inner surface 511A' and the circuit board outer portion 21123' of the circuit board 211', and the molding material is added to the first molding space 531A' and cured to form the first base portion 231A'; the second inner surface 512A' of the upper die 510A' also corresponds to the circuit board outer portion 21123' of the edge region 2112' of the circuit board 211' so as to form a second molding space 532A' between the second inner surface 512A' and the circuit board outer portion 21123' of the circuit board 211', and the molding material is added to the second molding space 532A' and cured to form the second base portion 232A'; the pressing surface 513A' of the upper die 510A' presses the chip mounting region 2111' of the circuit board 211' as well as the circuit board inner portion 21121' and the circuit board connecting portion 21122' of the edge region 2112'; and because the chip mounting region 2111' is located at the middle part of the circuit board 211', the circuit board 211' can be flattened by the pressing surface 513A', which ensures the overall flatness of the circuit board 211', and also provides a flat molding base surface for the molding process.

As shown in FIG. 10B, after the molding material is cured in the molding space 530A' to form the molded base 23A', a semi-finished molded photosensitive assembly with an integrated structure is formed, wherein the semi-finished molded photosensitive assembly includes the circuit board 211' of the imaging assembly 21' and the molded base 23'. Next, the upper die 510' and the lower die 520' are operated for being drafted to open the molding space 530' of the mold 500' for taking out the semi-finished molded photosensitive assembly from the molding space 530'. Then, the photosensitive element 212' is mounted to the chip mounting region 2111' of the circuit board 211', and the photosensitive element 212' and the circuit board 211' are conducted. Finally, the filter element 221' is mounted to the second top surface 2322' of the second base portion 232A' of the molded base 23A' to form the molded photosensitive assembly 20A'.

It is worth noting that in the second preferred embodiment of the present invention, except the above-mentioned different structure, other structures of the camera module 1A' are the same as those of the camera module 1' according to the first preferred embodiment of the present invention, and the camera module 1A' also has the same or similar modified implementation modes as the various modified implementation modes of the camera module 1' of the first preferred embodiment. Details are not described herein again.

According to another aspect of the present invention, the second preferred embodiment of the present invention further provides a method for manufacturing a molded photosensitive assembly. As shown in FIG. 11, the method for manufacturing the molded photosensitive assembly 20A' includes the following steps:

(A) a molded base 23A' which is used for embedding a circuit board outer portion 21123' of an edge region 2112' of a circuit board 211' and has a stepped peripheral groove 230' is formed by means of a molding process, and a light window 2301' is formed through the stepped peripheral groove 230', wherein a photosensitive region 2121' of the photosensitive element 212' corresponds to the light window 2301' of the molded base 23A', so as to form a semi-finished molded photosensitive assembly with an integrated structure;

(B) a photosensitive element 212' is mounted to a chip mounting region 2111' of the circuit board 211', and the photosensitive element 212' and the circuit board 211' are conducted; and (C) a filter element 221' of a filter assembly 22' is correspondingly arranged in the stepped peripheral groove 230' of the molded base 23A' to assemble a molded photosensitive assembly 20A', wherein the photosensitive region 2121' of the photosensitive element 212' corresponds to the filter element 221'.

Further, before step (A), the method further includes the following step: at least one group of electronic components 214' are mounted to the circuit board outer portion 21123' of the edge region 2112' of the circuit board 211'.

Figure 12:
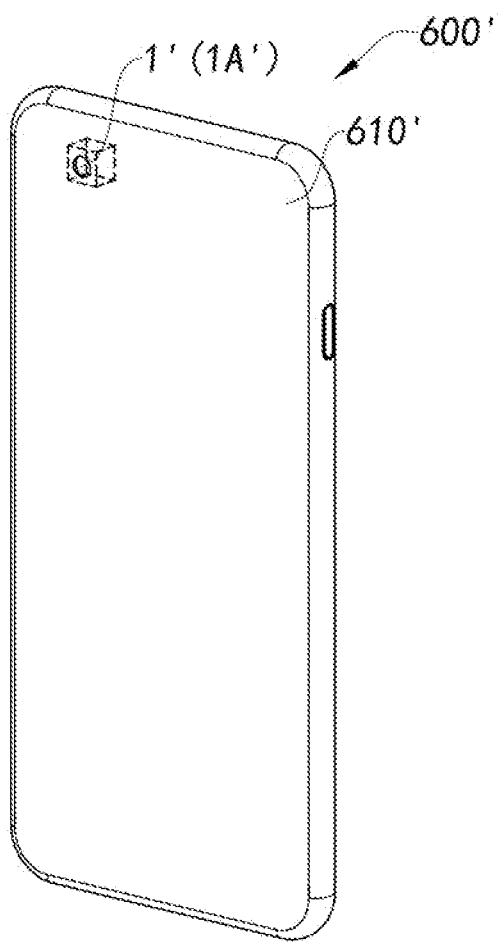
FIG. 12 is a schematic diagram of an electronic device with the above-mentioned camera module of the present invention.
Figure 13:
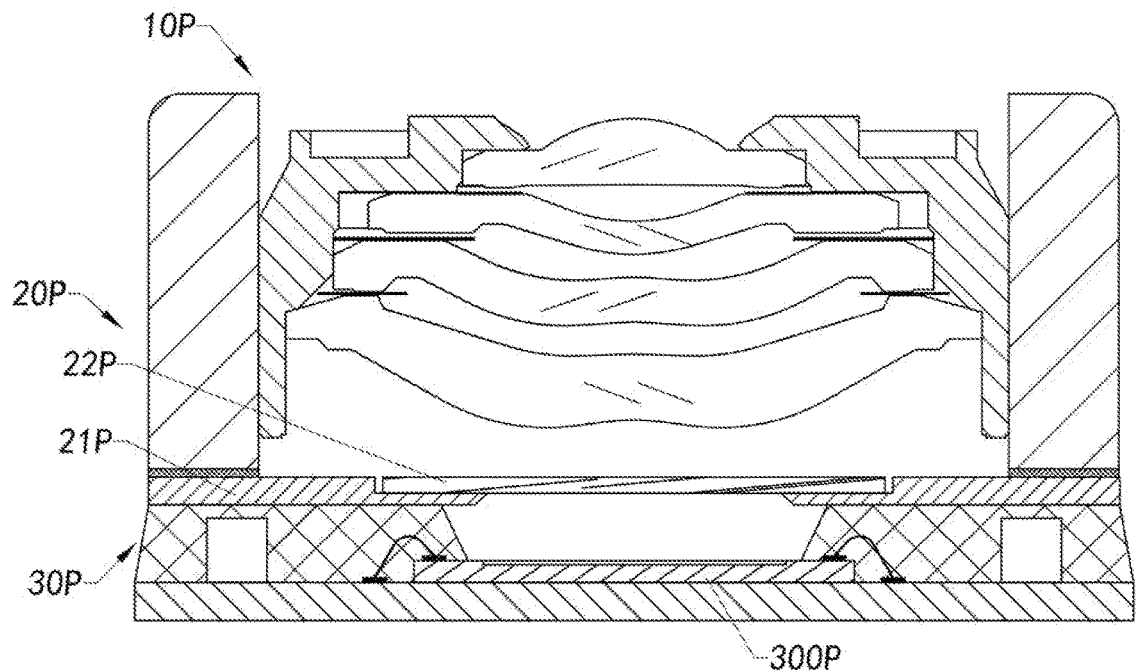
FIG. 13 is an existing camera module in an intelligent device.

Referring to FIG. 12, according to another aspect of the present invention, the present invention further provides an electronic device 600'. The electronic device 600' includes an electronic device body 610' and at least one camera module 1' or 1A', wherein each camera modules 1' or 1A' is respectively arranged on the electronic device body 610' for capturing images. It is worth mentioning that the type of the electronic device body 610' is not limited. For example, the electronic device body 610' may be any electronic device which can be configured with the camera module, such as a smart phone, a tablet computer, a notebook computer, an e-book, a personal digital assistant, or a camera. A person skilled in the art could understand that, although the electronic device body 610' is implemented as a smart phone as an example in FIG. 12, it does not constitute a limitation to the content and scope of the present invention.

The present invention provides a camera module, as shown in FIGS. 14 to 33C, which has a small size and is suitable for being installed in an intelligent device for capturing images. The camera module according to a third embodiment of the present invention is shown in FIGS. 14 to 23. The camera module includes an optical assembly 10, a filter 20 and a molded photosensitive assembly 30. The thickness of the camera module depends on the height of the optical assembly 10 and the thickness of the molded photosensitive assembly 30. The molded photosensitive assembly 30 can receive imaging light transmitted from the optical assembly 10 and passing through the filter 20. After the imaging light is shaped by the optical assembly 10 and filtered by the filter 20, a photosensitive chip 33 molded by the molded photosensitive assembly 30 obtains high-quality resources for imaging. The optical assembly 10 includes a lens, a motor lens and other feasible means.

Figure 14:
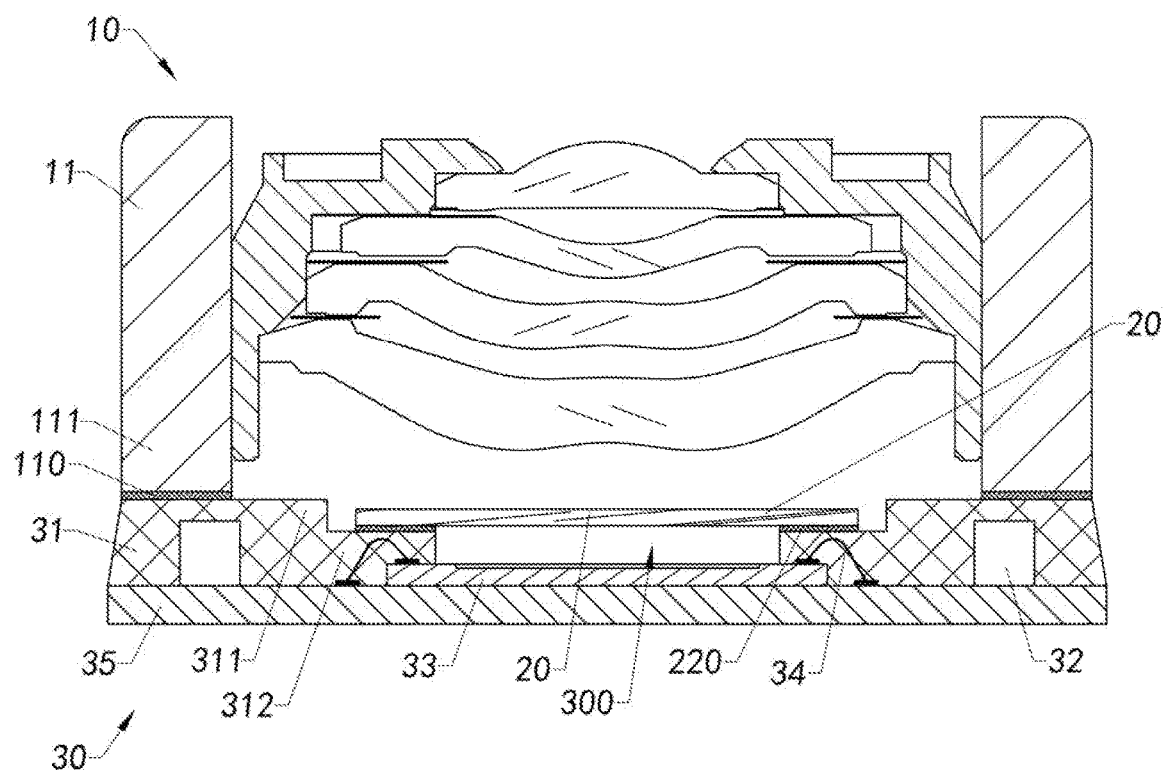
FIG. 14 is a cross-sectional view of a camera module according to a third embodiment of the present invention.
Figure 15:
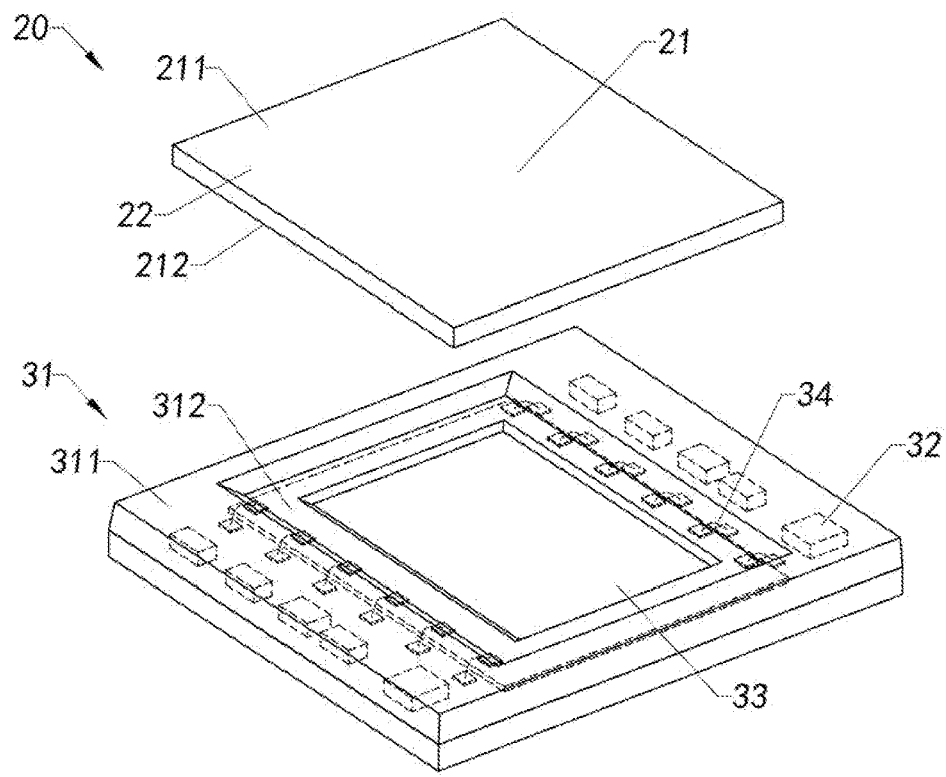
FIG. 15 is a three-dimensional schematic diagram of a filter and a molded photosensitive assembly of the camera module according to the third embodiment of the present invention.
Figure 16:
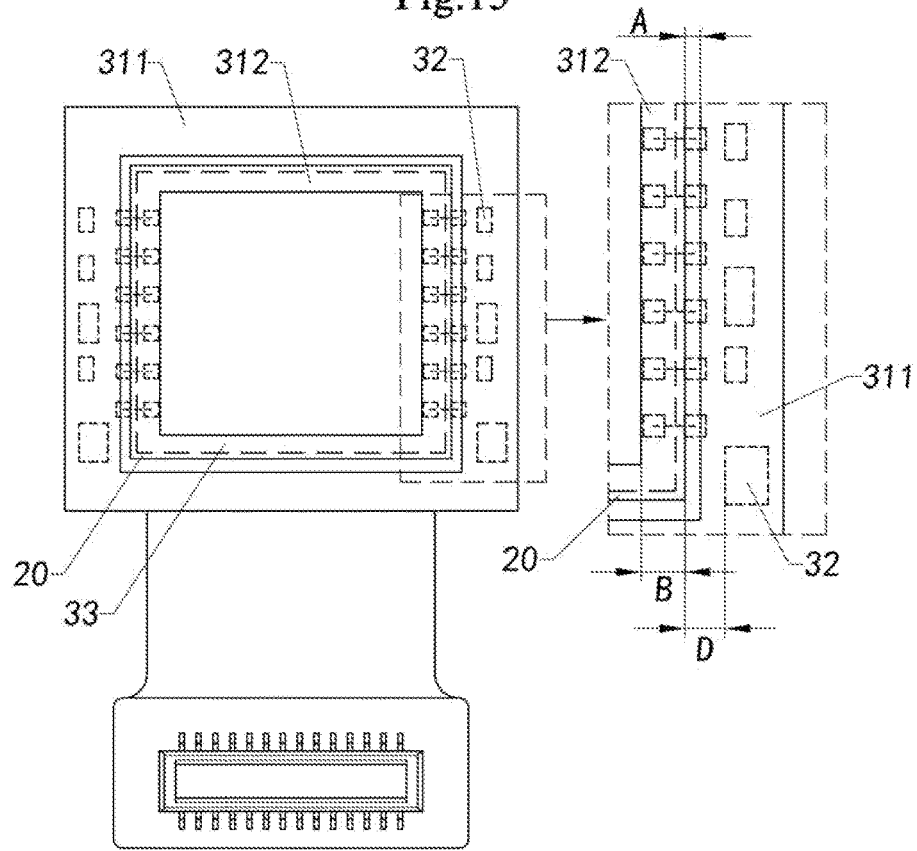
FIG. 16 is a schematic top view of the filter and the molded photosensitive assembly of the camera module according to the third embodiment of the present invention.

A position where the filter 20 is mounted on the molded photosensitive assembly 30 is lower than a position where the optical assembly 10 is mounted on the molded photosensitive assembly 30, as shown in FIGS. 14 to 16, so that the distance between the filter 20 and the molded photosensitive assembly 30 and the distance between the filter 20 and the optical assembly 10 are maintained, and little stray light is transmitted to the center of the molded photosensitive assembly 30. In this preferred embodiment, the filter 20 is fixed to the molded photosensitive assembly 30 by a filter glue 220. In addition, the optical assembly 10 is fixed to the molded photosensitive assembly 30 by a lens glue 110. It is worth mentioning that the filter glue 220 and the lens glue 110 are on different levels of the molded photosensitive assembly 30, so that the lens glue 110 and the filter glue 220 are kept at a certain distance without covering the filter 20.

More particularly, in this preferred embodiment, the photosensitive chip 33 is preferably fixed to a bottom of the molded photosensitive assembly 30, and the optical assembly 10 is attached to a top of the molded photosensitive assembly 30; and the filter 20 is attached between the optical assembly 10 and the photosensitive chip 33, so that the molded photosensitive assembly 30 provides a stable support force to the optical assembly 10 and the filter 20.

The optical assembly 10 includes a lens barrel 11 and some lenses 12 mounted in the lens barrel 11. In addition, the lens barrel 11 includes a leg 111 supporting the lenses 12 away from the filter 20. The leg 111 of the lens barrel 11 is fixed to the molded photosensitive assembly 30 to support the lenses 12 to maintain a distance from the filter 20 and the photosensitive chip 33, so as to transmit imaging light as required.

The filter 20 includes a filter portion 21 for filtering the imaging light and an edge portion 22 extending outward from the filter portion 21, wherein the edge portion 22 is supported on the molded photosensitive assembly 30, so that the filter portion 21 corresponds to the photosensitive chip 33. It is worth mentioning that the filter glue 220 is located between the edge portion 22 and the molded photosensitive assembly 30, and does not cover the filter portion 21 and the photosensitive chip 33 of the molded photosensitive assembly 30. The edge portion 22 of the filter 20 is directly supported on the molded photosensitive assembly 30 without additional supporting components. Particularly, in an example of the present invention, the edge portion 22 integrally extends outward from the filter portion 21, and the edge portion 22 is located around the filter portion 21, so that the filter 20 is implemented as an integrated element, and can be fixed in the support cavity 300 of the molded photosensitive assembly 30.

Specifically, the molded photosensitive assembly 30 further includes a main body 31, some electronic devices 32 and a circuit board 35. The photosensitive chip 33 is electrically connected to the electronic devices 32 through the circuit board 35. The main body 31 embeds the electronic devices 32 on the circuit board 35 and forms the support cavity 300 to support the filter 20 and the optical assembly 10 at a distance. In other words, the main body 31 embeds the electronic devices 32 and a part of the circuit board 35, wherein the photosensitive chip 33 is surrounded by a bottom portion of the main body 31 and keeps a distance from the filter 20.

In this preferred embodiment, the photosensitive chip 33 is connected to the circuit board 35 by a group of wires 34. One ends of the wires 34 are fixed to the circuit board 35, and the other ends are fixed to the photosensitive chip 33. A person skilled in the art could understand that the photosensitive chip 33 converts light into images by means of the electronic devices 32 on the circuit board 35. The main body 31 partially embeds the photosensitive chip 33 therein. In other words, the wires 34 and an edge of the photosensitive chip 33 are completely embedded inside the main body 31 of the molded photosensitive assembly 30 and protected. The photosensitive chip 33 is surrounded by the electronic devices 32, as shown in FIGS. 14 to 17, and an edge of the main body 31 embedding the electronic devices 32 is higher than an interior of the main body 31 embedding the wires 34.

Furthermore, a top edge of the main body 31 supports the optical assembly 10, and the optical assembly 10 is far away from the filter 20 and the photosensitive chip 33, so that the filter 20 and the photosensitive chip 33 are not subjected to the pressure of the optical assembly 10. Preferably, the positions of the electronic devices 32, the photosensitive chip 33 and the filter 20 are stabilized by the main body 31, and a size of the main body 10 and a distance between the main body 10 and the filter 20 are correspondingly designed to enhance the stability, reliability and compactness of the camera module. The specific design data of the main body 31 will be disclosed in the following paragraphs. It is worth mentioning that the drawings only illustrate the positional relationship between the optical assembly 10, the filter 20 and the molded photosensitive assembly 30, but such illustrations do not strictly follow numerical proportion.

Figure 17:
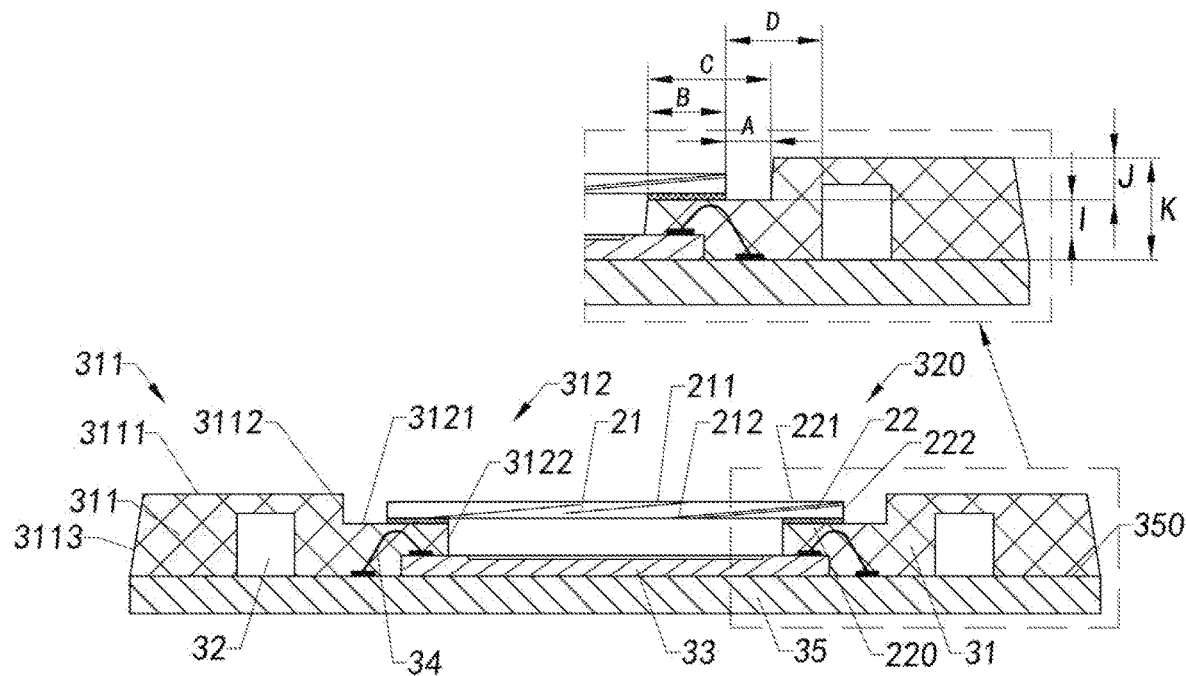
FIG. 17 is a schematic cross-sectional view of the filter and the molded photosensitive assembly of the camera module according to the third embodiment of the present invention.

Further, as shown in FIGS. 16 and 17, the filter portion 21 has an incident surface 211 and an exit surface 212, wherein the incident surface 211 is arranged opposite to the lenses 12 of the optical assembly 10, and the exit surface 212 is arranged opposite to the photosensitive chip 33. After imaging light is shaped by the lenses 12 of the optical assembly 10, the imaging light passes through the incident surface 211 and then the exit surface 212 and is filtered. Preferably, the filter portion 21 is made of an infrared light filter material. The edge portion 22 has an edge top surface 221, an edge side surface 222, and an edge bottom surface 223. In this preferred embodiment, the edge top surface 221 is coplanar with the incident surface 211, and the edge bottom surface 223 is coplanar with the exit surface 212.

It is worth mentioning that the edge bottom surface 223 of the edge portion 22 of the filter 20 is attached to the main body 31 of the molded photosensitive assembly 30 by the filter glue 220, so that the filter portion 21 transmits the imaging light in a clean state. In addition, the filter portion 21 and the edge portion 22 do not need to support anything on the incident surface 211 and the edge top surface 221, which provides the filter 20 with higher reliability.

Particularly, the main body 31 of the molded photosensitive assembly 30 includes a bounding body 311 and a short body 312, and the short body 312 integrally extends from an inner side of the bounding body 311. The bounding body 311 and the short body 312 are both formed and molded on a connecting surface 350 of the circuit board 35 to embed the electronic devices 32, the wires 34 and the photosensitive chip 33. In the third preferred embodiment, the electronic devices 32 are mainly embedded by the bounding body 311, and the wires 34 and the photosensitive chip 33 are mainly embedded by the short body 312. In other preferred embodiments, the electronic devices 32 may also be embedded by the short body 312.

Specifically, the bounding body 311 and the short body 312 have a certain height difference to form a hollow square-shaped groove inside the main body 31, so that the filter 20 is arranged in the hollow square-shaped groove of the main body 31. In other words, the bounding body 311 has a high upper surface 3111 and a high inner side surface 3112, wherein the high upper surface 3111 of the bounding body 311 is used to support the optical assembly 10. The short body 312 has a short upper surface 3121 and a short inner side surface 3122, wherein the short upper surface 3121 of the short body 312 is used to support the filter 20, and the high inner side surface 3112 of the bounding body 311 and the short inner side surface 3122 of the short body 312 form the support cavity 300 of the molded photosensitive assembly 30 inward. A distance between the high upper surface 3111 of the bounding body 311 and the connecting surface 350 of the circuit board 35 is greater than a distance between the short upper surface 3121 of the short body 312 and the connecting surface 350 of the circuit board 35. In other words, the high inner side surface 3112 and the short upper surface 3121 are shaped in a groove shape to accommodate the filter 20 therein, and the filter 20 does not need to protrude from the high upper surface 3111. It could be understood that the bounding body 311 further has a high outer surface 3113 to form a peripheral surface of the main body 31.

In this preferred embodiment, as shown in FIG. 17, the height difference J between the bounding body 311 and the short body 312 is more than 0.1 mm, that is, a distance between the high upper surface 3111 and the short upper surface 3121 is more than 0.1 mm to fit thicknesses of the filter 20 and the filter glue 220. More preferably, the height difference J between the bounding body 311 and the short body 312 is greater than or equal to the sum (such as 0.28 mm) of the thickness of the filter 20, the thickness of the filter glue 220, and a margin of 0.04 mm, so that the thickness of the filter 20 is hidden in the main body 31 of the molded photosensitive assembly 30.

In addition, the thickness H of the filter glue 220 has also to be considered, generally less than 0.03 mm. The thickness of the filter glue 220 can be appropriately reduced under the condition that the glue has sufficient bonding force, and a thermosetting colloid is used in this preferred embodiment.

It is worth noting that a width C of the short upper surface 3121 of the short body 312 (that is, a distance from the high inner side surface 3112 to the short inner side surface 3122, or the thickness of the short body 312) is preferably more than or equal to 0.4 mm, so that on the basis of ensuring that the bounding body 311 and the short body 312 can be molded in an L shape, the value of the width C also ensures that the filter 20 has a sufficient installation area on the short upper surface 3121 of the short body 312, and can allow certain installation deviation of the filter 20 without causing adverse effects. The filter glue 220 can also have enough gluing area on the short upper surface 3121, which increases a contact area between the filter 20 and the filter glue 220, and improves the bonding force of the glue.

The filter glue 220 is applied between the edge bottom surface 223 of the edge portion 22 of the filter 20 and the short upper surface 3121 of the short body 312, so that the edge portion 22 of the filter 20 is connected to the short body 312 by the filter glue 220. The filter glue 220 may be implemented as a colloid having a similar square shape, and a size of the filter glue 220 is smaller than a size of the lens glue 110.

Preferably, a width of the filter glue 220 between the edge bottom surface 223 and the short upper surface 3121 of the short body 312 has a maximum value, and the maximum width of the filter glue 220 is equal to a width B of the edge portion 22, wherein the width B of the edge portion 22 of the filter 20 is preferably more than or equal to 0.25 mm, so that the filter 20 can be stably supported by the edge portion 22, which ensures that the filter 20 has a sufficient installation area on the short upper surface 3121 of the short body 312, and can allow certain installation deviation of the filter 20 without causing adverse effects; and the filter portion 21 is aligned with the photosensitive chip 33.

Furthermore, there is a gap between a side of the filter 20 and an inner side of the bounding body 311 of the main body 31. In other words, the filter 20 does not contact the bounding body 311 of the main body 31, which can reduce the vibration, transmitted by the main body 31, of the optical assembly 10. In addition, the gap between the side of the filter 20 and the inner side of the bounding body 311 of the main body 31 can accommodate the excess lens glue 110 and keep the lens glue 110 away from the incident surface 211 of the filter 20, which can effectively prevent the lens glue 110 from flowing into the incident surface 211 of the filter portion 21. Preferably, a distance A between the edge side surface 222 of the edge portion 22 of the filter 20 and the high inner side surface 3112 of the bounding body 311 is more than or equal to 0.15 mm, which helps avoidance (that is, yielding) between the filter 20 and the bounding body 311.

It is worth noting that the lens glue 110 connects the leg 111 of the lens barrel 11 to the high upper surface 3111 of the bounding body 311 of the main body 31, so that the optical assembly 10 is mainly supported by the bounding body 311 to reduce the stress of the photosensitive chip 33. Preferably, a height K of the bounding body 311 is more than or equal to 0.5 mm, so that the bounding body 311 embedding the electronic devices 32 can be effectively molded, and the electronic devices 32 can also be prevented from being excessively pressed to the leg 111 of the optical assembly 10. Moreover, because the filter 20 is supported on the short body 312, the filter 20 does not need to bear the weight and movement of the optical assembly 10, which improves reliability. Particularly, the lens barrel 11 is directly on the main body 31, so that the thickness of the camera module is determined by the height of the optical assembly 10 and the thickness of the molded photosensitive assembly 30, which helps to reduce the overall thickness of the camera module.

It is worth mentioning that a size of a capacitor among the electronic devices 32 is usually the largest, so a distance D between the capacitor among the electronic devices 32 and the edge side surface 222 of the edge portion 22 of the filter 20 is preferably more than or equal to 0.2 mm to prevent interference between the electronic devices 32 and the molding die, and an enough space can also be reserved between the electronic devices 32 and the filter 20 for structural design optimization, which is beneficial to forming a complex molded structure between the two and increasing the function of the molded structure. More preferably, the distance D between each electronic device 32 and the edge side surface 222 of the edge portion 22 of the filter 20 is more than or equal to 0.25 mm.

In this preferred embodiment, the bounding body 311 and the short body 312 of the main body 30 are preferably shaped into like squares with chamfers, and inscribed circle radii F of the chamfers are more than or equal to 0.3 mm. It should be noted that the chamfers on the bounding body 311 and the short body 312 need to avoid (that is, yield) the filter 20 to reduce the chance of interference between the chamfers on the bounding body 311 and the short body 312 and the filter 20. Of course, in other examples of the present invention, the chamfers on the bounding body 311 and the short body 312 may also be designed according to the chamfering mode of the filter 20.

As the photosensitive chip 33 is fixed to the bottom portion of the short body 312 of the main body 31, the filter 20 can maintain a certain distance from the photosensitive chip 33 through the short body 312, thereby achieving high-quality imaging. Preferably, a distance I between the short upper surface 3121 of the short body 312 and the photosensitive chip 33 is preferably more than or equal to 0.15 mm, which mainly functions to ensure that the molded structure of this part has sufficient thickness to block the stray light reflected by the lens, the filter or other structures, thereby reducing the incidence of unnecessary light, improving the imaging quality of the photosensitive chip, and preventing the photosensitive chip 33 from being damaged due to pressure. At the same time, the distance I more than or equal to 0.15 can also avoid interference between the molding die and the wires 34 and help to avoid exposure of the wires 34. It is understandable that if the back focus length of the camera module meets the requirements, the distance I can be increased as much as possible to avoid imaging black spots caused by the dirt of the filter 20. Particularly, if the distance I between the short upper surface 3121 of the short body 312 and the photosensitive chip 33 is more than 0.25 mm, the capacitor can be placed under the short body 312 to reduce the size of the camera module in the XY direction.

Therefore, in this preferred embodiment, the main body 31 not only embeds the electronic devices 32 and the wires 34 for protection, but also provides the support cavity 300 to stably support the optical assembly 10 and the filter 20, and does not need to excessively press the electronic devices 32 or the photosensitive chip 33.

It is worth mentioning that, on one hand, in order to increase a screen-to-body ratio of an intelligent device (such as a smart phone), increasingly high requirements have been put forward for the degree of fitness between a side of the camera module and a side of the smart phone, that is, the optical assembly 10 of the camera module is desired to be closer to a mounting shell of the smart phone; and on the other hand, in order that the smart phone has a good holding touch, a cross section of the mounting shell of the smart phone often has a certain radian (that is, an arc-shaped outer frame). Side walls of the camera module are usually flat, resulting in that the flat side walls of the camera module cannot fit well with the arc-shaped outer frame of the smart phone, so that there is a large gap between the two, which greatly limits the degree of fitness between the camera module and the smart phone. It is understandable that although the height of the camera module of the present invention can be reduced by reducing the height of the bounding body 311, the degree of reducing the height of the bounding body 311 is limited by the height of the electronic device 32 itself, so the fitness between the camera module in the above-mentioned embodiment of the present invention and the smart phone is still poor.

Figure 18:
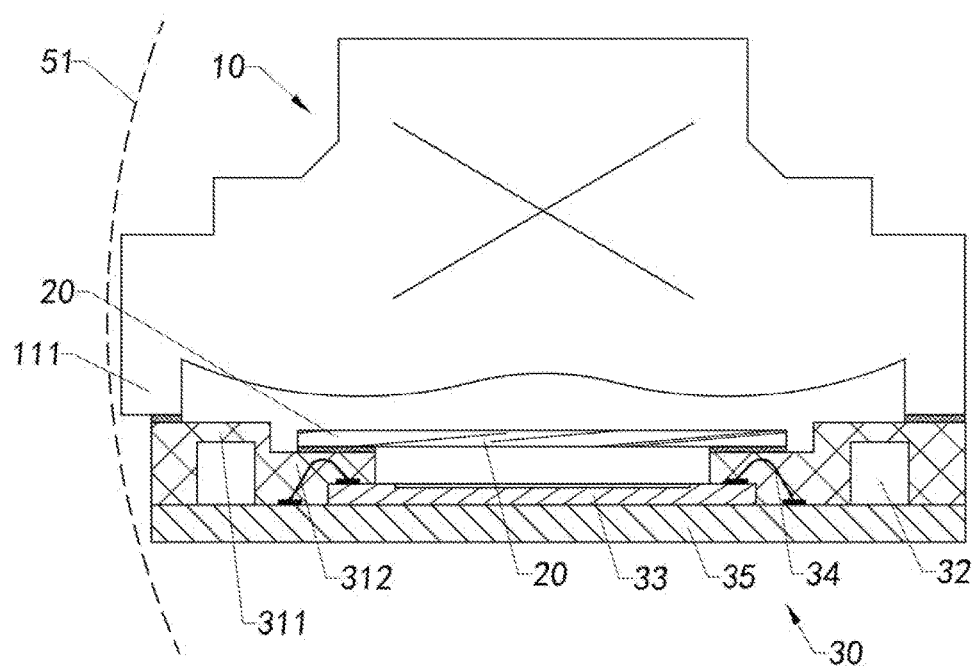
FIG. 18 is a schematic cross-sectional view of the camera module according to the third embodiment of the present invention, illustrating a possible installation mode in a smart phone.

In order to solve the above problem, as shown in FIG. 18, the present invention further provides a modified implementation mode of the camera module according to the third embodiment of the present invention, wherein the optical assembly 10 of the camera module is eccentrically arranged on the molded photosensitive assembly 30, so that the optical assembly 10 can be further adjacent to a mounting shell 51. That is, when the camera module is fixed to the mounting shell 51, the optical assembly 10 can be biased toward the mounting shell 51 due to the eccentric arrangement, so that the optical assembly 10 can be closer to the mounting shell 51, which helps to further improve the degree of fitness between the camera module and the mounting shell 51.

In other words, the optical assembly 10 can be slightly biased to the molded photosensitive assembly 30 to adapt to the mounting shell 51 of the intelligent device. In other words, at least one side of the leg 111 of the lens 11 slightly protrudes from the high upper surface 3111 of the bounding body 311, which helps to improve the degree of fitness between the camera module and the mounting shell of the intelligent device, and does not affect the stability of the filter 20.

It is worth noting that when the camera module is mounted on a top side of the mounting shell 51 of the intelligent device, only one side of the leg 111 of the lens 11 needs to slightly protrude from the high upper surface 3111 of the bounding body 311; and when the camera module is mounted at a corner of the mounting shell 51 of the intelligent device, two adjacent sides of the leg 111 of the lens 11 need to simultaneously protrude outward from the high upper surface 3111 of the bounding body 311, so that the camera module fits with the corner of the mounting shell 51 of the intelligent device.

Figure 19A:
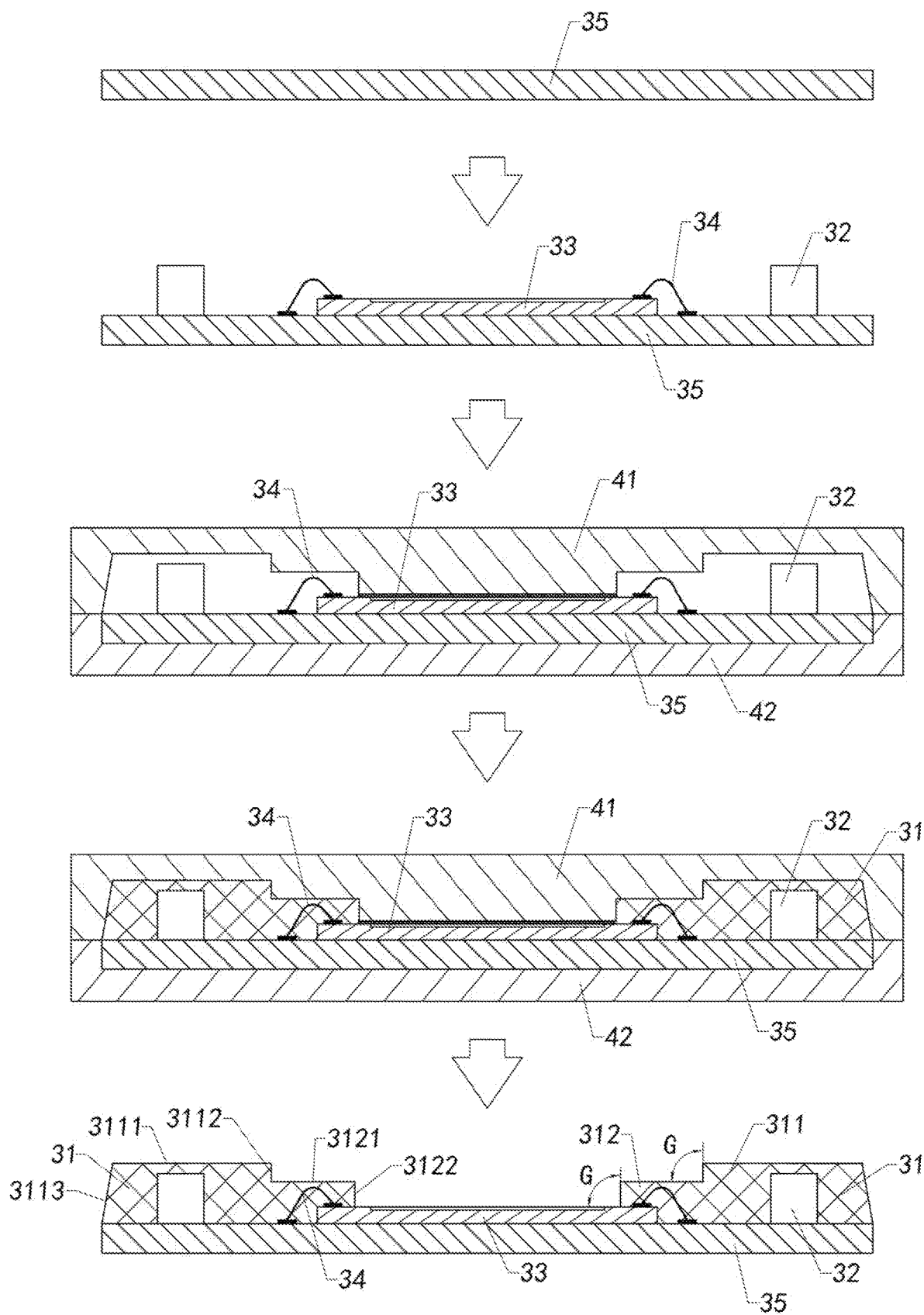
FIGS. 19A and 19B are a schematic flowchart of a method for manufacturing the camera module according to the third embodiment of the present invention.
Figure 19B:
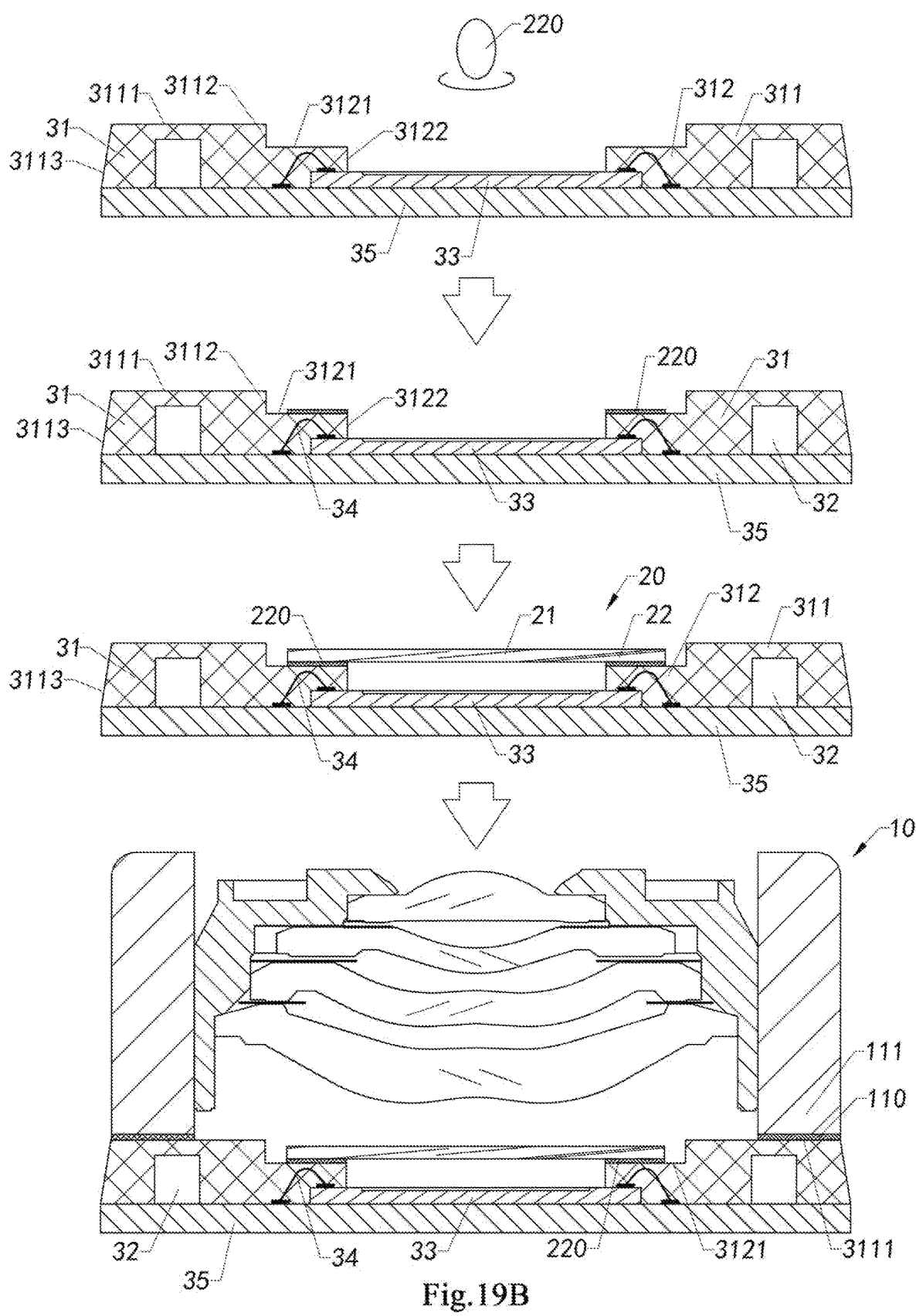
Figure 20:
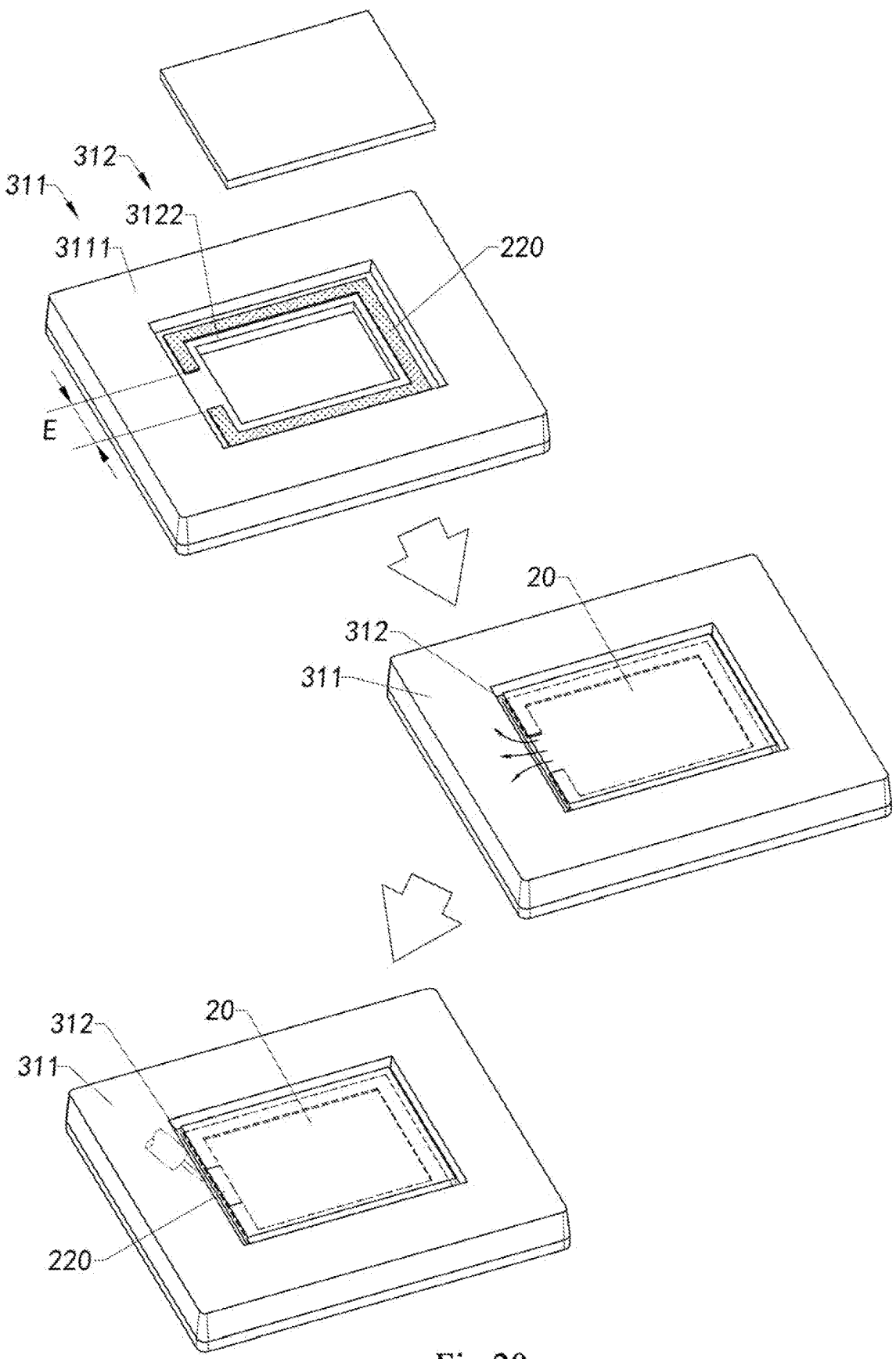
FIG. 20 is a schematic flowchart of a method for manufacturing the camera module according to the third embodiment of the present invention.

According to another aspect of the present invention, a method for manufacturing the camera module according to the present invention is shown in FIGS. 19A to 20. Specifically, as shown in FIG. 19A, the method for manufacturing the camera module includes the following steps:

I. The photosensitive chip 33, the wires 34 and the electronic devices 32 are connected to the circuit board 35;
II. The connected circuit board 35 is placed between an upper die 41 and a lower die 42; and
III. The electronic devices 32 are embedded in the main body 31 and on the circuit board 35, wherein the main body 31 includes the bounding body 311 and the short body 312 to form the molded photosensitive assembly 30.

Further, as shown in FIG. 19B, the method for manufacturing the camera module further includes the following steps:

IV. The filter 20 is mounted to the short upper surface 3121 of the short body 312; and
V. The optical assembly 10 is mounted to the high upper surface 3111 of the bounding body 311.

More particularly, in step III, preferably the short upper surface of the short body is lower than the high upper surface of the bounding body, and the relative height of the short upper surface of the short body is lower than the height of the highest electronic device among the electronic devices.

In an example of the present invention, the electronic devices 32, the wires 34 and the edge of the photosensitive chip 33 are all embedded by the main body 31.

Exemplarily, as shown in FIG. 19A, step III further includes the following steps:

III.1 A molding material is injected between the upper die 41 and the lower die 42;
III.2 The molding material between the upper die 41 and the lower die 42 is cured to form the main body 31; and
III.3 The upper die 41 and the lower die 42 are drafted from the molded photosensitive assembly 30.

It is worth mentioning that, as shown in FIG. 19A, an angle G between the high inner side surface 3112 of the bounding body 311 and the short upper surface 3121 of the short body 312 is preferably more than or equal to 95°, so as to facilitate the drafting operation. More preferably, the angle G between the high inner side surface 3112 and the short upper surface 3121 is also less than 100°, so as to ensure that the molded structure can be formed smoothly and block some stray light. In addition, in order to ensure normal molding, a fillet radius between the high inner side surface 3112 and the short upper surface 3121 is substantially equal to 0.1 mm. In other words, since an angle between the normals of the high inner side surface 3112 of the bounding body 311 and the short upper surface 3121 can be referred to as a draft angle of the high inner side surface 3112, the draft angle of the high inner side surface 3112 of the bounding body 311 is between 5° and 10°.

It is worth noting that a draft angle of the short inner side surface 3122 of the short body 312 is preferably implemented to be between 5° and 10°. Particularly, a draft angle of an outer side surface of the bounding body 311 (that is, an outer side surface of the main body 31) is also implemented to be between 5° and 10°, which helps to successfully complete the drafting operation after molding.

As shown in FIG. 20, step IV further includes the following steps:

IV.1 The filter glue 220 is applied to the short upper surface 3121 in a C shape, so that a gap is reserved between two ends of the filter glue 220;
IV.2 The filter 20 is mounted to the filter glue 220;
IV.3 The filter glue 220 is cured; and
IV.4 The gap between the two ends of the filter glue 220 is filled with the filter glue 220 to form the square-like filter glue 220.

Furthermore, as shown in FIG. 20, in step IV.3, excess air between the filter 20 and the photosensitive chip 33 can escape from the gap to ensure an air pressure in the space between the optical assembly 10 and the photosensitive chip 33 is equal to the atmospheric pressure. Preferably, a length E of the gap is between 0.7 and 1.0 mm (that is, more than or equal to 0.7 mm and less than or equal to 1.0 mm), which ensures that a certain gap can still be reserved when the filter glue 220 is attached and extruded by the filter 20 to form an air escape hole, so that air can escape from the gap smoothly.

It is worth mentioning that the upper die 41 is shaped like the support cavity 300, so that after the upper die 41 is drafted, the support cavity 300 is formed between the main body 31 and the photosensitive chip 33.

Figure 21:
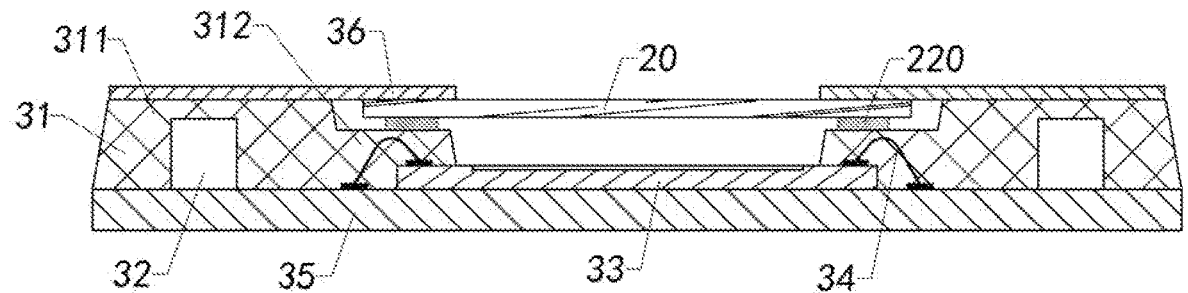
FIG. 21 is a schematic cross-sectional view of a possible mode of the filter and the molded photosensitive assembly of the camera module according to the third embodiment of the present invention.

A feasible mode of this preferred embodiment is shown in FIG. 21, wherein the molded photosensitive assembly 30 further includes an upper cover 36. The upper cover 36 is mounted on the high upper surface 3111 of the bounding body 311 and extends to cover the edge portion 22 of the filter 20, so that the filter 20 is held from bottom to top to enhance the stability of the filter 20. It is worth mentioning that the height of the upper cover 36 is smaller than the thickness of the filter 20 to reduce the thickness of the camera module.

Figure 22:
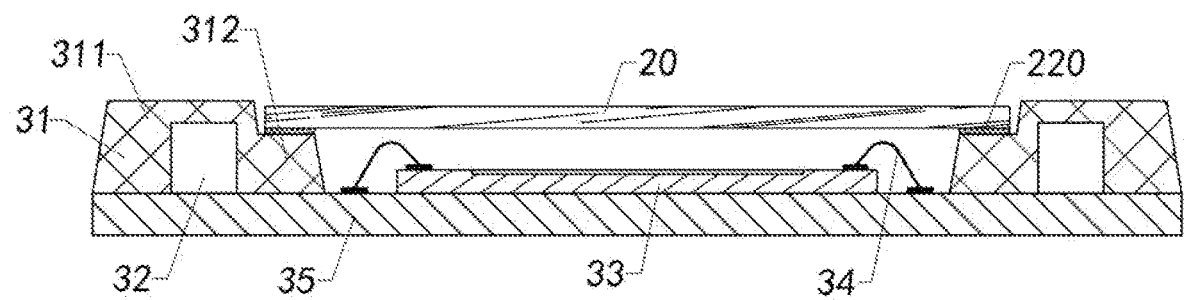
FIG. 22 is a schematic cross-sectional view of another possible mode of the filter and the molded photosensitive assembly of the camera module according to the third embodiment of the present invention.

Another feasible mode of this preferred embodiment is shown in FIG. 22. The difference from the above embodiment lies in that the short body 312 does not embed the wires 34 of the molded photosensitive assembly 30, so that the thickness of the camera module is lower than that in the above embodiment. This is because only the short body 312 is required to be higher than the wires 34 instead of completely embedding the wires 34. Therefore, the short body 312 can be lower, and the lower short body 312 and the bounding body 311 can adapt to the thickness of the filter 20.

Figure 23:
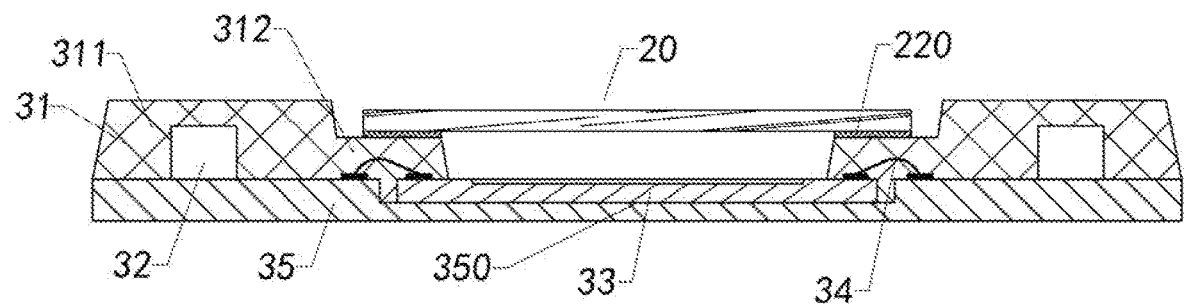
FIG. 23 is a schematic cross-sectional view of another possible mode of the filter and the molded photosensitive assembly of the camera module according to the third embodiment of the present invention.
Figure 24:
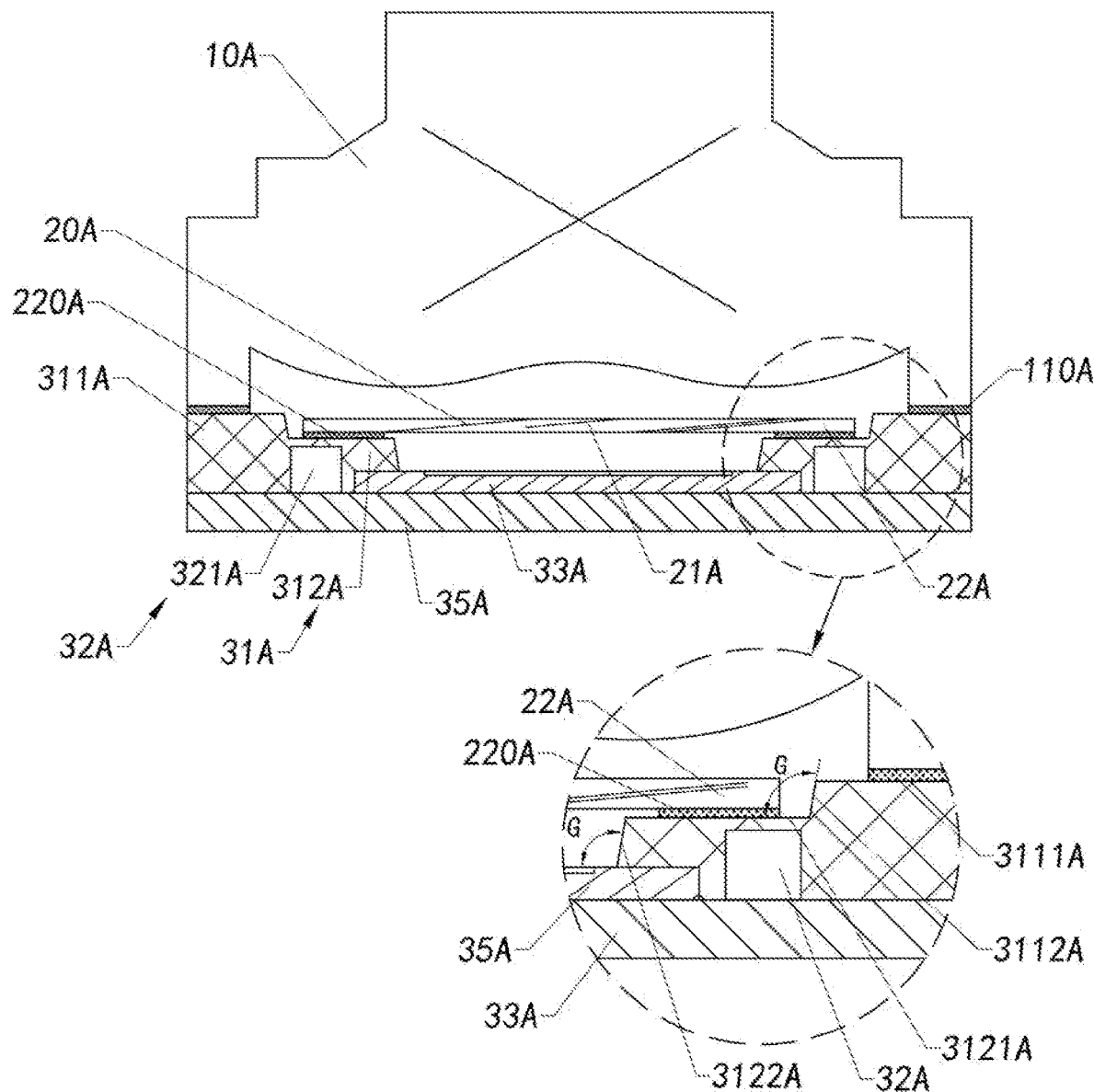
FIG. 24 is a schematic cross-sectional view of the camera module according to a fourth embodiment of the present invention.
Figure 25:
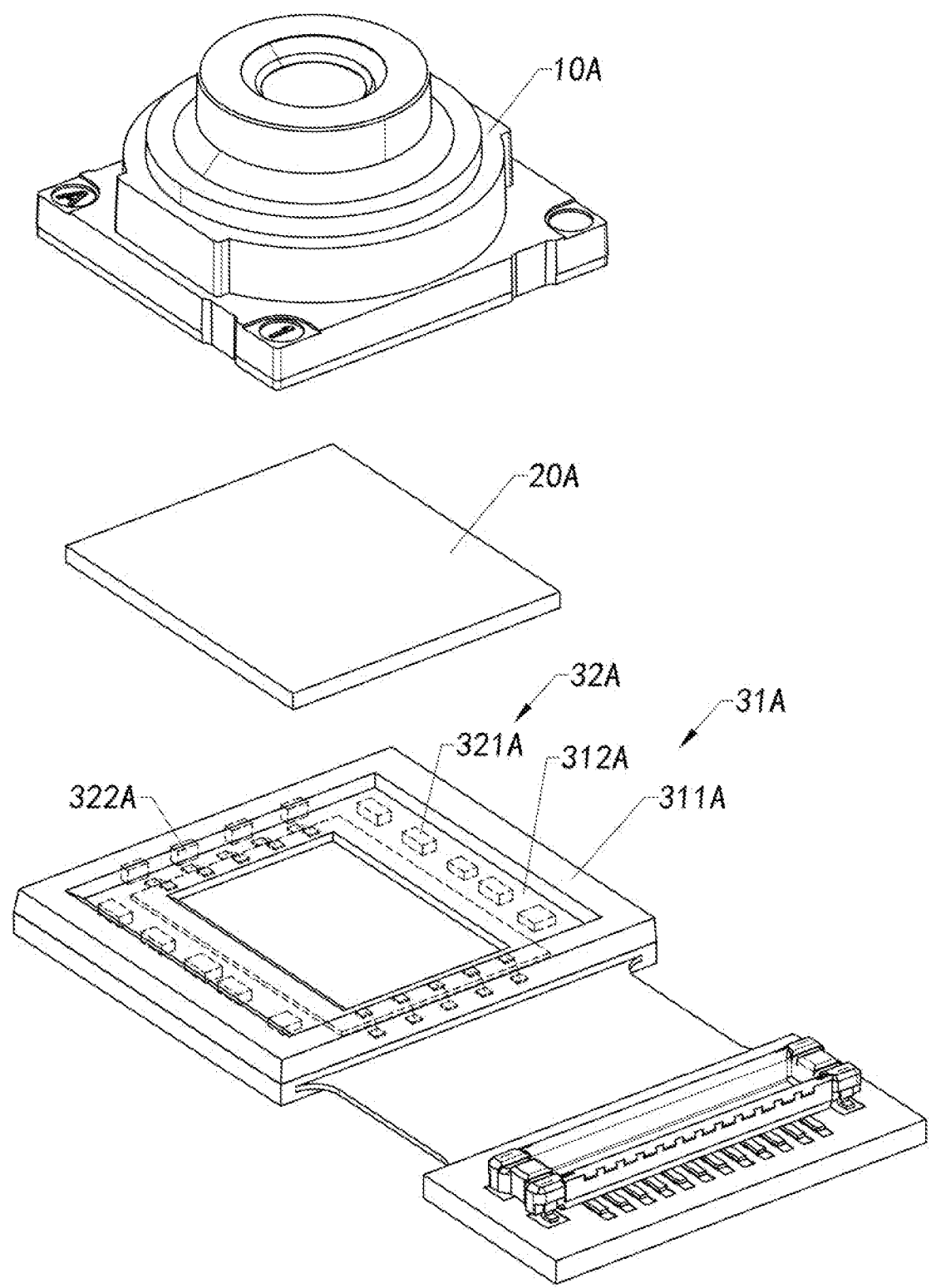
FIG. 25 is a three-dimensional schematic diagram of the camera module according to the fourth embodiment of the present invention.
Figure 26:
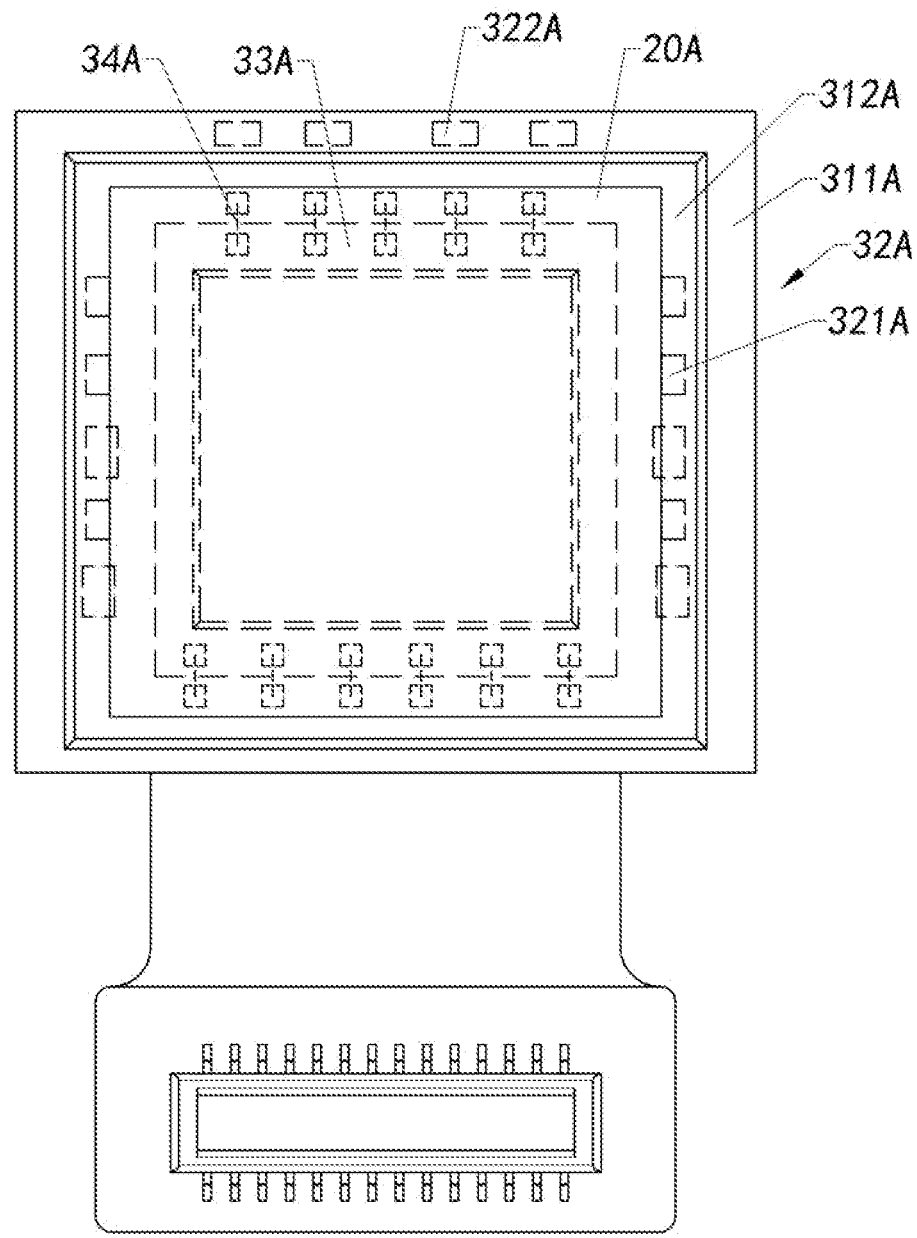
FIG. 26 is a schematic top view of a filter and a molded photosensitive assembly of the camera module according to the fourth embodiment of the present invention.

Another feasible mode of this preferred embodiment is shown in FIG. 23. The difference from the above embodiment lies in that the position where the photosensitive chip 33 is mounted is lower than the positions of the electronic devices 32 mounted on the circuit board 35. For example, there is a groove in a center of the connecting surface 350 of the circuit board 35, so that the photosensitive chip 33 is mounted in the groove of the circuit board 35. In addition, it is reasonable that the thickness of the camera module in this mode is lower than that of the camera module in the above embodiment, because the wires 34 are lower due to the sunken photosensitive chip 33.

It is worth mentioning that a fourth preferred embodiment of the present invention is shown in FIGS. 24 to 27. The difference from the third embodiment lies in that the electronic devices 32A, the wires 34A, and the photosensitive chip 33A are mainly embedded by the short body 312A. In other words, the short body 312A is higher than at least some of the electronic devices 32A to completely embed at least some of the electronic devices 32A in the main body 31A.

In this preferred embodiment, the filter 20A is mounted on the top of the short body 312A, and the optical assembly 10A is mounted on the top of the bounding body 311A. As the electronic devices 32A are mainly embedded by the short body 312A, the electronic devices 32A are only subjected to the pressure of the filter 20A, and do not bear the weight and movement of the optical assembly 10A, so that the electronic devices 32A can have longer lives. It is understandable that in this embodiment of the present invention, the filter 20A is firmly bonded to the short upper surface 3121A of the short body 312A through the filter glue 220A; and the optical assembly 10A is firmly bonded to the high upper surface 3111A of the bounding body 311A through the lens glue 110A, in order to ensure that the relative positions of the filter 20A and the optical assembly 10A to the photosensitive chip 33A remain unchanged.

It is worth mentioning that heights of different electronic devices 32A in the camera module of the present invention may be different, and in order to ensure that the short body 312A is not too high, the heights of the electronic devices 32A embedded in the short body 312A are preferably less than 0.3 mm. That is, in the present invention, the electronic devices with heights of less than 0.3 mm are referred to as short devices 321A among the electronic devices 32A, and the electronic devices with heights of more than or equal to 0.3 mm are referred to as high devices 322A among the electronic devices 32A. Then, the short devices 321A among the electronic devices 32A are embedded by the short body 312A, and the high devices 322A among the electronic devices 32A are embedded by the bounding body 311A. It is understandable that the short devices 321A among the electronic devices 32A of the present invention may be all embedded by the short body 312A (that is, in an top view direction, all of the short devices 321A are arranged in the short body 312A); or, the short devices 321A among the electronic devices 32A may be partially embedded by the short body 312A (that is, in the top view direction, some of the short devices 321A are arranged in the short body 312A).

More preferably, the wires 34A or the electronic devices 32A (that is, the short devices 321A) embedded in the short body 312A are arranged around the photosensitive chip 33A, and the wires 34A and the short devices 321A are respectively located on different sides of the photosensitive chip 33A; that is, the wires 34A and the electronic devices 32A embedded in the short body 312A are not sequentially arranged around the photosensitive chip 33A from inside to outside. In other words, the short devices 321A among the electronic devices 32A can be distributed according to the positions of the wires 34A, and the wires 34A are not arranged on all sides of the photosensitive chip 33A, so the short devices 321A among the electronic devices 32A can be preferably placed on one side or two sides of the photosensitive chip 33A without wires 34A, which can reduce an area of the circuit board, reduce an area of molding in the XY direction, and reduce an area of the camera module. It is understandable that since widths of the short devices 321A among the electronic devices 32A are usually about 0.25 mm, which is similar to the thickness of the short body 312A, if the short devices 321A among the electronic devices 32A are desired to be integrated into the short body 312A, the short devices 321A among the electronic devices 32A can only be arranged on the side of the photosensitive chip 33A where no wires are arranged, that is, the positions of the short devices 321A among the electronic devices 32A and the wires 34A are not compatible, so that gold wires cannot be bonded (that is, the wires 34A cannot be arranged) to the part of the short body 312A where the short devices 321A are arranged.

It is worth noting that the high devices 322A among the electronic devices 32A are preferably arranged on the side of the photosensitive chip 33A with the wires 34A, so that the bounding body 311A on the side of the photosensitive chip 33A without the wires 34A does not need to embed the electrical devices 32A. That is, the bounding body 311A does not necessarily avoid the electronic devices 32A. Therefore, the thickness of the bounding body 311A can be reduced, and the thickness of the short body 312A can be slightly increased. Preferably, the thickness of the bounding body 311A is smaller than that of the short body 312A, so that compared with the third preferred embodiment, the short body 312A can provide the larger short upper surface 3121A to support the edge portion 22A of the filter 20A, and the filter 20A can be stably mounted on the short body 312A.

In this preferred embodiment, the angle G between the high inner side surface 3112A and the short upper surface 3121A may be more than or equal to 100°. In other words, the bounding body 311A extends obliquely out of the top of the short body 312A, so that the bounding body 311A is well supported and can support the optical assembly 10A without affecting the filter 20A. That is, the angle G is formed in the case of drafting in the manufacturing method, and the short inner side surface 3122A and the photosensitive chip 33A are also inclined, similar to the angle G, so as to provide a stable support force.

Figure 27:
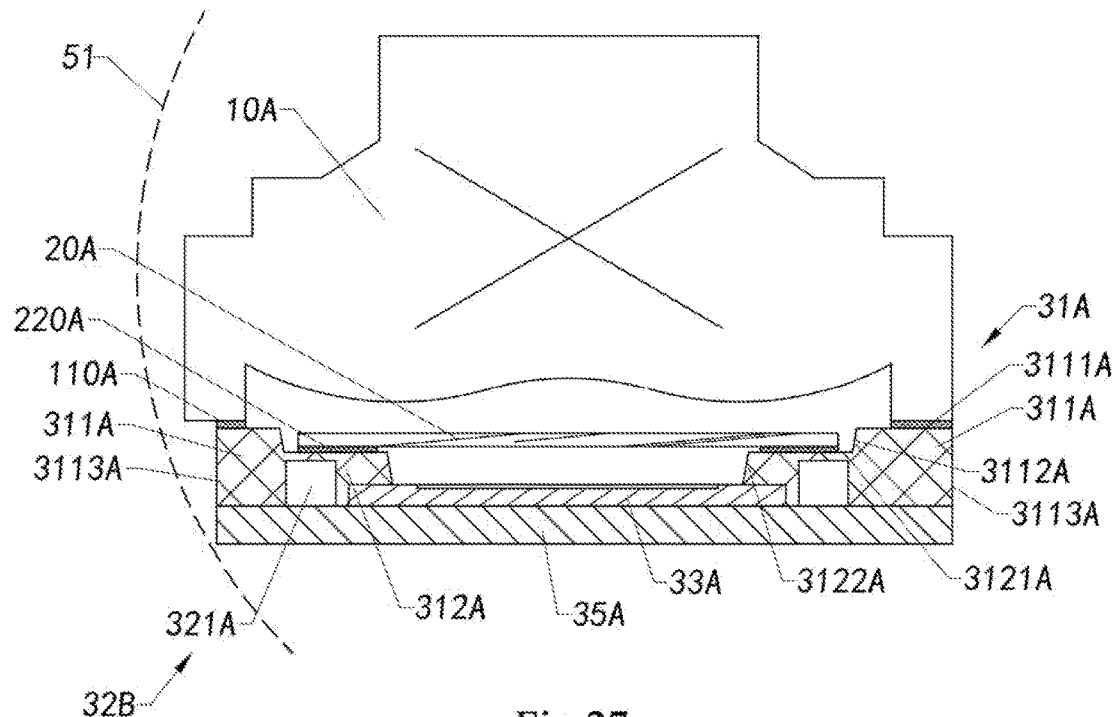
FIG. 27 is a schematic cross-sectional view of the filter and the molded photosensitive assembly of the camera module according to the fourth embodiment of the present invention, illustrating a possible installation mode in a smart phone.

In this preferred embodiment, the bounding body 311A is designed to support the optical assembly 10A. Preferably, as shown in FIG. 27, the high upper surface 3111A of the bounding body 311A is asymmetric on four sides, that is, the thicknesses of the bounding body 311A on the four sides of the high upper surface 3111A are different, so that the optical assembly 10A protrudes outward from a part with a smaller thickness on the bounding body 311A relative to the bounding body 311A, which helps to improve the degree of fitness between the camera module and the mounting shell 51 of the intelligent device. In other words, in order to adapt to the mounting shell 51 of the intelligent device, a thickness of a part adjacent to the mounting shell 51 on the bounding body 311A is small, so that the optical assembly 10A is slightly out of alignment with the molded photosensitive assembly 30A, that is, the optical assembly 10A is biased toward the mounting shell 51 to improve the degree of fitness between the camera module and the mounting shell 51 of the intelligent device. Compared with the third embodiment in FIG. 18, since the bounding body 311A does not need to consider the electronic devices 32A, the height of the bounding body 311A can be reduced, and the leg 111A of the optical assembly 10A has a lower position supported on the high upper surface 3111A; at the same time, the thickness of the bounding body 311A can also be further reduced, so that the optical assembly 10A is further closer to the mounting shell 51 of the intelligent device.

According to another aspect of the present invention, the fourth embodiment of the present invention further provides a method for manufacturing the camera module, including the following steps:

I A photosensitive chip 33A, some wires 34A and some electronic devices 32A are connected to a circuit board 35A;

II The connected circuit board 35A is placed between an upper die and a lower die; and III The electronic devices 32A are embedded in a main body 31A and on the circuit board 35A to form a molded photosensitive assembly 30A, wherein the main body 31A includes a bounding body 311A and a short body 312A whose height is lower than that of the bounding body 311A, and at least some of the electronic devices 32A are embedded by the short body 312A.

Further, the method for manufacturing the camera module further includes the following steps:

IV A filter 20A is mounted on a short upper surface 3121A of the short body 312A; and V An optical assembly 10A is mounted on the bounding body 311A.

In an example of the present invention, the electronic devices 32A include at least one short device 321A, wherein at least a part of the short device 321 is embedded by the short upper surface 3121A of the short body 312A, and a height of each short device 321 is less than 0.3 mm.

In an example of the present invention, the wires 34A are embedded by the short body 312A, wherein the wires 34A and the short devices 321A are arranged around the photosensitive chip 33A, and the wires 34A and the short devices 321A are respectively located on different sides of the photosensitive chip 33A.

In an example of the present invention, a thickness of at least one side of the bounding body 311A is smaller than the thickness of the short body 312A, so that the optical assembly 10A protrudes outward from the at least one side of the bounding body 311A relative to the molded photosensitive assembly 30A.

In an example of the present invention, the electronic devices 32A further include at least one high device 322A, wherein the high devices 322A are embedded by the bounding body 311A, and a height of each high device 322A is more than or equal to 0.3 mm.

In an example of the present invention, the high devices 322A and the wires 34A are located on the same side of the photosensitive chip 33A.

In an example of the present invention, an angle between a high inner side surface 3112A of the bounding body 311A and the short upper surface 3121A of the short body 312A is more than or equal to 100°.

It is worth mentioning that for an IOM-based product structure, in order to improve the degree of fitness between the camera module and the mounting shell of the intelligent device, the optical assembly 10 (or 10A) of the camera module is eccentrically arranged on the molded photosensitive assembly 30 (or 30A) in terms of design as shown in FIG. 18 (or FIG. 27), so that at least one side of the optical assembly 10 (or 10A) protrudes outward from the main body 31 (or 31A) of the molded photosensitive assembly 30 (or 30A); but the lens in the optical assembly 10 (or 10A) and the photosensitive chip 33 (or 33A) in the molded photosensitive assembly 30 (or 30A) need to be optically aligned, so it can only be considered to reduce the thickness of the bounding body 311 (or 311A) of the main body 31 (or 31A) on the corresponding side. However, the reduction in the thickness of the bounding body 311 (or 311A) will result in the narrowing of the lens glue 110 (or 110A), and once the lens glue 110 (or 110A) is too narrow, the bonding strength between the optical assembly 10 (or 10A) and the molded photosensitive assembly 30 (or 30A) is insufficient, and the glue material of the lens glue 110 (or 110A) is prone to infiltration to contaminate the filter 20 (or 20A).

In addition, a certain assembly space needs to be reserved between the high inner side surface 3112 (or 3112A) of the bounding body 311 (or 311A) and the filter 20 (or 20A), which causes the adjustable range of the thickness of the bounding body 311 (or 311A) to become very small, so that the thickness of the bounding body 311 (or 311A) is difficult to reduce, and the degree of fitness between the camera module and the mounting shell of the intelligent device cannot be improved. Therefore, in order to solve the above problem, as shown in FIGS. 28 to 33C, a fifth preferred embodiment of the present invention further provides a camera module. The difference from the third and fourth preferred embodiments is that the bounding body 311B of the main body 31B of the molded photosensitive assembly 30B has a high upper surface 3111B and a low upper surface 3110B, wherein a height of the bounding body 311B at the high upper surface 3111B is greater than a height of the bounding body 311B at the low upper surface 3110B, that is, the distance between the high upper surface 3111B and the circuit board 35B is greater than the distance between the low upper surface 3110B and the circuit board 35B, so that a part of the optical assembly 10B is supported on the high upper surface 3111B of the bounding body 311B, and the other part of the optical assembly 10B is supported on the low upper surface 3110B of the bounding body 311B.

In other words, the bounding body 311B of the molded photosensitive assembly 30B is discontinuous, that is, the upper surface of the bounding body 311B is discontinuous, and includes the high upper surface 3111B and the low upper surface 3110B lower than the high upper surface 3111B, so that a part of the optical assembly 10B can be connected to the high upper surface 3111B of the bounding body 311B through the lens glue 110B, and the other part of the optical assembly 10B can also be connected to the low upper surface 3110B of the bounding body 311B through the lens glue 110B.

Exemplarily, the lens glue 110B of the camera module may include, but is not limited to, a fixed glue layer 1101B and a glue filling layer 1102B. The fixed glue layer 1101B is arranged between the optical assembly 10B and the high upper surface 3111B of the bounding body 311B, so that the optical assembly 10B is fixedly connected to and supported on the high upper surface 3111B of the bounding body 311B through the fixed glue layer 1101B. The glue filling layer 1102B is arranged between the optical assembly 10B and the low upper surface 3112B of the bounding body 311B, so that the optical assembly 10B is reinforced and supported on the bounding body 311B through the glue filling layer 1102B.

Preferably, the lens glue 110B is applied according to a shape of the high upper surface 3111B of the bounding body 311B, to form the fixed glue layer 1101B matching the shape of the high upper surface 3111B of the bounding body 311B, thereby maximizing the connection strength between the optical assembly 10B and the molded photosensitive assembly 30B. Next, after the lens glue 110B is cured to form the fixed glue layer 1101B, the lens glue is supplemented between the optical assembly 10B and the low upper surface 3112B of the bounding body 311B to form the glue filling layer 1102B matching a shape of the low upper surface 3112B of the bounding body 311B, so that the glue filling layer 1102B can not only reinforce and support the optical assembly 10B on the bounding body 311B, but can also seal a space between the optical assembly 10B and the molded photosensitive assembly 30B to prevent external dust from entering to contaminate the optical assembly 10B and/or the filter 20B.

It is worth noting that, because the low upper surface 3110B of the bounding body 311B is lower than the high upper surface 3111B, a gap between the low upper surface 3110B of the bounding body 311B and the leg 111B of the optical assembly 10B is larger than a gap between the high upper surface 3111B of the bounding body 311B and the leg 111B, that is, a thickness of the glue filling layer 1102B between the low upper surface 3110B of the bounding body 311B and the optical assembly 10B is greater than a thickness of the fixed glue layer 1101B between the high upper surface 3111B of the bounding body 311B and the optical assembly 10B, which helps to ensure sufficient bonding strength between the optical assembly 10B and the molded photosensitive assembly 30B, and can further reduce the thickness of the bounding body 311B at the low upper surface 3110B, so that the degree of fitness between the camera module and the mounting shell of the intelligent device is improved.

Figure 29:
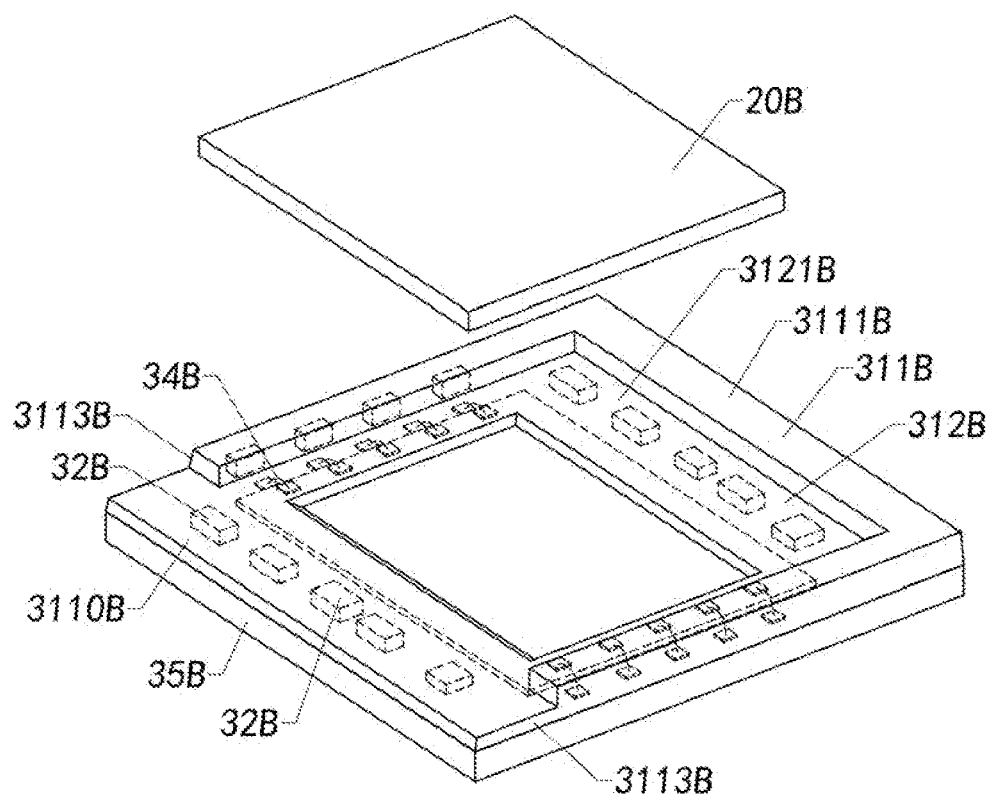
FIG. 29 is an exploded schematic diagram of a filter and a molded photosensitive assembly of the camera module according to the fifth embodiment of the present invention.

More specifically, in this preferred embodiment, as shown in FIG. 29, the high upper surface 3111B of the bounding body 311B is U-shaped, the low upper surface 3110B of the bounding body 311B is linear shaped, and the low upper surface 3110B of the bounding body 311B extends from one high outer side 3113B of the bounding body 311B to the other high outer side 3113B of the bounding body 311B (that is, a length of the low upper surface 3110B of the bounding body 311B is equal to a distance between the two high outer sides 3113B of the bounding body 311B, which is also referred to as an external dimension of the bounding body 311B), so as to form a U-shaped groove in the main body 31B. In other words, the high upper surface 3111B of the bounding body 311B corresponds to three sides of the optical assembly 10B, and the low upper surface 3110B of the bounding body 311B corresponds to one side of the optical assembly 10B, so that the optical assembly 10B is supported on the high upper surface 3111B of the bounding body 311B on three sides, and supported on the low upper surface 3110B of the bounding body 311B on one side. It is understandable that the glue filling layer 1102B on the short upper surface 3121B of the short body 312B is thicker than the fixed glue layer 1101B on the high upper surface 3111B of the bounding body 311B to maintain the optical assembly 10B parallel to the filter 20B.

Preferably, the fixed glue layer 1101B of the lens glue 110B may be U-shaped to match the high upper surface 3111B of the bounding body 311B. The glue filling layer 1102B of the lens glue 110B may be linear shaped to match the low upper surface 3112B of the bounding body 312B. In this way, the fixed glue layer 1101B and the glue filling layer 1102B are combined to form the lens glue 110B with a hollow square-shaped structure, so as to seal the space between the optical assembly 10B and the molded photosensitive assembly 30B and prevent external dust from entering to contaminate the optical assembly 10B and/or the filter 20B.

It is worth noting that in some embodiments of the present invention, the electronic devices 321B are suitable to be embedded by the bounding body 311B of the main body 31B due to their relatively large heights, and are located below the high upper surface 3111B of the bounding body 311B. That is, the electronic devices 321B are suitable to be arranged on three sides of the photosensitive chip 33B, and the electronic devices 321B correspond to the high upper surface 3111B of the bounding body 311B.

Further, the low upper surface 3110B of the bounding body 311B is in a same height with the short upper surface 3121B of the short body 312B, that is, the height of the bounding body 311B at the low upper surface 3110B is equal to the height of the short body 312B. In this way, the bounding body 311B does not require any avoidance space for the filter 20B at the low upper surface 3110B, which further reduces the thickness of the bounding body 311B on the side corresponding to the low upper surface 3110B, thereby increasing the degree of outward protrusion of the optical assembly 10B at the low upper surface 3110B of the bounding body 311B, and further improving the degree of fitness between the camera module and the mounting shell of the intelligent device.

Figure 28:
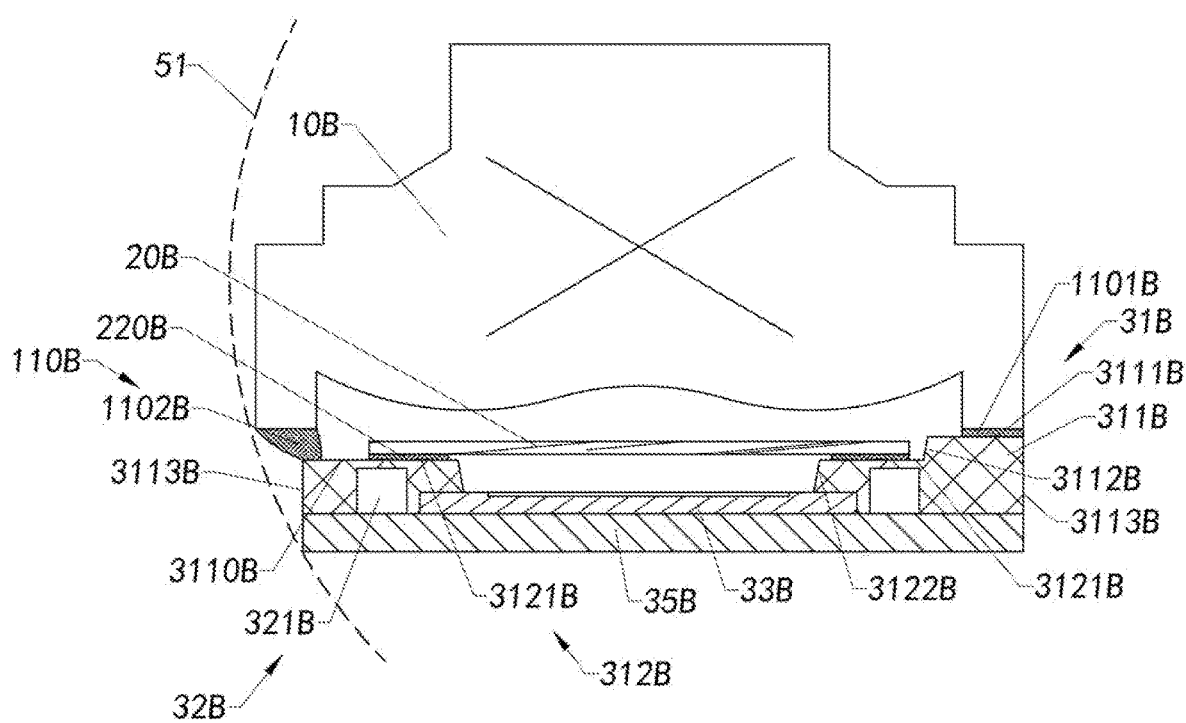
FIG. 28 is a schematic cross-sectional view of the camera module according to a fifth embodiment of the present invention.

Exemplarily, as shown in FIG. 28, in order to adapt to the mounting shell 51 with rounded corners in the intelligent device, the optical assembly 10B protrudes outward from the low upper surface 3110B of the bounding body 311B (that is, a side of the main body 31B corresponding to the low upper surface 3110B), so that the optical assembly 10B of the camera module is closer to the mounting shell 51 of the intelligent device to increase the screen-to-body ratio of the intelligent device.

Figure 30:
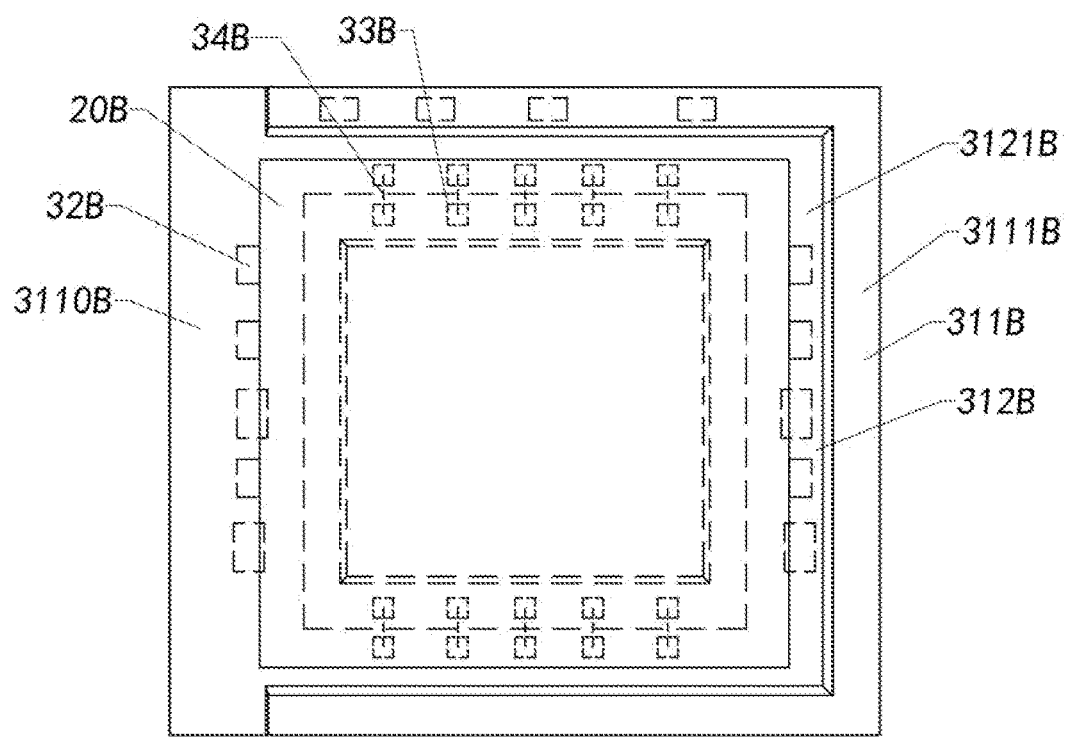
FIG. 30 is a schematic top view of the filter and the molded photosensitive assembly of the camera module according to the fifth embodiment of the present invention.

As shown in FIGS. 28 to 30, the bounding body 311B is molded into a U-shaped structure, while the short body 312B extends to the inner side of the bounding body 311B and is molded into a square shape, so that a U-shaped groove is formed inside the main body 31B. That is, the bounding body 311B of the main body 31B has a notch at the low upper surface 3110B, and when the optical assembly 10B is bonded to the low upper surface 3110B of the bounding body 311B through the lens glue 110B, an air escape passage is formed between the optical assembly 10B and the low upper surface 3110B of the bounding body 311B, so that when the lens glue 110B is heated and cured, the air between the optical assembly 10B and the filter 20B can escape via the air escape passage, which prevents the air between the optical assembly 10B and the filter 20B from expanding due to heating to damage the filter 20B or the optical assembly 10B. It can be understood that, similar to the third embodiment and the fourth embodiment, the filter 20B in this embodiment of the present invention is also supported on the short upper surface 3121B of the short body 312B.

Figure 31:
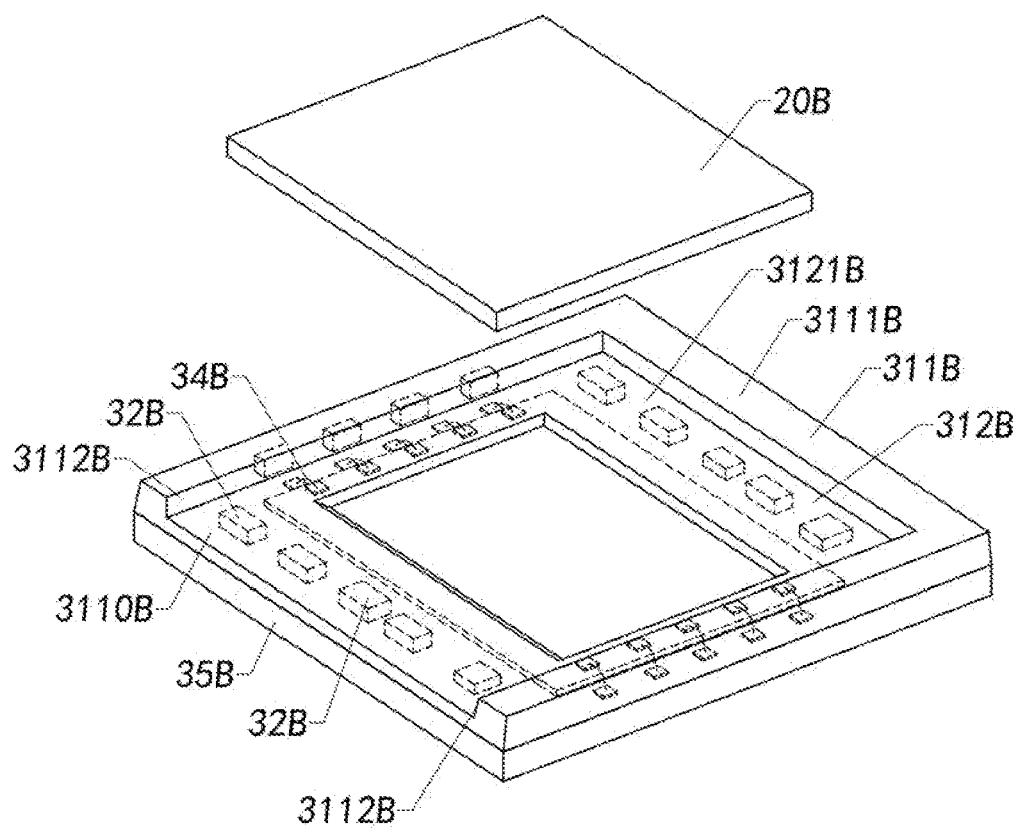
FIG. 31 is a modified implementation mode of the camera module according to the fifth embodiment of the present invention.

As shown in FIG. 31, the bounding body 311B is molded into another feasible mode. The low upper surface 3110B of the bounding body 311B extends from one high inner side surface 3112B of the bounding body 311B to the other high inner side surface 3112B of the bounding body 311B (that is, the length of the low upper surface 3110B of the bounding body 311B is equal to a distance between the two high inner side surfaces 3112B of the bounding body 311B, which is also referred to as an internal dimension of the bounding body 311B), so that the bounding body 311B has the larger high upper surface 3111B to stably support the optical assembly 10B.

Figure 32:
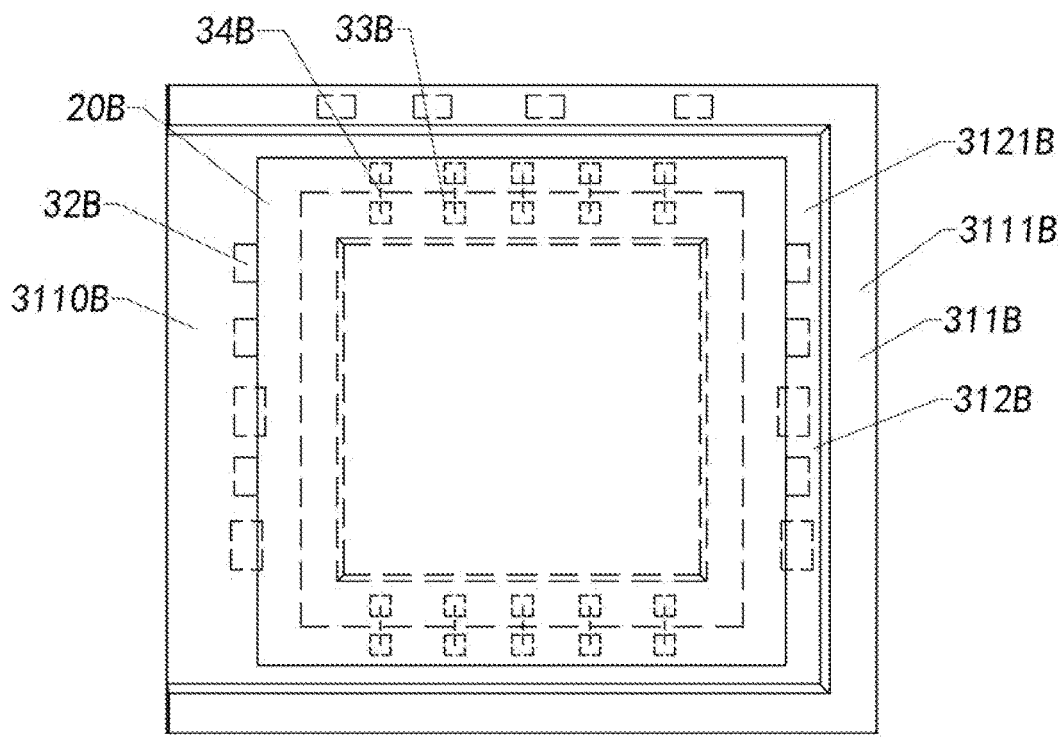
FIG. 32 is a schematic top view of the filter and the molded photosensitive assembly of the camera module according to the above-mentioned modified implementation mode of the present invention.
Figure 33A:
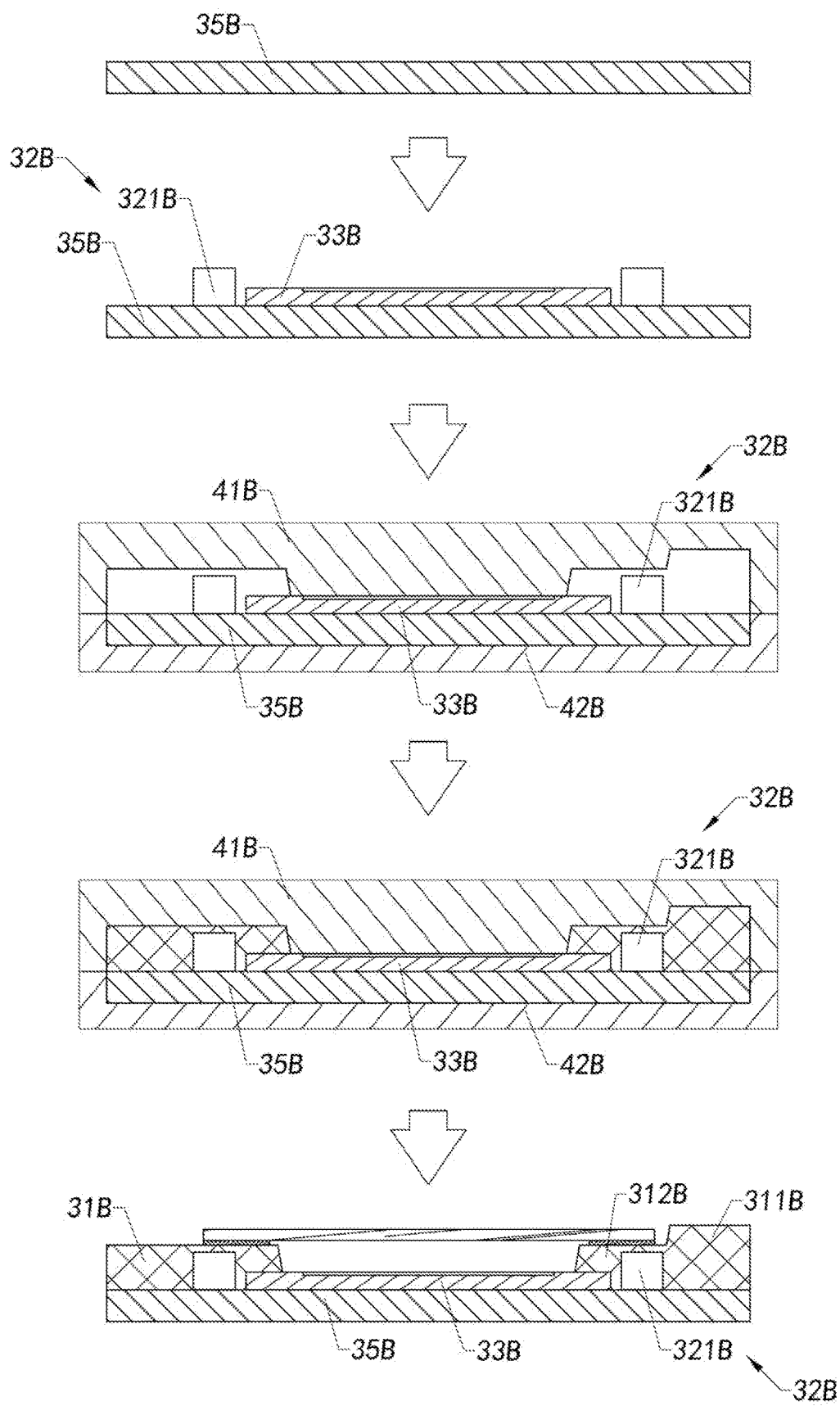
FIGS. 33A to 33C are schematic flowcharts of a method for manufacturing the camera module according to the above-mentioned modified implementation mode of the present invention.
Figure 33B:
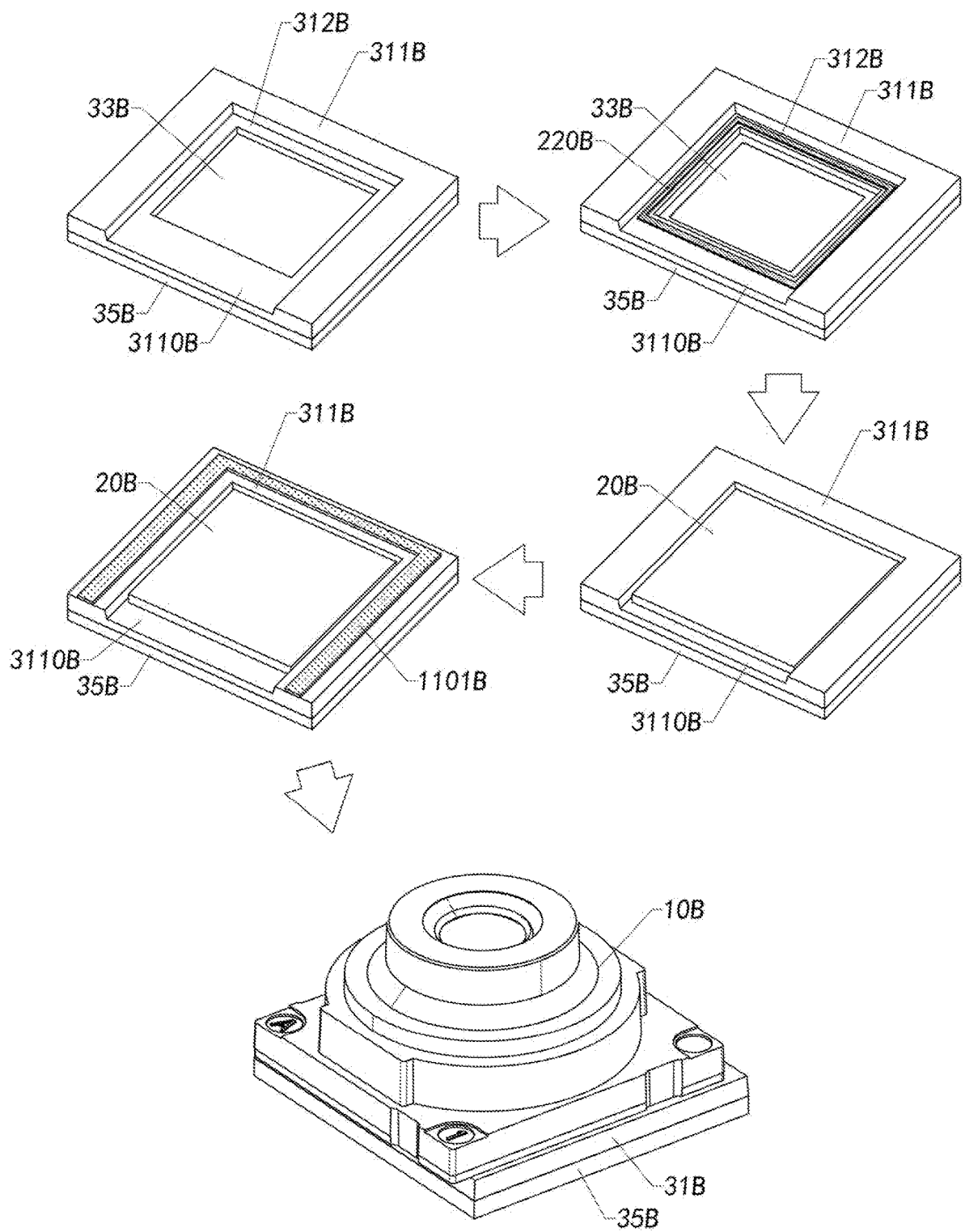
Figure 33C:
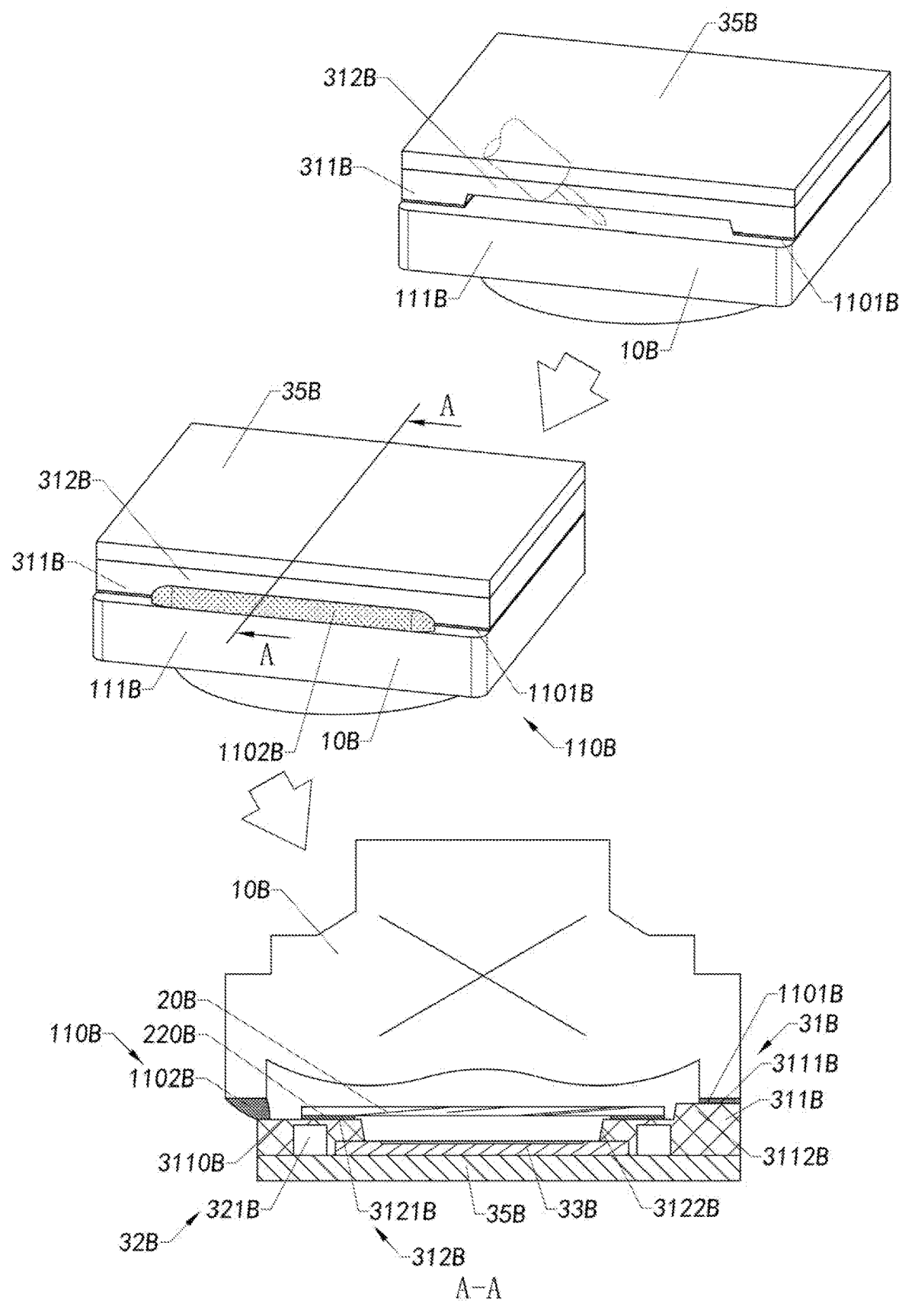

A method for manufacturing the camera module is shown in FIGS. 32 to 33C. The manufacturing method includes the following steps:

I The photosensitive chip 33B, the wires 34B and the electronic devices 32B are connected to the circuit board 35B;

II The connected circuit board 35B is placed between an upper die 41B and a lower die 42B;

III The electronic devices 32B are embedded in a main body 31B and on the circuit board 35B to form a molded photosensitive assembly 30B, wherein the main body 31B includes a bounding body 311B and a short body 312B whose height is lower than that of the bounding body 311B;

IV The filter 20B is mounted on the short upper surface 3121B of the short body 312B; and V The optical assembly 10B is eccentrically arranged on the bounding body 311B, so that the optical assembly 10B is close to at least one side of a mounting shell 51.

Further, step V of the method for manufacturing the camera module may include the following steps:

V.1 The optical assembly 10B is fixed to a high upper surface 3111B of the bounding body 311B; and V.2 The optical assembly 10B is reinforced to a low upper surface 3110B of the bounding body 311B, wherein the low upper surface 3110B is lower than the high upper surface 3111B.

In an example of the present invention, the high upper surface 3111B of the bounding body 311B in step III is U-shaped, so that the optical assembly is supported on the high upper surface 3111B of the bounding body 311B on three sides, and supported on the low upper surface 3110B of the bounding body 311B on one side.

In an example of the present invention, the low upper surface 3110B of the bounding body 311B is in a same height with the short upper surface 3121B of the short body 312B.

In an example of the present invention, the low upper surface 3110B of the bounding body 311B extends from one high outer side surface 3113B of the bounding body 311B to the other high outer side surface 3113B of the bounding body 311B.

In another example of the present invention, the low upper surface 3110B of the bounding body 311B extends from one high inner side surface 3112B of the bounding body 311B to the other high inner side surface 3112B of the bounding body 311B.

It is worth mentioning that in step V.1 of the present invention, a lens glue 110B is applied to the high upper surface 3111B of the bounding body 311B to form a fixed glue layer 1101B between the optical assembly 10B and the high upper surface 3111B of the bounding body 311B.

Further, step V.2 of the present invention further includes the following steps:

V.2.1 The optical assembly 10B and the molded photosensitive assembly 30B are inverted, so that the optical assembly 10B is located on a lower side of the molded photosensitive assembly 30B; and V.2.2 The lens glue 110B is applied between the leg 111B of the optical assembly 10B and the low upper surface 3110B of the bounding body 311B to form a glue filling layer 1102B.

It can be understood that as the optical assembly 10B and the molded photosensitive assembly 30B are inverted, the lens glue 110B has no chance to flow into the incident surface 211B of the filter portion 21B, so that the filter 20B is maintained clean and supported firmly.

In an example of the present invention, the fixed glue layer 1101B is U-shaped, and the glue filling layer 1102B is linear shaped.

In an example of the present invention, the fixed glue layer 1101B is L-shaped, and the glue filling layer 1102B is L-shaped.

Particularly, in an example of the present invention, an angle between the high inner side surface 3112B of the bounding body 311B and the short upper surface 3121B of the short body 312B is between 95° and 100°.

It is worth mentioning that when the high upper surface 3111B of the bounding body 311B is U-shaped, the low upper surface 3110B of the bounding body 311B will be linear shaped and located on a separate side of the main body 31B, so that the optical assembly 10B of the camera module can protrude outward from the side where the low upper surface 3110B is located relative to the molded photosensitive assembly 30B, the optical assembly 10B can be extremely close to the mounting shell of the intelligent device on the side where the low upper surface 3110B is located, and the camera module is suitable to be mounted in a non-corner region of the mounting shell to be unilaterally adjacent to the mounting shell. However, when the camera module is mounted in a corner region of the mounting shell of the intelligent device, the optical assembly 10B cannot be close to the mounting shell on two sides due to the fact that the low upper surface 3110B is only on one side of the main body 31B, resulting in insufficient degree of fitness between the camera module and the mounting shell.

Figure 34:
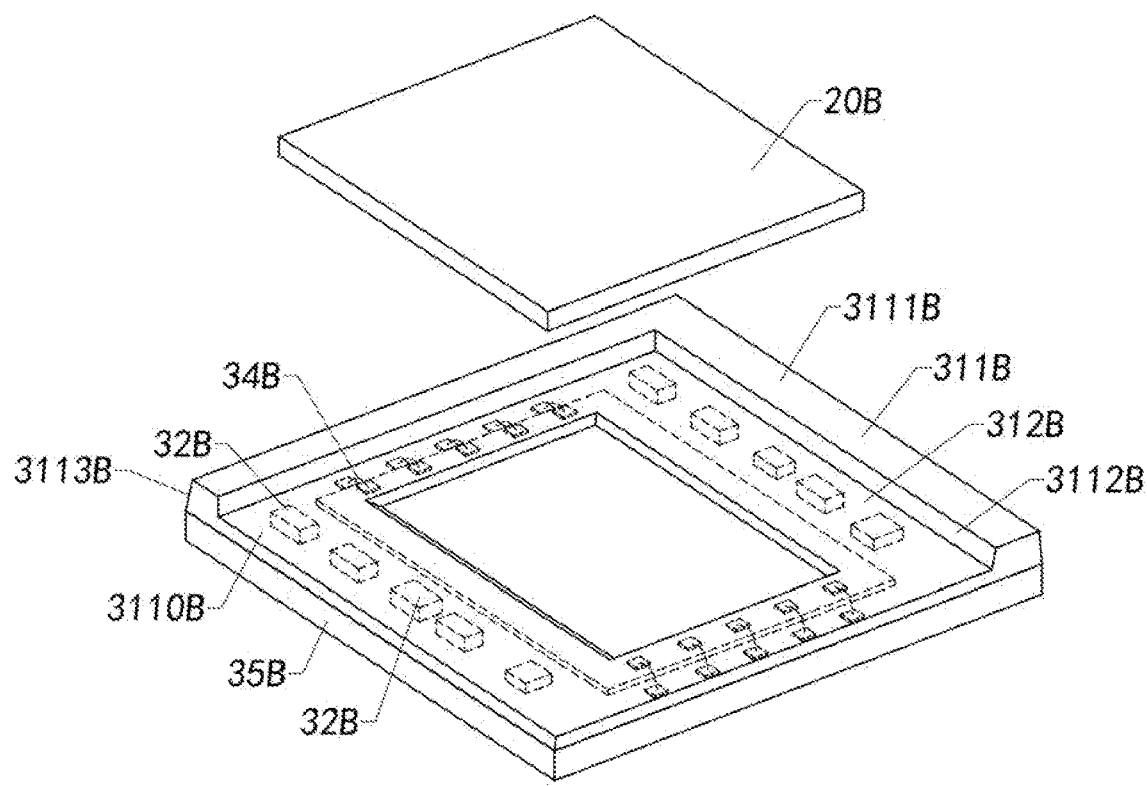
FIGS. 34 and 35 show another modified implementation mode of the camera module according to the fifth embodiment of the present invention.
Figure 35:
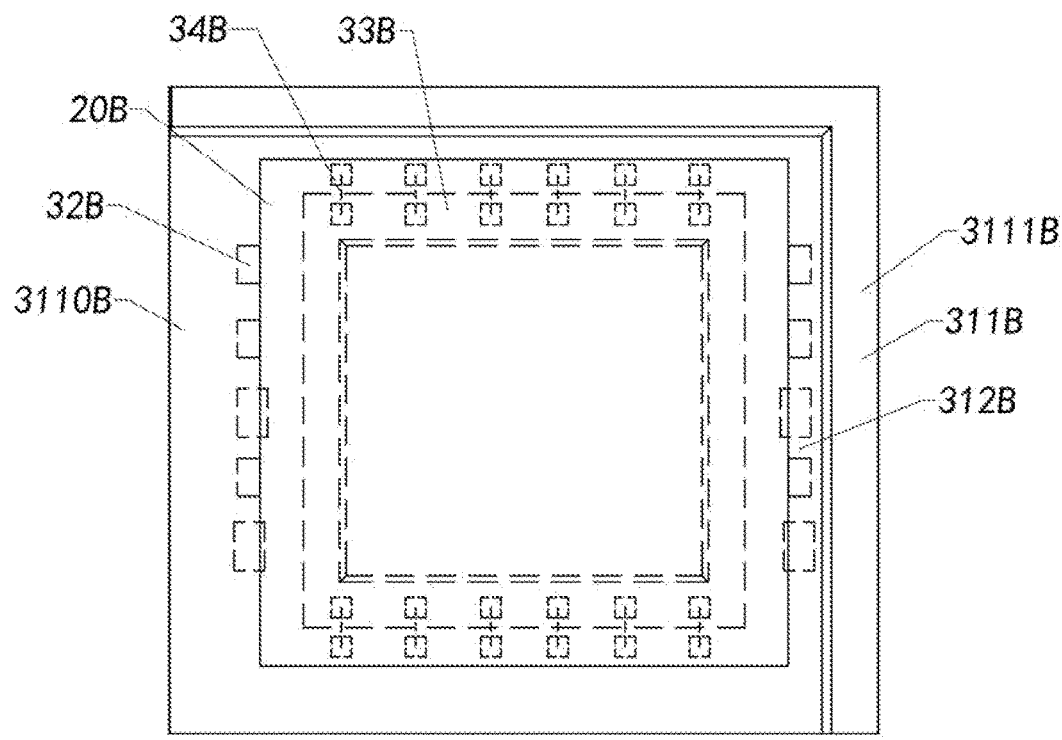

Therefore, in order to solve the above problem, the present invention further provides another modified implementation mode of the camera module, as shown in FIGS. 34 and 35. The high upper surface 3111B of the bounding body 311B is L-shaped, and the low upper surface 3110B of the bounding body 311B is also L-shaped, so that the low upper surface 3110B is located on two adjacent sides of the main body 31B. That is, in this modified implementation mode of the present invention, the high upper surface 3111B of the bounding body 311B of the molded photosensitive assembly 30B of the camera module is L-shaped, so that the optical assembly 10B is supported on the high upper surface 3111B of the bounding body 311B on two adjacent sides, and supported on the low upper surface 3110B of the bounding body 311B on two adjacent sides. In this way, the optical assembly 10B of the camera module can protrude relative to the molded photosensitive assembly 30B from the two sides where the low upper surface 3110B is located, and the optical assembly 10B can be extremely close to the mounting shell of the intelligent device on the two sides where the low upper surface 3110B is located, so that the camera module is suitable to be mounted in a corner region of the mounting shell, and the optical assembly 10B is bilaterally adjacent to the mounting shell to maximize the screen-to-body ratio of the intelligent device.

Preferably, the fixed glue layer 1101B of the lens glue 110B may be L-shaped to match the high upper surface 3111B of the bounding body 311B. The glue filling layer 1102B of the lens glue 110B may also be L-shaped to match the low upper surface 3112B of the bounding body 312B. In this way, the fixed glue layer 1101B and the glue filling layer 1102B are combined to form the lens glue 110B with a hollow square-shaped structure, so as to seal the space between the optical assembly 10B and the molded photosensitive assembly 30B and prevent external dust from entering to contaminate the optical assembly 10B and/or the filter 20B.

It is worth noting that in some embodiments of the present invention, the electronic devices 321B are suitable to be embedded by the bounding body 311B of the main body 31B due to their relatively large heights, and are located below the high upper surface 3111B of the bounding body 311B. That is, the electronic devices 321B are suitable to be arranged on two sides of the photosensitive chip 33B, and the electronic devices 321B correspond to the high upper surface 3111B of the bounding body 311B.

A person skilled in the art should understand that the above descriptions and the embodiments of the present invention shown in the accompanying drawings are only examples and do not limit the present invention. The objects of the present invention are completely and effectively achieved. The functions and structural principles of the present invention are shown and explained in the embodiments, and the implementation modes of the present invention may have any variation or modification without departing from the principles.

What is claimed is:

1. A molded photosensitive assembly, characterized by comprising:
   an imaging assembly, wherein the imaging assembly includes a circuit board and at least one photosensitive element and a plurality of electronic components, and each photosensitive elements is conductively connected to the circuit board, and each electronic component is mounted to the circuit board at intervals;
   a molded base, wherein the molded base embeds a part of the imaging assembly, and the molded base has a light window, and a photosensitive region of each photosensitive element respectively corresponds to each light window of the molded base, and the molded base includes at least one first base portion and at least one second base portion, and each second base portion integrally extends inward from an inner circumferential surface of each first base portion along the circuit board, and a first top surface of each first base portion is higher than a second top surface of the second base portion, and the second top surface is lower than a top surface of at least one of the electronic component; and
   a filter assembly, wherein the filter assembly includes at least one filter element, and each filter element respectively corresponds to each light window of the molded base.

2. The molded photosensitive assembly according to claim 1, wherein the circuit board includes a chip mounting region and an edge region located around the chip mounting region, and each electronic component is mounted on a circuit board outer portion of the edge region of the circuit board, and a height of the first base portion of the molded base is higher than the height of each electronic component, and each electronic component is embedded by the first base portion.

3. The molded photosensitive assembly according to claim 1, wherein the photosensitive element includes a photosensitive region and a non-photosensitive region located around the photosensitive region, and the first base portion of the molded base embeds at least a part of the non-photosensitive region of the photosensitive element.

4. The molded photosensitive assembly according to claim 1, wherein an inclination angle of a first inner circumferential surface of each first base portion relative to a photosensitive surface of the photosensitive element is less than 30°, and an inclination angle of a second inner circumferential surface of each second base portion relative to the photosensitive surface of the photosensitive element is less than 30°.

5. The molded photosensitive assembly according to claim 1, wherein the filter assembly further includes at least one glue layer, and each glue layer is arranged between each filter element and each second base portion, so that each filter element is fixedly arranged on each second base portion of the molded base through each glue layer.

6. The molded photosensitive assembly according to claim 5, wherein each glue layer is formed by curing glue applied to the second top surface of each second base portion, and each glue layer is located between a lower surface of each filter element and a second top surface of each second base portion.

7. The molded photosensitive assembly according to claim 6, wherein each second base portion is further provided with at least one glue recess, wherein each glue recess is sunken downward from the second top surface of each second base portion to form a recess for holding the glue.

8. The molded photosensitive assembly according to claim 6, wherein each glue layer is formed by curing glue applied to a lower surface of each filter element, and each glue layer is located between the lower surface of each filter element and the second top surface of each second base portion.

9. The molded photosensitive assembly according to claim 6, further including a mounting gap, wherein the mounting gap is located between the filter element and the first inner circumferential surface of the first base portion.

10. The molded photosensitive assembly according to claim 6, wherein each glue layer has at least one air escape hole, and each air escape hole extends from an inner side of the glue layer to an outer side of the glue layer to communicate a space between the filter element and the photosensitive element with an outer space of the molded photosensitive assembly.

11. The molded photosensitive assembly according to claim 1, wherein the filter assembly further includes at least one glue layer and at least one annular support element, wherein each glue layer is located between an upper surface of each filter element and each support element, so that each filter element is fixedly mounted to each support element through each glue layer, wherein each support element is correspondingly arranged on the first base portion of the molded base, so that each filter element is located in each stepped peripheral groove of the molded base.

12. The molded photosensitive assembly according to claim 1, wherein the imaging assembly further includes at least one group of leads to conductively connect the photosensitive element and the circuit board through each lead, and the leads are connected to the circuit board and the photosensitive element by a reverse bonding process, so that a height of upward protrusion of the lead is not exceed a height of an upward protrusion of a chip connector of the photosensitive element.

13. The molded photosensitive assembly according to claim 12, wherein the reverse bonding process includes arranging the circuit board connector on the circuit board, and then first bonding a top end of the circuit board connector by a wire bonding tools to form the circuit board connecting end of the lead connected to the circuit board connector, and then raising a preset position and translating the preset position toward the circuit board connector, and forming the chip connecting end of the lead connected to the chip connector at a top end of the chip connector, so that the lead extends in a curved shape.

14. The molded photosensitive assembly according to claim 1, wherein the filter assembly further includes at least one annular support element, and the filter element is assembled to the support element, and the support element is arranged on the first base portion of the molded base, so that the filter element is correspondingly arranged in a stepped peripheral groove of the molded base by means of the support element.

15. The molded photosensitive assembly according to claim 14, wherein an upper surface of the filter element is fixedly attached to a lower side of the support element through a glue layer, so that when the support element is mounted to the first top surface of the first base portion of the molded base, the upper surface of the filter element is located below the first top surface.

16. The molded photosensitive assembly according to claim 15, wherein a driver is attached to the first top surface of the first base portion of the molded base, and the support element is located inside the driver.

17. The molded photosensitive assembly according to claim 1, wherein a chip mounting region of the circuit board of the imaging assembly sinks to form a chip mounting recess in the chip mounting region of the circuit board, and the photosensitive element is correspondingly arranged in the chip mounting recess of the circuit board.

18. The molded photosensitive assembly according to claim 1, wherein the circuit board of the imaging assembly is further provided with a through hole type chip mounting recess, and the chip mounting recess extends downward from the upper side of the circuit board to a lower side of the circuit board to form a through hole in the chip mounting region of the circuit board, and the photosensitive element is correspondingly arranged in the through hole, so that the photosensitive surface of the photosensitive element is lower than the upper side of the circuit board.

19. A camera module, characterized by comprising:
the molded photosensitive assembly according to claim 1; and
at least one optical lens, wherein each optical lens is arranged on a photosensitive path of each photosensitive element of the imaging assembly of the molded photosensitive assembly, so that each light window provides a light path for each optical lens and each photosensitive element.

20. An electronic device, characterized by comprising:
an electronic device body; and
at least one camera module according to claim 19, wherein each camera module is arranged in the electronic device body for capturing images.

* * * * *